US008078995B2

(12) United States Patent
Tirapu Azpiroz et al.

(10) Patent No.: US 8,078,995 B2
(45) Date of Patent: Dec. 13, 2011

(54) EFFICIENT ISOTROPIC MODELING APPROACH TO INCORPORATE ELECTROMAGNETIC EFFECTS INTO LITHOGRAPHIC PROCESS SIMULATIONS

(75) Inventors: Jaione Tirapu Azpiroz, Poughkeepsie, NY (US); Alan E. Rosenbluth, Yorktown Heights, NY (US); Ioana Graur, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 12/349,104

(22) Filed: Jan. 6, 2009

(65) Prior Publication Data
US 2010/0175042 A1    Jul. 8, 2010

(51) Int. Cl.
*G06F 17/50* (2006.01)
(52) U.S. Cl. .................... 716/53; 716/51; 430/5
(58) Field of Classification Search ............ 716/51, 716/53; 430/5
See application file for complete search history.

(56) References Cited

U.S. PATENT DOCUMENTS

| | | | |
|---|---|---|---|
| 6,737,652 B2 * | 5/2004 | Lanza et al. | 250/363.06 |
| 7,079,223 B2 | 7/2006 | Rosenbluth et al. | |
| 2004/0122636 A1 | 6/2004 | Adam | |
| 2006/0009957 A1 | 1/2006 | Kohle | |
| 2006/0126046 A1 | 6/2006 | Hansen | |
| 2006/0156270 A1 | 7/2006 | Melvin, III et al. | |
| 2006/0248498 A1 | 11/2006 | Sezginer et al. | |
| 2007/0213962 A1 | 9/2007 | Adam | |
| 2010/0281449 A1* | 11/2010 | RosenBluth et al. | 716/19 |

OTHER PUBLICATIONS

Alan E. Rosenbluth, et al.—"Rendering A Mask Using Coarse Mask Representation" Filing Date: Jan. 16, 2008 U.S. Appl. No. 12/015,084.
M. Bai, et al.—"Approximation of Three Dimensional Mask Effects With Two Dimensional Features"—Emerging Lithographic Technologies IX, edited by R. Scott Mackay—Proceedings of SPIE vol. 5751 (SPIE, Bellingham, WA. 2005) pp. 446-454.
J. Tirapu-Azpiroz, et al.—"Incorporation Mask Topography Edge Diffraction in Photolithography Simulations"—Department of Electrical Engineering, University of California—Optical Society of America 2006—pp. 821-828.
P. YA. Ufimtsev—(1991) "Elementary Edge Waves and the Physical Theory of Diffraction"—Electromagnetics, 11:2 pp. 125-160.
N. Cobb, et al.—"Fast Sparse Aerial Image Calculation for OPC"—SPIE vol. 2621—pp. 534-545.
A. Khoh, et al.—"Image Formation by Use of the Geometrical Theory of Diffraction"—J. Optical Society of America—vol. 21, No. 6—Jun. 2004—pp. 959-967.

(Continued)

*Primary Examiner* — Naum Levin
(74) *Attorney, Agent, or Firm* — Scully, Scott, Murphy & Presser, P.C.; Joseph P. Abate, Esq.

(57) ABSTRACT

Modeling of lithographic processes for use in the design of photomasks for the manufacture of semiconductor integrated circuits, and particularly to the modeling of the complex effects due to interaction of the illuminating light with the mask topography, is provided. An isofield perturbation to a thin mask representation of the mask is provided by determining, for the components of the illumination, differences between the electric field on a feature edge having finite thickness and on the corresponding feature edge of a thin mask representation. An isofield perturbation is obtained from a weighted coherent combination of the differences for each illumination polarization. The electric field of a mask having topographic edges is represented by combining a thin mask representation with the isofield perturbation applied to each edge of the mask.

42 Claims, 24 Drawing Sheets

(Embodiment of Invention)

OTHER PUBLICATIONS

D.G. Flagello, et al.—"Theory of High-NA in Homogeneous Thin Films"—vol. 13, No. 1—J. Optical Society of America 1996—pp. 53-64.

G.S. Chua, et al.—"Rigorous Diffraction Analysis Using Geometrical Theory of Diffraction for Future Mask Technology"—Optical Microlithography XVII, edited by Bruce W. Smith—Proceedings of SPIE vol. 5377 (SPIE, Bellingham, WA., 2004)—pp. 1267-1278.

K. Adam—"Modeling of Electromagnetic Effects from Mask Topography at Full-Chip Scale"—Optical Microlithography XVIII, edited by Bruce W. Smith—Proceedings of SPIE vol. 5754 (SPIE, Bellingham, WA. 2005)—pp. 498-505.

K. Adam, et al.—"Methodology for Accurate and Rapid Simulation of Large Arbitrary 2D Layouts of Advanced Photomasks"—21st Annual BACUS Symposium on Photomask Technology, Giang T. Dao, Brian J. Grenon, Editors—Proceedings of SPIE vol. 4562 (2002)—pp. 1051-1067.

K. Adam, et al.—"Improved Modeling Performance with an Adapted Vectorial Formulation of the Hopkins Imaging Equation"—Optical Microlithography XVI, Anthony Yen, Editor—Proceedings of SPIE vol. 5040 (2003)—pp. 78-91.

J. Tirapu Azpiroz, et al.—"Critical Impact of Mask Electromagnetic Effects on Optical Proximity Corrections Performance for 45nm and Beyond"—J. Vac. Sci. Technol. B 25(1)—Jan./Feb. 2007—pp. 164-168.

PCT/US2010/020209—Filed Jan. 6, 2010—PCT ISR/WO.

International Application No. PCT/US10/20209—International Filing Date: Jan. 6, 2010 IBM Reference No. FIS920070390 International Search Report and Written Opinion—Dated Mar. 2, 2010.

* cited by examiner

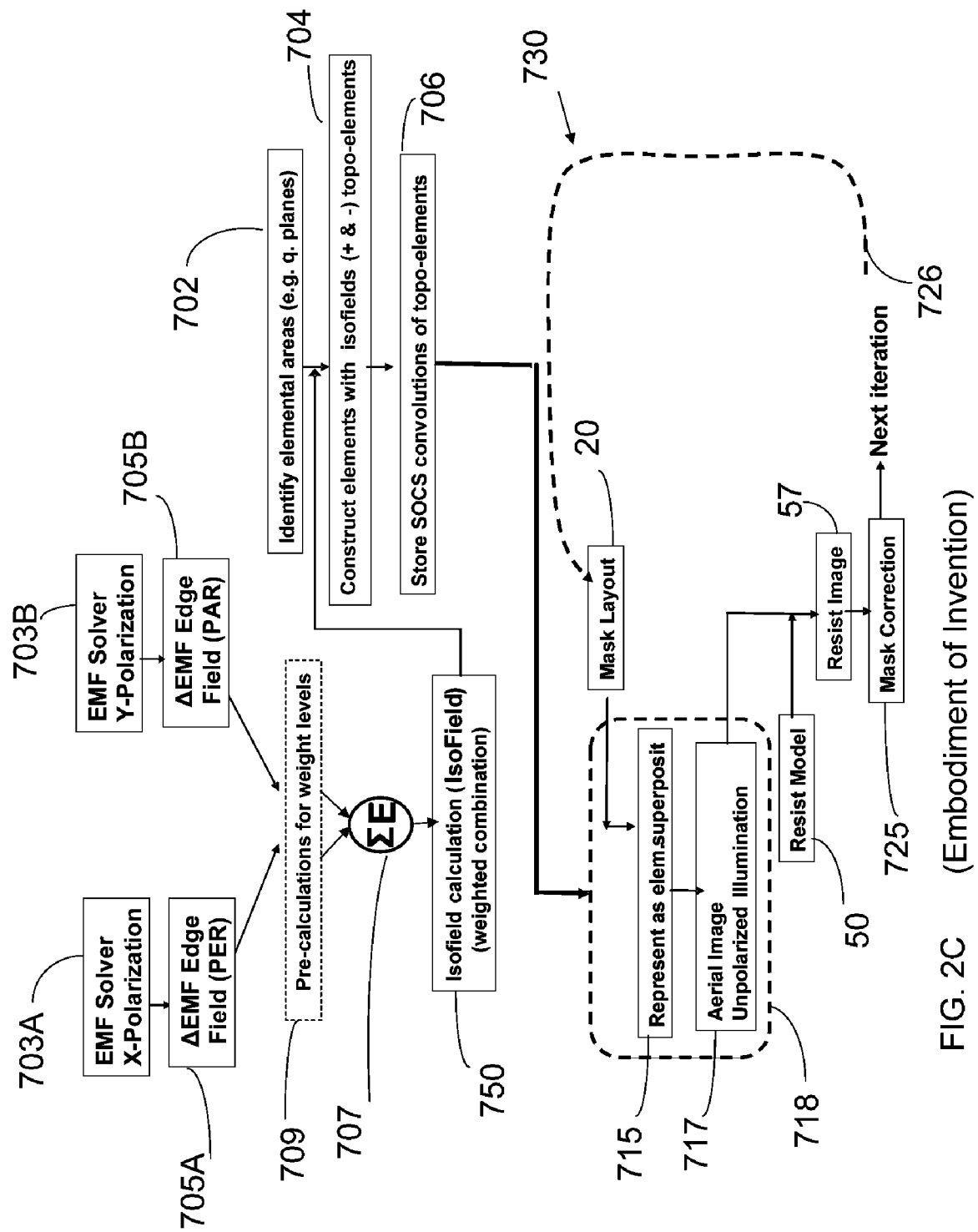
FIG. 2C (Embodiment of Invention)

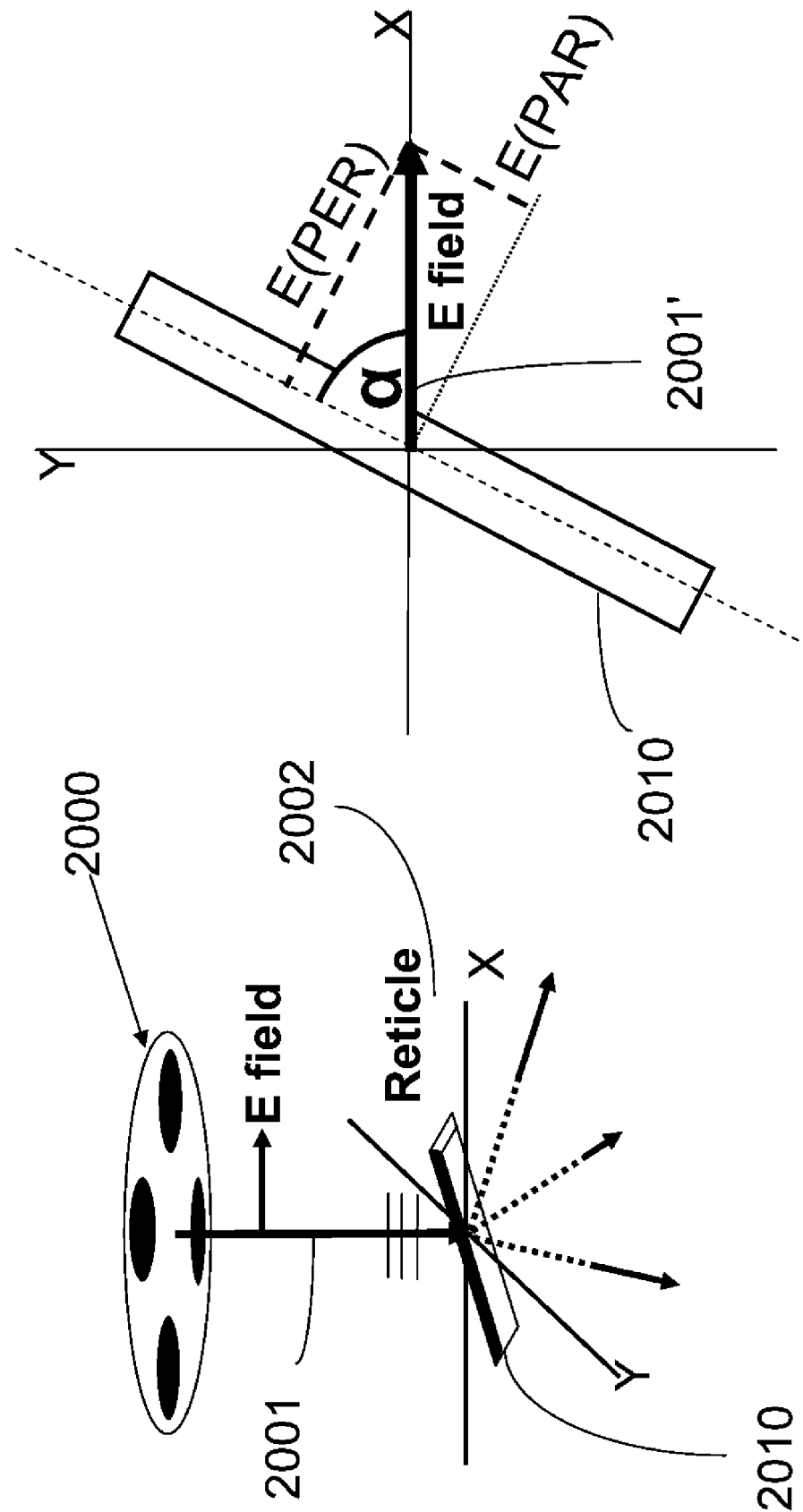

EFFICIENT ISOTROPIC MODELING APPROACH TO INCORPORATE ELECTROMAGNETIC EFFECTS INTO LITHOGRAPHIC PROCESS SIMULATIONS

TECHNICAL FIELD

The present invention relates to the design of photomasks used in the manufacture of semiconductor integrated circuits (IC's), and particularly to the modeling of semiconductor lithographic processing used in designing such masks and, more particularly, to the modeling of the complex effects that arise on photomasks from the interaction of the illuminating light with the mask topography.

BACKGROUND OF THE INVENTION

1.0 Lithography—Present Practice, and Industry Roadmap

The dramatic improvements in cost/performance ratio achieved by the electronics industry can be attributed in large part to innovations in the field of optical lithography. Optical projection step-and-scan machines offer significantly higher throughput compared to other patterning techniques, and are the overwhelmingly favored choice for patterning advanced integrated circuits in manufacturing. The minimum printable feature size (resolution) has also decreased by orders of magnitude, enabling more complex and higher density circuitry.

Advances in lithographic resolution have a direct impact on performance and cost reduction in semiconductor device manufacturing. Dimensions printable by optical lithography have and continue to shrink below previously established feasibility limits. In optical projection lithography, resolution is measured as the minimum dimension (critical dimension, CD) printable on resist, which is governed by a relation involving the illumination wavelength ($\lambda$) and the Numerical Aperture (NA) of the imaging system according to the following equation:

$$CD = k_1 \frac{\lambda}{NA}$$

where the factor $k_1$ is a constant that encapsulates the image quality requirements of the lithographic process. To improve resolution, exposure wavelength has steadily decreased from mercury lamp G-line (436 nm) to Deep Ultraviolet (248 nm and 193 nm), passing through H-line (405 nm) and I-line (365 nm), while the numerical aperture NA has steadily increased even above the presumed theoretical limit of 1.0, via the adoption of immersion lithography. Immersion lithography introduces a fluid between the last imaging lens surface and the wafer surface, with the fluid index of refraction being greater than that of air (n=1.0), for example n=1.436 (water), thus reducing the coupling angle of the light into the lens exit medium. This enables performing optical lithography with NA's exceeding 1.0, possibly approaching values as high as 1.35 with water, or even 1.5 or so if indices of refraction of about 1.7 can be employed in the immersion medium.

The lack of transparent optical components and adequate optical sources limits the useable wavelengths for Deep Ultraviolet lithography to values of about 157 nm or more, and in practice no shorter than 193 nm, even as the required minimum feature on wafer continues to shrink, which means that lithographic processes are required to print at ever deeper sub-wavelength scales. Extreme UltraViolet Lithography (EUV) will employ wavelengths of the order of 13 nm and can enable much smaller dimensions to be printed, but at the expense of greater and more costly technological complexity, materials, and mask manufacturing/processing. Thus it is expected that 193 nm immersion lithography will be a technology of choice for printing resist CDs that will be much smaller than the wavelength of the light used to print them.

The simplest lithographic masks (also referred to as reticles) take the form of stencil-like apertures in an opaque background that are given the shape of the circuit patterns being fabricated; these are known as binary masks. The mask patterns are formed at an enlarged scale and then demagnified to the desired dimension when projected onto the wafer. A demagnification ratio of 4× has become standard. Several sophisticated extensions of binary masks have been progressively adopted over the last decade, such as Phase Shifting Masks (PSM), to enhance resolution while reducing the printable Critical Dimension (CD). Moreover, advances in resist process, introduction of other techniques to enhance resolution such as off-axis illumination (OAI) and the deliberate distortion of the mask design to account for optical proximity effects, the so-called optical proximity correction (OPC), have contributed to further reduce the value of k1 close to its diffraction limit of 0.25 in today's manufacturing, while maintaining the same illumination wavelength. As a result, even under 4× enlargement the dimensions on the mask are approaching the wavelength of the light, and in some instances such as sub-resolution assist features, they already are smaller than the wavelength.

2.0 Electromagnetic Effects on the Reticle

The use of mathematical numerical models to simulate images formed by lithographic processes used in the transfer of integrated circuit patterns to a wafer, is an integral part of the design and manufacture of masks or reticles. For example, image simulation is a critical step in OPC and mask verification methodologies. Optical Proximity Correction (OPC) uses calibrated optical and resist models to modify the shapes on the mask so that the printed shapes on the wafer will closely match the desired target shapes, within acceptable criteria. Mask verification is performed on a final mask design, after modification for example by optical proximity correction, to ensure that the final image will meet specified tolerances and not exhibit any catastrophic conditions such as opens, shorts, and the like.

However, simulation of aerial image formation in today's mainline manufacturing OPC still relies entirely on Kirchhoff Boundary Conditions to approximate the field immediately behind the patterned mask with an equivalent scalar binary model known as the thin-mask approximation (TMA). In the TMA approximation, where only the two-dimensional (2D) shapes of the mask openings on the horizontal plane of the mask are considered, the light transmission of a lithographic mask is purely real, i.e. it has a zero imaginary part. Kirchhoff boundary conditions replace the field on the mask openings by the incident field, thus ignoring the increasingly important topographical effects (thick mask effects) and scattering by the finite-thickness mask edges in the computation of the lithographic image. The advantageous simplicity of the Kirchhoff model allows fast, yet reasonably accurate calculations for feature sizes much larger than the source wavelength, but becomes very inaccurate at subwavelength dimensions where topography effects arising from the vector nature of light become noticeable. In general, the deviations between images produced by TMA masks and images produced by physically realistic masks having three dimensional structure of finite thickness are known as EMF effects (ElectroMagnetic Field effects).

As design critical dimensions continue to shrink, the electromagnetic response of the reticle becomes a complicated function of the incident polarization, inducing both amplitude and phase errors while unfavorably increasing the effective Mask Error Factor (MEF, not to be confused with EMF), with critical impact to CD uniformity. These polarization dependent transmission errors become particularly critical for Phase-Shifting masks (PSM) since they rely on the modulation of both amplitude and phase of the electromagnetic field propagating through them. In particular, transmission imbalance between etched and unetched openings is a well established consequence of the abrupt topography in alternating phase-shifting masks (AltPSM). Binary masks manufactured with opaque materials commonly based on Chrome also exhibit serious transmission deficits which are dependent on the polarization of the incident light.

Furthermore, partially coherent unpolarized light is virtually always the preferred illumination configuration for lithography, because it reduces image sensitivity to residual polarization aberrations in the optics, reduces the long-term induction of birefringence in the illuminator optics, and helps mitigate long range effects associated with coherent illumination. While polarized illumination will probably come into occasional use in the future in order to ameliorate anisotropic high-NA imaging effects that arise in certain double exposure schemes, it is nonetheless expected that most lithographic exposures will continue to be made in unpolarized light. To numerically emulate the effects of illuminating a topographic photomask with unpolarized light, prior art methods require that two independent simulations be performed with orthogonal polarization states for the illumination, and the resulting individual aerial images on the wafer plane superposed incoherently. This requires that two simulations be performed, and therefore the runtime penalty from incorporating electromagnetic effects into OPC simulations will be a minimum of 2× with unpolarized illumination, if prior art methods are used.

Nonetheless, such time consuming (and resource consuming) rigorous 3D electromagnetic field simulations have become necessary for accurate aerial image simulation, increasing the need for accurate but still efficient physical models.

3.0 SOCS Calculations with TMA

Partially coherent lithography simulations generally derive from Hopkins' imaging theory, and may in some cases directly use the so-called Hopkins integral to analyze the imaging system. However, faster image calculations generally employ the so-called Sum Of Coherent Systems (SOCS) method (or SOCS approximation) to achieve a speed efficiency that is adequate for full-chip calculations. As is well known in the art, the SOCS approximation approximates the Hopkins integral by a series of convolutions which is often truncated to a reasonable number of terms for efficiency. Referring to FIG. 2A, with the Thin Mask Approximation (TMA), a thin mask representation of the mask layout 20, which contains the same patterns as the topographic mask, is formed. The SOCS method 408 decomposes the Hopkins integral into a truncated series of kernels (Block 404), which each represent elementary regions (discussed further below), such as quarter planes (Block 402). The kernels are separately convolved with the mask layout representation or object (Block 405). The sum of the squared convolutions of the object with a finite set of kernels provides an approximate image 407 of the mask object in a more efficient manner than the Hopkins integral. In current integrated circuit (IC) applications the features deployed in lithographic masks take the form of polygonal shapes (of uniform transmission) arranged on a horizontal plane. The edges of the polygons are typically oriented along orthogonal directions one the plane, e.g. along an x-direction or y-direction (so-called Manhattan polygons). For example, FIG. 1A illustrates a mask design 20, including a polygon shape 200 having Manhattan edges oriented along x- and y-directions. Non-manhattan mask shapes may also be used. These polygons may be fabricated as apertures in a mask film, or as pedestals or trenches in the transparent mask substrate.

Each basic image calculation in a lithographic simulation requires that convolutions with the SOCS kernels be carried out across all interacting polygons within a certain small region on the mask. Methods are known for obtaining these convolutions, namely the so-called dense and sparse image simulation methods.

3.1 SOCS Calculations with TMA in Sparse Imaging

We now consider the so-called sparse imaging case. In a 2D (thin mask) calculation, mask polygons are represented as an algebraic superposition of "corners" of elementary regions or elements, that are bounded by edges that extend away from the corner (Block 402), when the sparse imaging method is used. With Manhattan polygons only one kind of corner is needed, for example a lower left corner. Note that the term corner actually refers to an extended area, which in this case is a quarter-plane that extends from the corner into the upper-right quadrant. In the case of structures that are periodic (or that are assumed periodic for simulation purposes), the quarter-plane need not actually extend indefinitely to occupy an entire quadrant of the unbounded 2D mask plane, but may instead be terminated at the period boundaries. However, for simplicity we will use the term elementary element, such as a quarter-plane, to refer to either option.

FIG. 1B illustrates that an arbitrary polygonal area of Manhattan form (like the polygon 200 shown by the dashed line in FIG. 1B) can be formed by superposing quarter-planes 1100, 1101, 1102, 1103, 1104, 1105 at each corner of the polygon 200. Note that the quarter-planes must be superposed with alternately positive and negative sign. If quarter-planes are alternately added or subtracted from the mask plane in this way, the net residual added area is positive, taking the form of the desired polygonal interior. In FIG. 1B, the quarter-planes 1100, 1102, 1104 having extended edges illustrated with solid line arrows, are added, while the quarter-planes 1101, 1103, 1105 having extended edges illustrated with dotted line arrows, are subtracted.

Referring to FIG. 2A, the convolution of the elemental quarter-plane with each of the SOCS kernels is typically pre-calculated and pre-stored (Block 404). For each of the SOCS kernels in the SOCS calculation 408, one can then quickly obtain the value that the convolution of all polygons within some given region with that kernel takes on at a specified evaluation point in the region. This value is obtained by summing the appropriate table entries for each polygon corner (or quarter plane element) within the region (using the appropriate positive or negative sign) (Block 405). The speed of such a calculation is limited by the random access time needed to pull each required table entry from memory. For each of the SOCS kernels, the contributions from all polygons are added and the sum is squared. The squared sums for all kernels are added together to form the final aerial image intensity 407 of the original polygon. In the prior art case, the method requires creating a single quarter-plane convolution table for each of the SOCS kernels that is retained in the truncated Hopkins imaging integral decomposition series.

Subsequently, the aerial image 407 is provided as input to a resist process model 50, which is typically a fitted model of the response of the photoresist to the optical image, and is used to predict the resulting resist image 55.

In the OPC process 409, the mask layout 20 is modified or corrected based on a comparison of the resist image 55 and the desired printed image, within a predetermined criterion or tolerance. This process may be iterated (410) until the predicted resist image matches the desired target image within the appropriate tolerance or criteria.

3.2 SOCS Calculations with TMA in Sparse Imaging and Unpolarized Illumination When attempting to simulate numerically the aerial image produced by unpolarized illumination, rigorous electromagnetic treatment of the mask requires the separate simulation of the aerial image due to two orthogonal polarizations. In optical lithography simulations, these polarizations are usually chosen to be aligned with the two orientations of a Manhattan layout, that is, X-polarized (hereinafter "X-pol") and Y-polarized (hereinafter "Y-pol"), where X and Y axis are parallel to the horizontal and vertical layout edges, respectively. Hence there is a 2× speed impact added by the need to consider X and Y polarizations separately. However, there are known methods (see co-assigned U.S. Pat. No. 7,079,223 (Rosenbluth et al.), and K. Adam, Y. Granik, A. Torres, and N.B. Cobb, "Improved modeling performance with an adapted vectorial formulation of the Hopkins imaging equation," in *SPIE* v.5040—*Optical Microlithography XVI*, ed. Anthony Yen (2003), p. 78.) which allow the use of a single set of kernels to account for the differences in the propagation of X and Y polarizations through the lens, eliminating the need to carry out separate simulations for each polarization when the thin mask approximation is used. These "unpolarized" kernels for vector imaging are generally different from the X-pol and Y-pol kernels, and are valid only with the TMA model. This will be explained below, but first it is necessary to provide further details on the workings of the prior art unpolarized SOCS kernels for vector imaging.

These kernels rely on the fact that, regardless of whether the illuminating polarization is X or Y, in a TMA model the vector amplitudes of the diffraction orders collected by the lens can be related to a common set of mask input quantities (for example, to the scalar transmission function of the TMA mask, which is polarization-independent), and moreover that the relationship of the vector amplitudes to this common set of inputs is a linear one (with a different relationship applying for each illumination polarization, in general).

For example, in a commonly used TMA model for vector imaging, the mask is assumed to produce a polarization in each diffraction order that is the same as is present in the illumination, except that the diffracted vector amplitude is assumed to be appropriately rotated about an axis perpendicular to the meridional fold-path of the diffracted rays in such a way as to maintain transversality (mandated by Maxwell's equations) between the diffracted field and the diffracted rays. The phase of the diffracted field relative to the geometrical phase along the ray path is assumed to be given by the phase of the Fourier order (i.e. it is assumed to be given by the phase of that component of the Fourier transform of the mask transmission function which is associated with the specified diffraction direction). The squared magnitude of the diffracted field is assumed to be equal to the squared magnitude of the Fourier order (to within a constant of proportionality that may include feature-independent obliquity factors).

Under such a model the relationship between the amplitude of a given scalar Fourier order and the complex amplitude of a particular Cartesian component of the field along a particular mask diffraction order is one of simple trigonometric factors that are feature-independent, and these factors are fixed once a particular polarization (e.g. X or Y) is chosen for the illumination. The specific form of these trigonometric factors is given, for example, in the equations of Flagello et al., Theory of high-NA imaging in homogeneous thin films, J. Opt. Soc. Am., Vol. 13, no. 1, January, 1996, pp. 53-64. A key point is that the scalar Fourier orders do not themselves depend on the illuminating polarization under a TMA model; all polarization-dependence lies in trigonometric factors that are feature-independent.

This means that if we use the scalar Fourier orders as inputs to the bilinear Hopkins integral, the bilinear integrals for the X and Y illumination polarizations will both involve the same input quantities, even though their bilinear kernels will be different. Further, since the Fourier transform operation is linear, we can continue to use common inputs when we employ the spatial-domain form of the two Hopkins bilinear integrals that obtain for the two illumination polarizations, with these common inputs being specifically the values of the spatial-domain scalar mask transmission function. Each of these Hopkins integrals yields the intensity contribution provided by one of the illuminating polarization components, and their sum yields the total intensity. Moreover, since the inputs for each integral are the same, we can calculate the total intensity using a bilinear kernel that is the sum of the bilinear kernels for the two illumination components. And if we then diagonalize this summed bilinear kernel, we obtain the prior art SOCS kernels for unpolarized light. In the case of TMA masks, these kernels let us avoid the need to carry out separate simulations for the X and Y illumination components.

3.3 SOCS Calculations with Mask EMF

Unfortunately, the scalar amplitude transmitted by the topographic perturbation that is present at the edges of physical topographic masks will not be the same for the two illumination polarizations, so that the prior art unpolarized SOCS kernels only work for TMA masks. This is explained further in the subsection entitled "SOCS Calculations with finite-thickness topography (including use of Edge Field Correction—DDM or BL—with SOCS)". The fundamental difficulty has to do with the geometry of the prior art corner superposition technique.

The corner superposition used in the SOCS method properly reduces the interior area of a polygonal mask aperture (in the two-dimensional (2D) thin mask approximation) to a superposition of elementary areas (the quarter-planes). However, such a corner superposition does not properly represent the effects introduced by the interaction of the finite-thickness mask topography with the incident electromagnetic illumination. In the following subsections, we describe how these electromagnetic effects can be assumed to be largely confined to the mask topography edge vicinity, i.e. the effect is considered to be an edge field correction which in the so-called DDM or BL models is considered to be present along the rim of the polygon (with the properties of the correction varying depending on the orientation of the edge relative to some given polarization orientation).

Such prior art EMF modeling techniques will be described in the following subsections.

4.0 Prior Art of EMF Modeling Techniques

A number of modeling techniques are available today to approximately incorporate most EMF phenomena into the process models used during lithographic simulations involved in optical proximity correction (OPC). Among them are the simple bias model, the boundary layer (BL) model (see "Incorporating mask topography edge diffraction in photolithography simulations" Jaione Tirapu-Azpiroz and Eli Yablonovitch, J. Opt. Soc. Am. A, Vol. 23, No. 4 (April 2006) (hereinafter "Tirapu-Azpiroz et al. (2006)"), the edge-based domain decomposition method (DDM) (see K. Adam and A. Neureuther, "Methodology for accurate and rapid simulation of large arbitrary 2D layouts of advanced photomasks," Proc. of the SPIE, 4562, pp. 1051-1067, 2002; Konstantinos Adam, "Modeling of Electromagnetic Effects from Mask Topography at Full-Chip Scale," Proc. SPIE 5754, pp. 498-505 (2005)), and techniques based on the Geometrical Theory of Diffraction (see Andrew Khoh et. al., "Image Formation by use of the Geometrical Theory of Diffraction," J. Opt. Soc. Am. A, Vol. 21, No 6, pp. 959-967, (June 2004)).

The complex electromagnetic interaction between the incident illumination wave and the mask topography has been shown by Tirapu-Azpiroz et al. (2006) to be highly localized to the vicinity of the mask topography edges. This observation is the general basis of the prior art approaches that have been developed for modeling EMF during OPC calculations.

The most relevant prior art modeling methods will now be described in more detail. The specific methods covered in these paragraphs are TMA, Simple Bias, Geometrical Theory of Diffraction, Boundary Layer (BL), and Domain Decomposition (DDM). Our survey will show that all of these prior art methods suffer deficiencies that will become appreciable as lithography pushes further into the domain of sub-wavelength-scale mask features. Before discussing these methods in more detail, we will summarize their key limitations: TMA fails to account for both real-part amplitude errors, and quadrature errors (imaginary-part). Simple Bias can account for real-part amplitude error but fails to model quadrature errors. Quadrature errors produce shifts of best focus and distortions of the lithography performance through focus. Both the TMA and the Simple Bias models cannot accurately model the errors produced by 3D mask topography, and do not provide sufficient accuracy for OPC simulations. The boundary layer and the DDM methods, on the other hand, are capable of modeling both real and imaginary parts of the error, but are potentially 2 to 6 times slower than current TMA for unpolarized light, with so-called sparse-imaging OPC (described below) entailing a more severe slowdown than dense-imaging OPC (also described below).

4.1 Simple Bias Model

Techniques like simple mask CD biasing or quartz undercutting to enhance transmission through the etched openings have been used to adequately correct amplitude imbalance between mask openings with different quartz trench depth in Alternating Phase Shifting Masks (AltPSM), allowing process modelers to effectively ignore these effects during OPC of the relatively large geometries used in previous IC generations. Phase depth biasing and undercutting of the etched quartz has also been used to enhance transmission and correct for phase errors, but the required under-etch and other manufacturing limitations make depth and undercut biasing impractical for 45 nm technology and beyond. Similarly, electromagnetic edge scattering in Attenuated Phase Shifting (atten-PSM) or Binary (BIM) masks has usually been ignored within OPC models, effectively shifting the anchoring dose. As the minimum pitch and critical dimension continue to shrink while Mask Error Factor (MEF) becomes more critical, neglecting EMF during OPC can translate into large CD errors for both Alt. and atten. PSM that will no longer be compensated for by dose adjustments. A simple bias has been found empirically to be an efficient yet reasonably accurate technique to partly correct for EMF effects on every absorber edge on the mask, using either computer or wafer experiments to find the optimum bias value.

Recent advances involve employing biases of a subtly different kind, namely biases that are applied only in TMA simulations, to approximately mimic EMF effects with minor impact on efficiency; these simulation biases do not involve physical adjustments of the fabricated mask. We will refer to simulation biases applied to absorber edges as absorber bias. AltPSM masks employ additional phase-shifting openings on the mask that are manufactured by etching into the glass to the appropriate depth. EMF effects in the etched glass need to be modeled with a different bias (referred to as shifter bias), which is used in conjunction with the absorber bias due to the absorber edge.

A simple mask CD opaque bias can largely compensate the real part of the error in the amplitude transmission from simple pure-real TMA masks, but it fails to accurately capture the quadrature-component contributions that arise with small spaces. These quadrature components represent a non-zero imaginary part in the mask transmission, for masks with topography of finite thickness. Hence the simple bias modeling approach is unable to model phase errors during simulations of attenuating and alternating phase shifting masks, resulting in noticeable errors under conditions required for future OPC.

We now describe two more sophisticated approaches in the prior that are able to substantially achieve the accuracy required for future OPC, but that impose appreciable runtime penalties.

4.2 Boundary Layer Model

The Boundary Layer (BL) Model (see Tirapu-Azpiroz et al. (2006)) is an alternative modeling approach for OPC, based on an analytical demonstration that the dominant non-Kirchhoff effect is localized near the bounding perimeter of mask apertures. This model consists of placing a strip in the vicinity of the edge with fixed width and complex transmission. A key EMF effect in atten-PSM is the distortion in the 0th order by electromagnetic scattering from mask edges, and the width of the BL controls the variations in peak amplitude while the imaginary transmission corrects for quadrature-component deviations due to the finite-thickness topography. In the prior art BL approach, two different sets of BL edge correction parameters are needed, one for edges parallel to the polarization state, that is, for horizontal edges under X-polarized illumination, and vertical edges under Y-polarization, and a different BL edge correction for edges perpendicular to the polarization state, that is, for horizontal edges with Y-polarization and for vertical edges with X-polarization. The incoherent superposition of the two polarized aerial images provides the aerial image when unpolarized light illuminates the mask. The width and transmission coefficients of the BL depend on the edge orientation relative to polarization. These parameters can be deduced through rigorous EMF simulation of the mask (with associated requirement of a thorough characterization of the mask profile and film stack), or through calibration to resist CD data. It can then be shown that TMA simulations using a boundary layer are capable of capturing the mask EMF amplitude and phase behaviors, translating into a proper lithographic modeling through focus. In other words, the boundary layer can accurately model the effects of three-dimensional mask topography, but CPU time increases due to use of additional features (the boundary layers), and a further 2× increase arises with illumination of mixed polarization, due to the need for separate simulations in each polarization component of the illumination.

4.3 Edge Domain Decomposition Model (DDM)

The Domain Decomposition Method (DDM) was proposed by Adam et. al. ("Methodology for accurate and rapid simulation of large arbitrary 2D layouts of advanced photomasks," K. Adam and A. Neureuther, Proc. of the SPIE, 4562, pp. 1051-1067, 2002.). In this standard or regular DDM approach, a calculation is made of the differences between the rigorously (numerically) simulated electromagnetic scattering response of one isolated edge of the mask topography, and the TMA field for the case of an edge parallel to the polarization of the illumination, and likewise of the difference obtaining for an edge perpendicular to the polarization of the incident illumination. For example, these difference fields may be calculated beforehand using simulation software that numerically solves Maxwell's equations. These difference fields are then taken as approximately suitable EMF corrections for each mask edge in the dense layout. Two separate simulations, one per polarization component, are required to obtain the aerial image under unpolarized illumination, and thus, two edge field calculations are required per edge type. Since this methodology is based on simulation, a thorough characterization of the mask profile and optical parameters is necessary. Mask field simulations provided by DDM contain both real and imaginary parts, and are therefore capable of accurately modeling finite thickness mask EMF topography through focus. However, computation time typically increases at least 4×; with about 2× arising from the inclusion of new edge field corrections in the mask for simulation purposes (during sparse-imaging-mode calculations). For a given polarization state, these corrections are different for edges that are parallel or perpendicular to the polarization, and an additional 2× factor (during both sparse and dense imaging) arises from the typical use of illumination polarization of mixed state (most often unpolarized). More specifically, this 2× factor arises because use of unpolarized light implies a requirement for two separate aerial image simulations.

4.4 Mask EMF with Unpolarized Illumination

Both the edge Domain Decomposition and the Boundary Layer Prior Art methods for EMF correction in OPC share the need for different edge field corrections on parallel and perpendicular topography edges, and the requirement for two separate aerial image simulations with orthogonal polarizations to represent unpolarized illumination. As mentioned above, in the case of TMA masks a method has been developed to circumvent the 2× runtime penalty that arises from use of separate simulations of the two illumination components (see co-assigned U.S. Pat. No. 7,079,223, and K. Adam, Y. Granik, A. Torres, and N. B. Cobb, "Improved modeling performance with an adapted vectorial formulation of the Hopkins imaging equation," in SPIE v.5040—Optical Microlithography XVI, ed. Anthony Yen (2003), pp. 78-91.). However, the prior art does not provide a way to circumvent this 2× runtime penalty in the case of non-TMA imaging, such as imaging with a DDM or a BL mask models. Thus, with sparse imaging, an increase in OPC time of more than 4× is expected with prior art DDM, while with dense imaging runtime must increase about 2×.

4.5 Modeling Based on Geometrical Theory of Diffraction

A modeling approach based on the Geometrical Theory of Diffraction (GTD) has been proposed (see "Image Formation by use of the Geometrical Theory of Diffraction," Khoh et. al., J. Opt. Soc. Am. A, Vol. 21, No 6, p. 959-967, (June 2004); "Rigorous Diffraction Analysis using Geometrical Theory of Diffraction for Future Mask Technology," Chua et. al. Proc. SPIE Vol. 5377, p. 1267-1278, (2004)). GTD separates the field diffracted by an aperture on the reticle into a geometrical component and a boundary component, the latter taking the form of rays emanating from the edge. The GTD formulation used in Khoh's approach is an asymptotic high frequency approximation of the Physical Theory of Diffraction (see P. Y. Ufimtsev, Elementary Edge Waves and the Physical Theory of Diffraction, Electromagnetics 11, pp. 125-160 (1991)), which has been shown to set the foundations of the Boundary Layer Model described above (see Tirapu-Azpiroz et al. (2006)). GTD accurately incorporates edge diffraction, but it applies only to perfect electric conductors. The chrome layer that forms the reticle, however, has a finite index of refraction at lithographic wavelengths, and this has a non-negligible impact on the topography effects.

4.6 SOCS Calculations with Finite-Thickness Topography Using Dense Imaging (Including Use of Edge Field Correction—DDM or BL—with SOCS)

Edge field corrections may also be performed in pixel-based or so-called dense imaging, in which the image is computed on a regularly spaced pixel-like grid. The dense imaging or pixel-based imaging takes advantage of the regularly spaced grid to use Fast Fourier Transforms (FFTs) which may have computational advantages for dense designs. An efficient algorithm for carrying out mask convolutions in a dense imaging methodology is described in co-pending co-assigned U.S. patent application Ser. No. 12/015,084, filed on Jan. 16, 2008 (herein after "Rosenbluth et al."), that can also include electromagnetic edge correction contributions. To anticipate some discussion from the Description of the Invention section below, we will show there that with dense imaging the Rosenbluth et al. method can be used without further modification in the so-called isofield calculations of the present invention (with the isofield perturbation replacing the prior art polarized edge correction contribution), except for the change that in a dense isofield calculation under unpolarized illumination one does not carry out separate convolutions for parallel and perpendicular polarized edge field corrections. In contrast, dense imaging with the prior art polarized edge field corrections (such as DDM) entails about a 2× runtime penalty, since separate imaging convolutions need to be carried out in the prior art methods. Sparse-imaging calculations and dense-imaging calculations both use the SOCS algorithm, i.e. they both calculate image intensity as the sum of squared convolutions of the mask pattern with SOCS kernels. In dense imaging calculations the mask pattern is represented as a bitmap, and the convolutions are carried out by Fast Fourier Transform. The same method can be used to represent boundary layers, since boundary layers are Manhattan features. And with minor modification this approach can also be used to represent DDM fields (which are essentially a series of adjacent narrow boundary layers); this can be done by simply adding to the transmission of each pixel the average over the pixel of all nearby DDM fields.

For the so-called sparse imaging case (in which the images are computed at selected evaluation points located along the edges of the mask polygons), a more detailed discussion is warranted because the prior art methods like DDM typically entail a more severe runtime penalty of between 4× and 6×. The prior art corner superposition used in the SOCS method (described in section 3.1 above) properly reduces the interior area of a polygonal mask aperture (in the 2D thin mask approximation) to a superposition of elementary pattern units (e.g. quarter-planes). However, the prior art DDM or BL methods need to treat the EMF contribution from each edge separately from the interior polygon area when carrying out a SOCS convolution over a polygon. The reason is that the corner superposition method does not properly represent the edge fields which arise from finite-thickness mask topography, i.e. the edge fields which in the DDM or BL models are considered to be present along the rim of the polygon (with their properties varying depending on the orientation of the edge relative to some given polarization orientation). More precisely, when quarter-planes are superposed according to the SOCS scheme (alternately added and subtracted, as discussed above) in order to reproduce the area of a polygon, the DDM or BL fields of the polygon are not successfully represented by a superposition of edge fields along the extended edges of each quarter-plane (i.e. the edges which meet in the corner of each quarter-plane).

To explain why the prior art polygon decomposition fails with non-TMA masks, we consider a clear-cut example which arises in those cases where one of the elementary quarter-planes in the set that is subtracted contains an edge that happens to trace over an edge segment of the polygon (rather than being an Outward extension of the polygon edge segment, as happens equally often). In FIG. 1B the vertical edge 101 of the bottommost subtracted quarter-plane 100 (having edges partially shown by dashed lines 101 and 102) is an example of a quarter-plane edge that traces over a polygon edge 201, whereas the vertical edge 301 of the topmost subtracted quarter-plane 300 (having vertical edge 301 and horizontal edge 302) is an example of a quarter-plane edge that is an extension of a polygon edge 202. When the edge of a subtracted quarter-plane traces over a polygon edge, the field contributed along the polygon edge by any physically realistic field content that might be assigned to the quarter-plane edge will have the wrong sign. Similarly, if physically realistic field content is assigned to a quarter-plane edge that is inserted as an extension to a polygon edge, a field contribution of incorrect sign will be introduced in this region if the quarter-plane is in the set that is added.

The prior art DDM and BL edge contributions are also incompatible with the prior art unpolarized vector SOCS kernels. As discussed above (see Section 3.2 SOCS Calculations with TMA in Sparse Imaging and Upolarized Illumination), the unpolarized SOCS kernels rely on the fact that (with a TMA mask) the same scalar inputs can be used with either of the bilinear Hopkins kernels that govern illumination by unpolarized light (i.e. with the bilinear kernels for either X or Y polarized illumination), where as noted the scalar inputs for a given TMA mask can be, for example, either the scalar Fourier amplitudes, or the scalar mask transmission function.

Unfortunately, the scalar amplitude transmitted by the topographic contribution that is present at the edges of real masks will not be the same for the two illumination polarizations. As an example, we can identify this scalar amplitude with the difference between the scalar transmission of the boundary layer that can be assumed present at the feature edge, and the transmission of the strip-region along the TMA mask that the boundary layer displaces. A key point is that this edge-contributed scalar amplitude will depend on the illuminating polarization, since the transmissions of the perpendicular and parallel boundary layers are almost always different. This means that the two Hopkins integrals must use different inputs to represent the BL (or DDM) contribution from each edge of the mask. Of course, a fixed conversion ratio between the inputs for the perpendicular and parallel edge amplitudes could be defined, but this conversion ratio would not apply to the interior TMA area of the features, and this internal area interferes coherently with the edge fields, hence the edge and area contributions cannot be calculated using separate Hopkins integrals, and as a result the separate Hopkins integrals for the two illumination components cannot use a common set of inputs. For this reason, the prior art vector SOCS kernels for unpolarized illumination cannot be applied to finite-thickness masks having edge fields; instead two sets of SOCS kernels, one per incident polarization, need to be computed and made available (e.g. pre-stored).

Thus, while TMA polygons can be synthesized using the prior art SOCS method of superposing quarter-plane regions that are given a physically realistic TMA transmission, the edge fields of polygons cannot be synthesized by including physically realistic edge fields in these quarter-planes. For this reason, prior art SOCS methods do not include edge fields, and prior art edge-field methods for sparse imaging must use separately stored tables for the edge contributions, each of which tabulates the convolution of one of the SOCS kernels with an edge-field of given length at given position (for given illuminating polarization, i.e. polarized along the edge, or polarized perpendicular to the edge). Prior art DDM methods, besides handling the areas of 2D mask polygons using the standard polygon decomposition, must separately apply a DDM contribution to each edge of each polygon. Inclusion of the edge fields therefore increases the number of table lookups in the prior art method, and so slows down the image calculation. In the case of boundary layers the edge fields are approximated as narrow polygons (an accurate approximation given the mask-side resolution of typical lithography lenses), so their convolutions can be calculated using the same SOCS tables as the main features, with different complex transmission weights being applied depending on the orientation of the edge relative to the given polarization component. However, the boundary layers constitute new features, and the runtime penalty entailed by the prior art EMF methods is essentially determined by the number of table lookups required, not the number of distinct tables, since the tables need only be calculated once. In general, the prior art sparse-imaging methods all require additional table lookups for the edge fields, which entails an appreciable runtime penalty.

This speed impact adds to the speed impact entailed by the need to consider X polarization and Y polarization separately. Where the interior area of polygonal mask features is concerned, we have seen that there are known SOCS methods which use a single set of kernels to account for the differences in the propagation of images formed under X-polarization and Y-polarization through the lens, eliminating the need to carry out separate simulations for each polarization when the thin mask approximation is used. However, as noted above, prior art methods for taking mask topography into account cannot exploit this particular SOCS method because of their use of polarization-dependent edge field corrections, which force a requirement that separate simulations be made for each polarization (whether dense or sparse imaging is used), and in the sparse case force a further requirement that each of these calculations use additional table lookups beyond those needed for the area calculation, as described above. Each of these separate simulations uses a different set of SOCS kernels, namely the kernels for polarization along the horizontal or X axis in one case, and the kernels for polarization along the vertical or Y direction. These kernels are generally different from the unpolarized kernels that can be used in a TMA model.

SUMMARY OF THE INVENTION

In accordance with the present disclosure, an isofield perturbation to a thin mask approximation is provided by determining, for the components of the illumination, differences between the electric field on a feature edge of finite thickness and the corresponding thin mask feature. An isofield perturbation is obtained from a weighted coherent combination of the differences for each component of the illumination. The electric field of a mask having topographic edges is represented by combining a thin mask representation of the mask with the isofield perturbation applied to each edge of the mask. The resulting image may be used in lithographic design methodologies such as an optical proximity correction methodology or in a mask verification methodology.

In a first aspect of the disclosure, a method is provided for designing a lithographic process, which in some embodiments can employ a computer system, including simulating an image of a topographic mask under an illumination having an associated electric field. The method includes providing a design of the topographic mask, the mask design including a mask feature having two-dimensional polygon feature edges in a horizontal plane of the mask, wherein the feature edges have a finite thickness along a non-horizontal direction of the mask; determining a thin mask representation of the electric field on the mask plane corresponding to the mask feature; determining a first field difference between the electric field on the mask plane along a first edge of the mask feature and the electric field on the mask plane along the corresponding edge of a thin mask representation of the mask feature under illumination of a first component of the electric field and a second field difference between the electric field on the mask plane along the first edge of the mask feature and the electric field on the mask plane along the corresponding first edge of the thin mask representation of the mask feature under illumination of a second component of the electric field orthogonal to the first component of the electric field; forming an isotropic field perturbation (IsoField Perturbation IsoΔM) to the thin mask electric field on the mask plane corresponding to the first edge of the mask feature comprising a weighted coherent combination of the first and second field differences; providing an imaging model for simulating an image on a wafer plane, the imaging model comprising a representation of the electric fields on the mask plane responsive to illumination from an imaging system, wherein the representation of the electric fields on the mask plane comprises the thin mask representation combined with the Isofield Perturbation; and simulating an image on the wafer plane corresponding to the mask feature under the illumination using the imaging model. In some embodiments, the above steps are performed employing a computer including a central processing unit.

According to another aspect of the disclosure, a method is provided for designing a lithographic process including simulating an image of a topographic mask under an illumination having an associated electric field The method includes providing a design of the topographic mask, the mask design including a mask feature having two-dimensional polygon feature edges in a horizontal plane of the mask, wherein the feature edges have a finite thickness along a non-horizontal direction of the mask; determining a thin mask representation of the electric field on the mask plane corresponding to the mask feature; determining a first field difference between the electric field on the mask plane along an extended edge of an elementary pattern unit having the finite thickness and the electric field on the mask plane along the corresponding extended edge of a thin mask elementary pattern unit under illumination of a first component of the electric field and a second field difference between the electric field on the mask plane along the extended edge of the elementary pattern unit having the finite thickness and the electric field on the mask plane along the corresponding extended edge of the thin mask elementary pattern unit under illumination of a second component of the electric field orthogonal to the first component of the electric field; forming an isotropic field perturbation (IsoField Perturbation) to the thin mask electric field on the mask plane corresponding to the extended edge of the elementary pattern unit having the finite thickness comprising a weighted coherent combination of the first and second field differences; providing an imaging model for simulating an image on a wafer plane, the imaging model comprising a representation of the electric fields on the mask plane responsive to illumination from an imaging system, wherein the representation of the electric fields on the mask plane comprises the thin mask representation combined with the Isofield Perturbation; and simulating an image on the wafer plane corresponding to the mask feature under the illumination using said imaging model. In some embodiments, the above steps are performed employing a computer including a central processing unit.

In yet another aspect of the disclosure, a mixed weighting may be used for the weighted coherent combination of the first and second field differences. The determination of a mixed weighting may comprise a calibration of the imaging model relative to a rigorous EMF imaging model. In one embodiment, the rigorous EMF imaging model is a boundary layer model or an edge domain decomposition model.

According to yet another aspect of the disclosure, a mixed weighting $W^\mu$ for an orientation $\mu$ of a component of the electric field relative to the first edge is represented by $$W^\mu = \frac{2\langle |B_{m,n}^\mu \cdot M_m^{TMA*}| \rangle_{m,n}}{\langle |B_{m,n}^\perp \cdot M_m^{TMA*}| \rangle_{m,n} + \langle |B_{m,n}^\parallel \cdot M_m^{TMA*}| \rangle_{m,n}}$$

where the coefficients $B_{m,n}^\mu$ designate the constant of proportionality between the electric field transmitted from the mask to the amplitude for the illumination component orientation $\mu$ at the wafer plane, where $\mu$ indicates the orientation of the component of the electric field that is parallel $\parallel$ or perpendicular $\perp$ to the first edge, where m,n are indices representing the $m^{th}$ or $n^{th}$ diffracted order, respectively, where $M_m^{TMA}$ represents the amplitude of the m-th diffraction order from the mask in the TMA case.

In another aspect of the disclosure, the weighted coherent combination of the first and second field differences comprises using a fixed weighting of the first and second field differences. In one embodiment, the fixed weighting is a ratio of 50:50.

In yet another aspect of the disclosure, the calibration of the mixed weighting comprises representing the mixed weighting as a mixed weighting polynomial comprising variables that are optical characteristics of an aerial image of a calibration pattern; and determining the mixed weighting in accordance with a best fit of the mixed weighting polynomial to measurements of the optical characteristics of the aerial image of said calibration pattern.

According to yet another aspect of the disclosure, the calibration of the mixed weighting comprises classifying a calibration pattern into groups of calibration features based on geometric characteristics of the aerial image of the calibration pattern; determining a calibration optimum weights ratio for an IsoField Perturbation associated with each of the groups of calibration features in accordance with a figure of merit relative to an image of the calibration pattern using a rigorous EMF imaging model; assigning a group classification to the image of the mask feature in accordance with the groups of calibration features; and determining the mixed weighting by assigning the mixed weighting the value of the calibration optimum weights ratio associated with the group classification.

According to yet another aspect of the disclosure, the calibration of the mixed weighting comprises representing the mixed weighting as a mixed weighting polynomial comprising variables that are geometrical characteristics of the aerial image of the calibration pattern; and determining the mixed weighting in accordance with a best fit of the mixed weighting polynomial to measurements of the geometrical characteristics of the aerial image of the calibration pattern.

According to another aspect of the disclosure, the method further includes representing the source pupil as a plurality of source regions so that illumination from each of the plurality of source regions has a corresponding angle of propagation relative to a normal to the wafer plane, and determining an incident isotropic field perturbation corresponding to the illumination from each of the plurality of source regions, wherein the isofield edge perturbation is derived from a combination of the incident isotropic field perturbations corresponding to the illumination from each of the plurality of source regions. According to yet another aspect of the invention, the illumination is provided using a source pupil comprising a numerical aperture of 1.35 or greater According to another aspect of the disclosure, wherein the mask feature includes non-manhattan edges, then the IsoField Perturbation IsoΔM for a non-manhattan edge is expressed by $$Iso\Delta M^{Non-Manhattan\ Edge} = \frac{\cos\alpha}{\cos\alpha + \sin\alpha}\Delta M^{\parallel} + \frac{\sin\alpha}{\cos\alpha + \sin\alpha}\Delta M^{\perp}$$

where alpha (α) represents the angle formed by the incident illumination polarization and the non-manhattan edge orientation, and $\Delta M^{\parallel}$ and $\Delta M^{\perp}$ are the edge field perturbation components that are parallel and perpendicular to the incident illumination polarization, respectively.

According to another aspect of the disclosure, where the incident illumination polarization is not aligned with the manhattan edges along X- and Y-axes, then the IsoField Perturbation IsoΔM for the case of illumination polarization that is not aligned to a Manhattan edge is expressed by $$Iso\Delta M^{Non-XY\ Illumination} = \left(\frac{\cos\varphi}{\cos\varphi + \sin\varphi}\Delta M^{\perp} + \frac{\sin\varphi}{\cos\varphi + \sin\varphi}\Delta M^{\parallel}\right) \cdot \cos\theta$$

where theta (θ) represents the propagation incident angle of the illumination relative to the normal and phi (φ) represents the angle formed by the projection of the incident illumination on the mask plane. $\Delta M^{\parallel}$ and $\Delta M^{\perp}$ are the edge field perturbation components produced on an edge that are parallel and perpendicular to the incident illumination polarization, respectively.

Any of the method disclosed herein may be implemented in a computer program product or on a computer system.

The foregoing and other features and advantages of the disclosure will be apparent from the following detailed description.

BRIEF DESCRIPTION OF THE DRAWINGS

Referring to the exemplary drawings wherein like elements are numbered alike in the several figures, in which:

FIG. 2C illustrates a method of designing a mask using a lithographic process model with an isofield perturbation to represent EMF edge effects in accordance with the invention.

FIG. 10 illustrates a mask feature with non-manhattan orientation under polarized illumination.

Figure 1A:
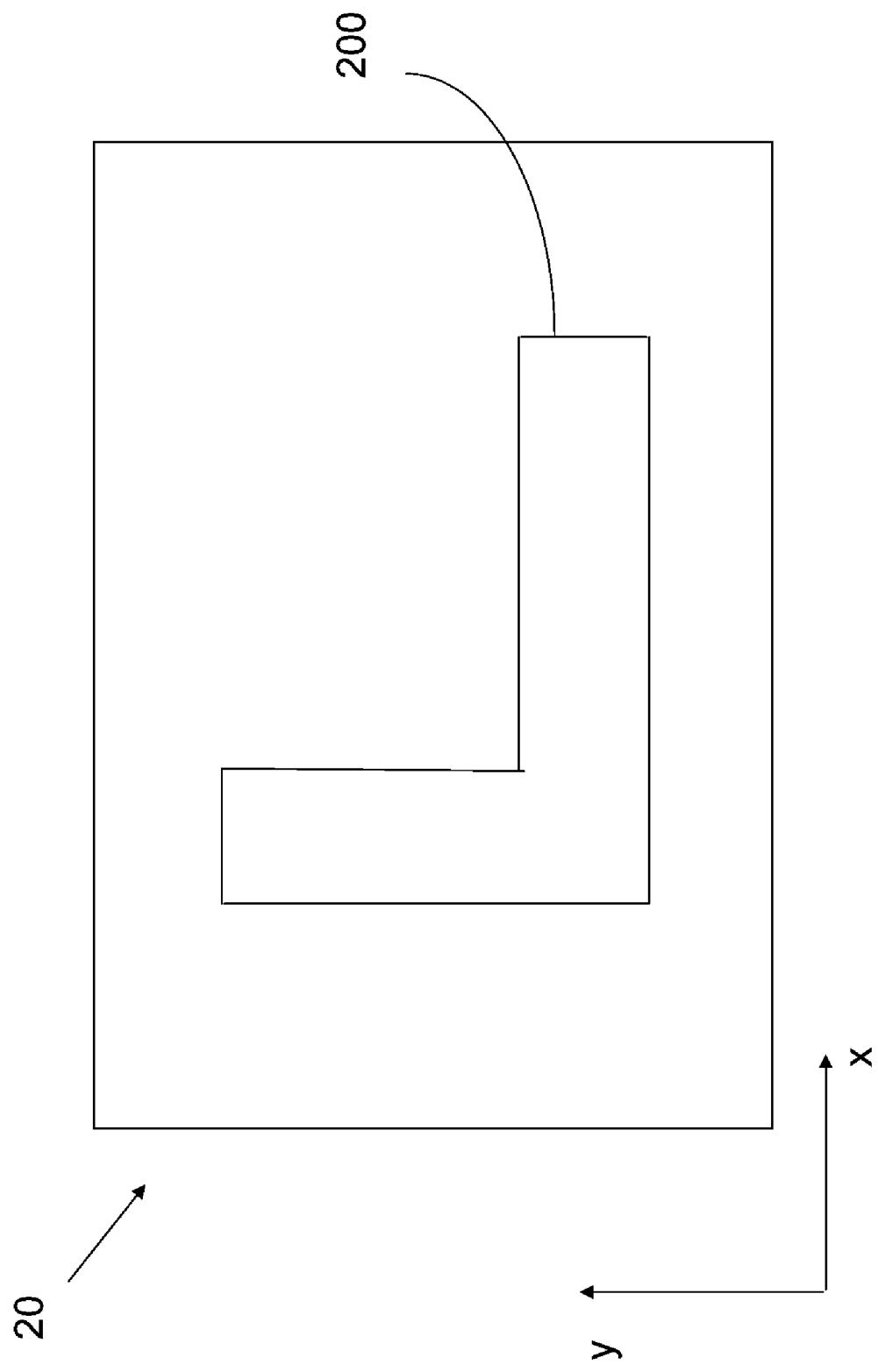
FIG. 1A illustrates a layout of a mask design.
Figure 1B:
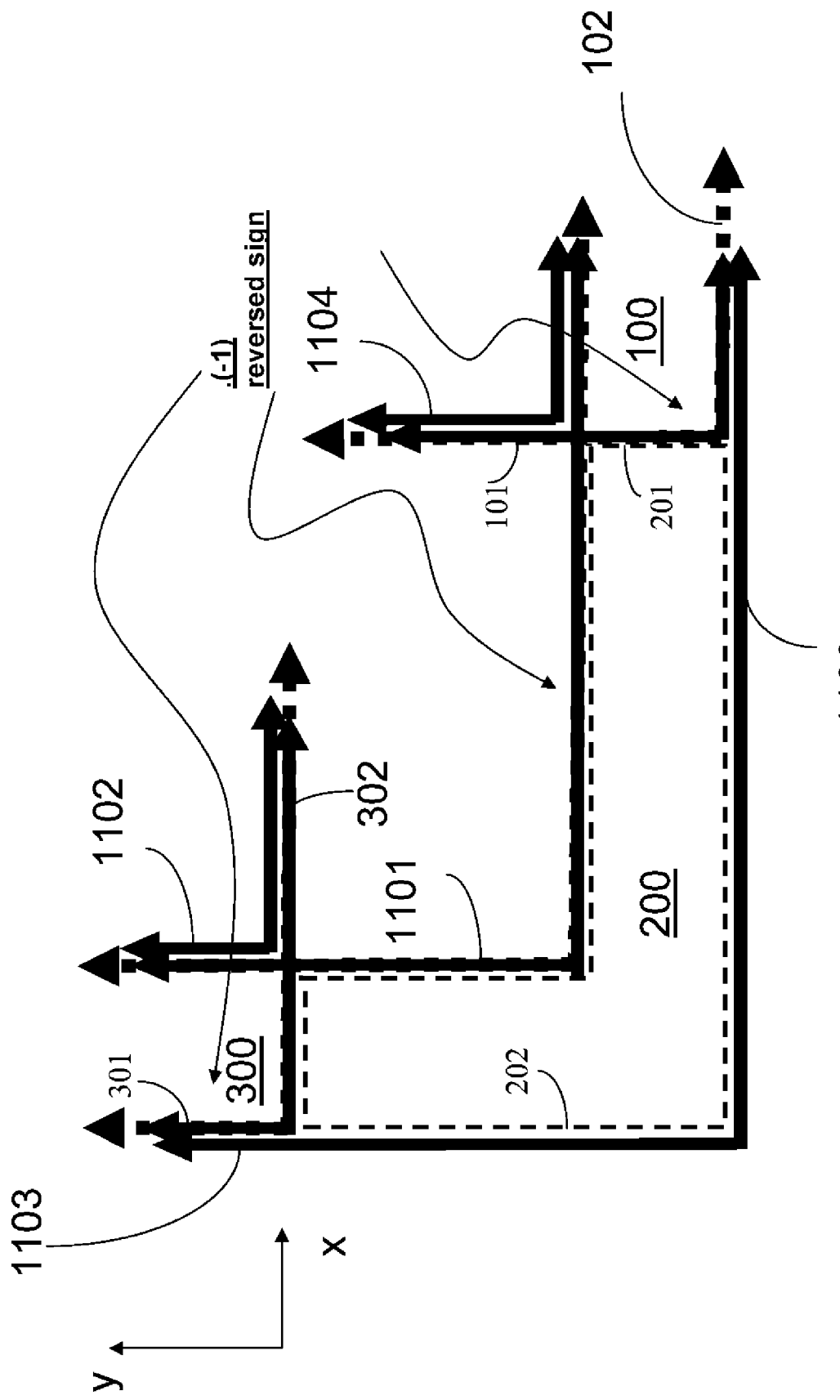
FIG. 1B illustrates mask feature of FIG. 1A represented in terms of elementary pattern units.

DETAILED DESCRIPTION OF THE INVENTION 5.1 Isotropic Edge Field Perturbation

The present invention describes a method for modeling the complex electromagnetic response of a lithographic photomask to the incident electromagnetic illumination, which is capable of achieving the same modeling accuracy as current polarized edge-field based prior art modeling methods in a fraction of the runtime, in some cases with no runtime penalty at all, for example with dense imaging algorithms. A core element of the invention is an isotropic field perturbation to all edges, which we term an isotropic-field or isofield IsoΔM, that mimics the effect of the true parallel and perpendicular edge field perturbations when the mask is illuminated with unpolarized light and certain cases of polarized illumination. The isofield calculation is described below. The isofield modeling method according to the present invention introduces a new type of elementary element for constructing mask features that combines the interior of planar elementary elements, such as quarter planes, and the isofield edge perturbation on the perimeter of the elementary element at the same time in one single elementary element, thus reducing the number of memory access calls required to form the aerial image that incorporates EMF effects. This approach can speed up simulations relative to prior art methods for SOCS calculations with EMF modeling. In addition, the present invention requires one single simulation for the case of unpolarized illumination, and eliminates the additional 2× runtime penalty of the prior art approaches for modeling EMF during large-area lithographic simulations with unpolarized illumination. Hence the invention enables prior-art OPC algorithms to accurately treat EMF effects with essentially no speed penalty over the conventional simple bias methods described above. The isotropic field modeling according to the invention provides accuracy that is comparable to the accuracy of more rigorous prior-art approaches such as DDM or BL, but with 2× to 4× improvement in execution time.

The isotropic field approach according to the invention treats the physical fields in an approximate way as perturbations that is generally adequate numerically. We now derive the physical basis for the isofield model. When the illumination is unpolarized, the total image is formed as an incoherent sum of the intensity images produced by each polarization component of the illumination.

The image component produced by either X-polarized or Y-polarized illumination can be written as a bilinear sum over all pairs of interfering diffraction orders. The fields of the interfering orders are electromagnetic vectors. However, these vectors will be related by trigonometric factors to the amplitude of the field, and this amplitude will be a complex scalar. The complex amplitude will generally be different under X and Y polarized illumination (hereinafter "X-pol" or "Y-pol", respectively) when the mask has topography of finite thickness, and the trigonometric factors that relate the amplitude to the vector components will also generally be different under the two illumination polarizations. We can use vector symbols $\vec{B}_n^{X\text{-}Pol}$ and $\vec{B}_n^{Y\text{-}Pol}$ to designate the overall vectorial constant of proportionality between the transmitted field from the mask to the amplitude for X-Pol and Y-Pol illumination polarizations at the wafer plane, respectively.

Using a 1D example for simplicity, the aerial images produced by each illumination polarization can be expressed as:

$$I^{X\text{-}Pol} = \left(\sum_m \vec{B}_m^{(X\text{-}Pol)} M_n^{(X\text{-}Pol)}\right) \cdot \left(\sum_m \vec{B}_m^{(X\text{-}Pol)} M_n^{(X\text{-}Pol)}\right)^* \quad \text{(eq. 1a)}$$
$$= \sum_n \sum_m B_{n,m}^{(X\text{-}Pol)} M_n^{(X\text{-}Pol)} [M_m^{(X\text{-}Pol)}]^*$$

$$I^{Y\text{-}Pol} = \left(\sum_m \vec{B}_m^{(Y\text{-}Pol)} M_n^{(Y\text{-}Pol)}\right) \cdot \left(\sum_m \vec{B}_m^{(Y\text{-}Pol)} M_n^{(Y\text{-}Pol)}\right)^* \quad \text{(eq. 1b)}$$
$$= \sum_n \sum_m B_{n,m}^{(Y\text{-}Pol)} M_n^{(Y\text{-}Pol)} [M_m^{(Y\text{-}Pol)}]^*$$

$M_n$ represents the amplitude of the nth diffraction order from the mask. In the TMA case, the mask response is independent of the polarization, and therefore $M_n^{(X\text{-}Pol)} = M_n^{(Y\text{-}Pol)} = M_n^{TMA}$.

The $B_{n,m}$ coefficients include the phase propagators that produce the intensity pattern on the wafer, as well as obliquity factors, polarization aberrations from the lens and resist stack, and a dot product between the image-plane unit vectors $\vec{B}_n$ of the interfering orders. (Without loss of generality, we have assumed a point source.)

The total image intensity $I^{Unpol}$, formed in unpolarized illumination is thus:

$$I^{UnPol} = \frac{1}{2}\left(\sum_n \vec{B}_n^{X\text{-}Pol} M_n^{X\text{-}Pol}\right) \cdot \left(\sum_m \vec{B}_m^{X\text{-}Pol} M_m^{X\text{-}Pol}\right)^* + \quad \text{(eq. 2)}$$
$$\frac{1}{2}\left(\sum_n \vec{B}_n^{Y\text{-}Pol} M_n^{Y\text{-}Pol}\right) \cdot \left(\sum_m \vec{B}_m^{Y\text{-}Pol} M_m^{Y\text{-}Pol}\right)^* ==$$
$$\frac{1}{2}\sum_m \sum_n \underbrace{(\vec{B}_n^{X\text{-}Pol} \cdot \vec{B}_m^{X\text{-}Pol*})}_{\boxed{B_{m,n}^{X\text{-}Pol}}} M_n^{X\text{-}Pol} M_m^{X\text{-}Pol*} +$$
$$\frac{1}{2}\sum_m \sum_n \underbrace{(\vec{B}_n^{Y\text{-}Pol} \cdot \vec{B}_m^{Y\text{-}Pol*})}_{\boxed{B_{m,n}^{Y\text{-}Pol}}} M_n^{Y\text{-}Pol} M_m^{Y\text{-}Pol*} =$$
$$\frac{1}{2}\sum_m \sum_n [B_{m,n}^{X\text{-}Pol} M_n^{X\text{-}Pol} M_m^{X\text{-}Pol*} + B_{m,n}^{Y\text{-}Pol} M_n^{Y\text{-}Pol} M_m^{Y\text{-}Pol*}]$$

where the coefficients $B_{m,n}^{X\text{-}Pol}$ and $B_{m,n}^{Y\text{-}Pol}$ are the constant of proportionality between the transmitted field from the mask to the amplitude for x-component of the illumination (X-Pol) and the y-component of illumination (Y-Pol) at the wafer plane, respectively, for an edge oriented along the Y direction. These coefficients may be expressed more generally as $B_{m,n}^{\perp}$ for the component of illumination oriented in a direction perpendicular to the edge and as $B_{m,n}^{\parallel}$ for the component of illumination oriented in a direction parallel to the edge. In general, these coefficients are independent of the content of the mask and are common for Thin Mask Approximation and real topographical masks.

For weak electromagnetic edge field perturbations, and considering for simplicity one dimensional lines and spaces that are parallel to the Y-axis, that is, for a shape edge oriented along the Y direction, we can expand the diffraction orders to approximate the departure from TMA in the total image as:

$$M_n^{X\text{-}Pol} = M_n^{TMA} + \Delta M_n^{\perp} \quad M_n^{Y\text{-}Pol} = M_n^{TMA} + \Delta M_n^{\parallel} \quad \text{(eq.3)}$$

where $\Delta M_n^{\perp}$ is the field perturbation along the edge due to the illumination polarization field that is perpendicular to the edge, i.e. in this example, for the Y-oriented edge, $\Delta M_n^{\perp}$ is the perturbation due to the X-polarized (X-Pol) illumination. Similarly, $\Delta M_n^{\parallel}$ is the edge field perturbation due to the electromagnetic field for an edge that is parallel to the illumination polarization, which in this example is along a Y-oriented edge for Y-polarized illumination (Y-Pol). Analogous terms are defined for edges oriented along the X-direction. (This Approximation is Discussed Further Below.)

After substituting (eq. 3) into (eq. 2) above:

$$I^{UnPol} = \frac{1}{2}\sum_{m,n}[B_{m,n}^{X-Pol}M_n^{TMA}M_m^{TMA*} + B_{m,n}^{Y-Pol}M_n^{TMA}M_m^{TMA*}] + \quad \text{(eq. 4)}$$

$$\frac{1}{2}\sum_{m,n}\left[\begin{array}{c}M_n^{TMA}(B_{m,n}^{X-Pol}\Delta M_m^{\perp *} + B_{m,n}^{Y-Pol}\Delta M_m^{\parallel *}) + \\ M_m^{TMA*}(B_{m,n}^{X-Pol}\Delta M_n^{\perp} + B_{m,n}^{Y-Pol}\Delta M_n^{\parallel})\end{array}\right] +$$

terms on $(\Delta M_n^{\perp}\Delta M_m^{\perp *} + \Delta M_n^{\parallel}\Delta M_m^{\parallel *}) =$ $$I^{TMA} + \Delta I^{X-Pol\&Y-Pol} + \text{Second Order Terms}$$

and therefore the first order non-thin mask component $\Delta I^{X-Pol}$ & $_{Y-Pol}$ of the image intensity (for an edge along the Y-direction) can be expressed as:

$$\Delta I^{X-Pol\&Y-Pol} \equiv \Delta I^{UnPol} = \quad \text{(eq. 5)}$$

$$\frac{1}{2}\sum_{m,n}[M_n^{TMA}(B_{m,n}^{X-Pol}\Delta M_m^{\perp *} + B_{m,n}^{Y-Pol}\Delta M_m^{\parallel *}) +$$

$$M_m^{TMA*}(B_{m,n}^{X-Pol}\Delta M_n^{\perp} + B_{m,n}^{Y-Pol}\Delta M_n^{\parallel})]$$

It would be understood by one skilled in the art that an analogous term is provided for an edge along the X-direction. In equation (5) the term in the inner parentheses $\Delta \overline{M} \equiv (B_{m,n}{}^{X-Pol}\Delta M_n^{\perp} + B_{m,n}{}^{Y-Pol}\Delta M_n^{\parallel})$ represents a weighted mixing $\Delta \overline{M}$ of the edge field perturbations due to electromagnetic effects of both polarizations. Moreover, these equations show that this term $\Delta \overline{M}$ can be interpreted as a new kind of perturbation, which we refer to as an isotropic edge field perturbation $\Delta \overline{M}$, that produces almost the same unpolarized aerial image as one finds with the prior art procedure of calculating separate polarized aerial images (under orthogonal polarizations) while including the prior art edge fields. This weighted mixing of the separate edge field perturbations per polarization, or the isotropic edge field perturbation, is common to both polarizations when using unpolarized illumination, regardless of the edge orientation relative to the polarization. Moreover, based on equation (5), only one image calculation is necessary for unpolarized illumination when using the IsoField perturbation.

In specific mathematic terms, the ideal mixing weight for each polarization component μ of the isoField perturbation is given by:

$$\text{Mixing } Weights^\mu = W^\mu \quad \text{(eq. 6)}$$

$$= \frac{2\langle|B_{m,n}^{\mu} \cdot M_m^{TMA*}|\rangle_{m,n}}{\langle|B_{m,n}^{\parallel} \cdot M_m^{TMA*}|\rangle_{m,n} + \langle|B_{m,n}^{\perp} \cdot M_m^{TMA*}|\rangle_{m,n}}$$

where μ=∥ or ⊥, and ⟨⟩ indicates the average over all diffracted orders. In the example of an edge oriented along the y direction, μ=∥ is X-Pol and μ=⊥ is Y-Pol.

Taking equation (5) and multiplying and dividing each sum term by the same term in between brackets:

$$\Delta I^{UnPol} = \frac{1}{2}\sum_{m,n}\left\{\begin{array}{c}M_m^{TMA*}(B_{m,n}^{X-Pol}\Delta M_n^{\perp} + B_{m,n}^{Y-Pol}\Delta M_n^{\parallel}) \\ \frac{[B_{m,n}^{X-Pol}M_m^{TMA*} + B_{m,n}^{Y-Pol}M_m^{TMA*}]}{[B_{m,n}^{X-Pol}M_m^{TMA*} + B_{m,n}^{Y-Pol}M_m^{TMA*}]} + \\ M_n^{TMA}(B_{m,n}^{X-Pol}\Delta M_m^{\perp} + B_{m,n}^{Y-Pol}\Delta M_m^{\parallel}) \\ \frac{[B_{m,n}^{X-Pol}M_n^{TMA} + B_{m,n}^{Y-Pol}M_n^{TMA}]}{[B_{m,n}^{X-Pol}M_n^{TMA} + B_{m,n}^{Y-Pol}M_n^{TMA}]}\end{array}\right\}$$

or $$\Delta I^{UnPol} = \frac{1}{4}\sum_{m,n}\left\{\begin{array}{c}\begin{pmatrix}W^{X-Pol*}\Delta M_m^{\perp *} + \\ W^{Y-Pol*}\Delta M_m^{\parallel *}\end{pmatrix}\begin{bmatrix}B_{m,n}^{X-Pol}M_n^{TMA} + \\ B_{m,n}^{Y-Pol}M_n^{TMA}\end{bmatrix} + \\ \begin{pmatrix}W^{X-Pol}\Delta M_n^{\perp} + \\ W^{Y-Pol}\Delta M_n^{\parallel}\end{pmatrix}\begin{bmatrix}B_{m,n}^{X-Pol}M_m^{TMA*} + \\ B_{m,n}^{Y-Pol}M_m^{TMA*}\end{bmatrix}\end{array}\right\}.$$

In accordance with the present invention, the IsoField Iso$\Delta$M, or isotropic edge field perturbation for a Y-direction edge, is defined as:

$$\text{Iso}\Delta M = W^{\perp}\Delta M^{\perp} + W^{\parallel}\Delta M^{\parallel} = W^{X-Pol}\Delta M^{\perp} + W^{Y-Pol}\Delta M^{\parallel} \quad \text{(eq. 7)}$$

where $W^{\perp}$ is a mixed weight for the component of the illumination perpendicular to the edge (in this example, the X-Pol or x-component of the illumination is perpendicular to the Y-direction edge), $\Delta M^{\perp}$ is the perturbation for the Y-direction edge relative to the X-Pol illumination (which is perpendicular to X-Pol in this example). $W^{\parallel}$ is a mixed weight for the component of the illumination parallel to the edge (in this example, the Y-Pol or y-component of the illumination is parallel to the Y-direction edge), and $\Delta M^{\parallel}$ is the perturbation for the Y-direction edge relative to the Y-Pol illumination (which is parallel to the Y-Pol illumination in this example). Iso$\Delta$M of equation 7 is the normalized form of the inner parentheses term $\Delta \overline{M}$ of equation 5, where the coefficients $B_{m,n}{}^{X-Pol}$ and $B_{m,n}{}^{Y-Pol}$ have been normalized in accordance with equation 6.

Using the IsoField Iso$\Delta$M defined in equation 7, equation 5 may be expressed as:

$$\Delta I^{UnPol} = \frac{1}{4}\sum_{m,n}\left\{\begin{array}{c}\begin{bmatrix}B_{m,n}^{X-Pol}M_m^{TMA*} + \\ B_{m,n}^{Y-Pol}M_m^{TMA*}\end{bmatrix}Iso\Delta M_n + \\ \begin{bmatrix}B_{m,n}^{X-Pol}M_n^{TMA} + \\ B_{m,n}^{Y-Pol}M_n^{TMA}\end{bmatrix}Iso\Delta M_m^*\end{array}\right\} \quad \text{(eq. 8)}$$

Hence the isofield perturbation Iso$\Delta$M is applied to both polarizations when using unpolarized light, and with Manhattan layouts it is applied on both horizontal and vertical edges. This means that one single simulation covers both illuminating polarizations, which provides a runtime less than half that of regular EMF modeling approaches.

Figure 2A:
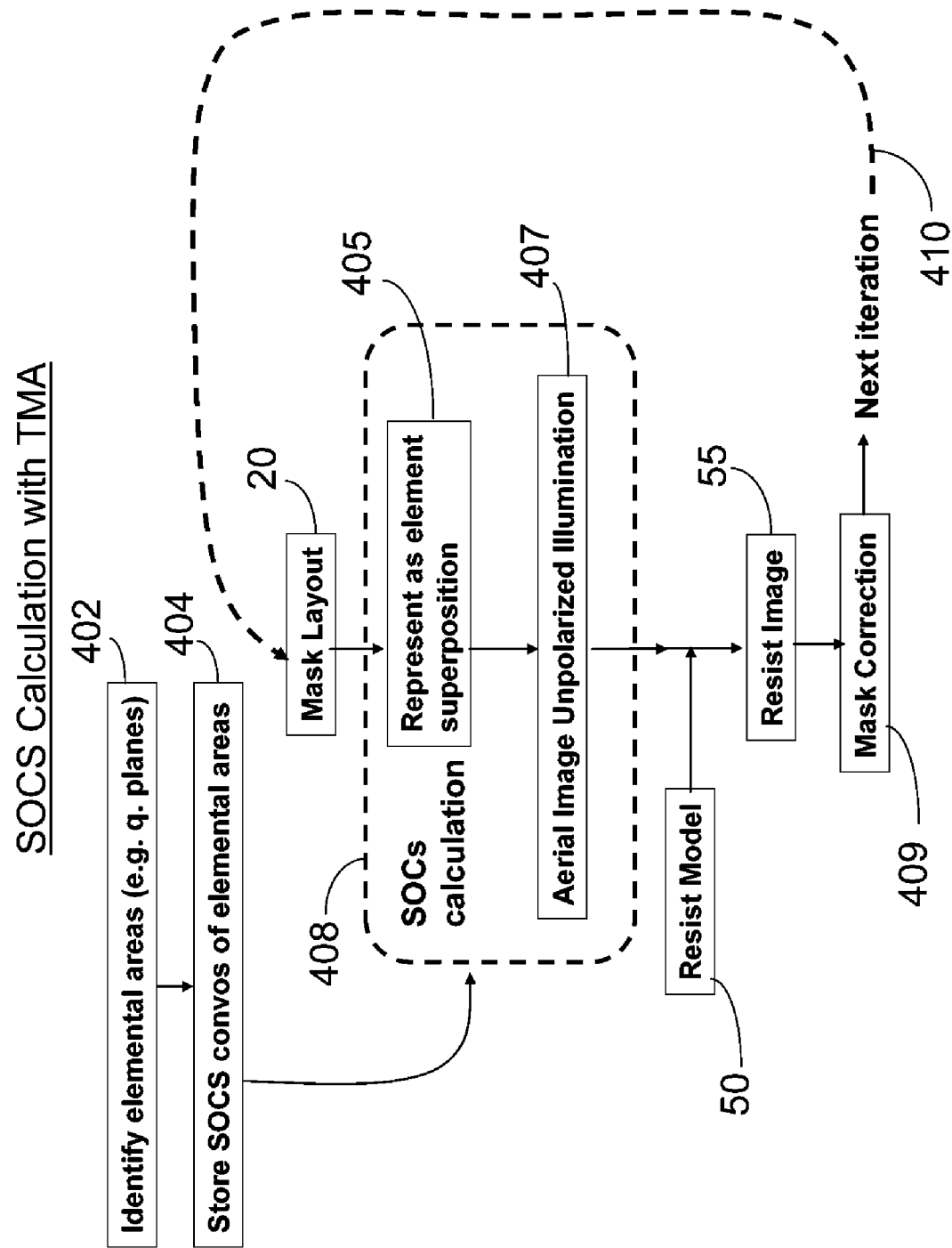
FIG. 2A illustrates a prior art method of designing a mask using a lithographic process model with a thin mask approximation.
Figure 2B:
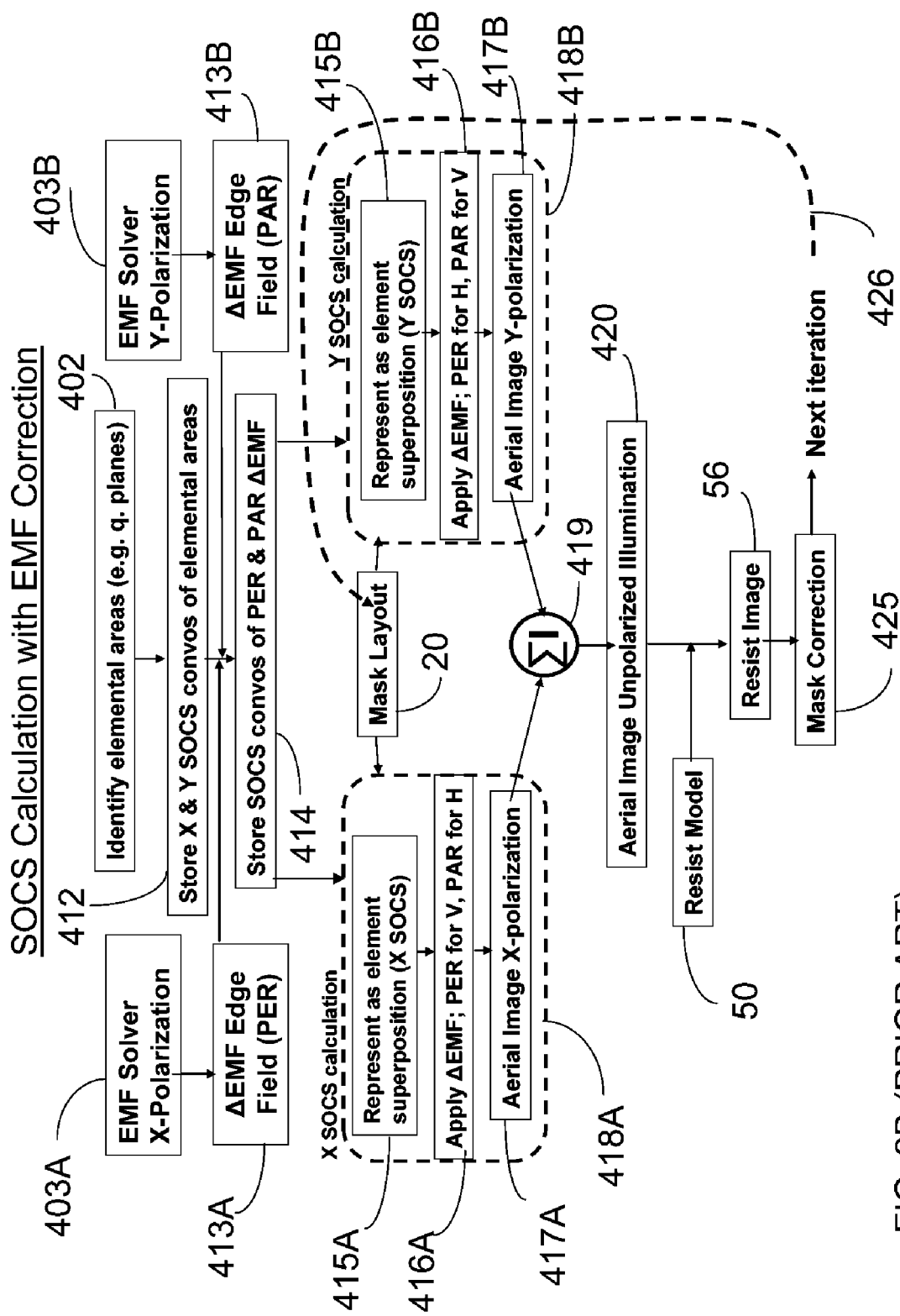
FIG. 2B illustrates a prior art method of designing a mask using a lithographic process model with a correction for EMF edge effects.

FIG. 2C illustrates one embodiment of a method for determining an image of polygon shapes in a topographic mask, in accordance with the present invention. A mask layout 20 is provided that comprises one or more two-dimensional mask shapes or element, such as polygons. A mask polygonal shape or element is represented by elemental areas, such as quarter planes (Block 702). In a preferred embodiment of the present invention, there are four types of elemental areas, as discussed further below. The electric field for the X-polarized illumination (X-pol 703A) and Y-polarized illumination (Y-pol 703B) is computed for a thin mask representation of the layout, i.e. using the two-dimensional mask shape, for example using an EMF simulator or model. The perturbation to the thin mask representation due to EMF effects related to the mask topography is computed for each edge, for the field polarization perpendicular to an edge ΔEMF(PER) 705A, e.g. $\Delta M^\perp$, and for the field polarization parallel to the edge ΔEMF(PAR), e.g. $\Delta M^\parallel$. The perpendicular and parallel field perturbations ΔEMF(PER) 705A, ΔEMF(PAR) 705B are combined (Block 707) to form an isofield perturbation IsoΔM (Block 750). The isofield perturbation IsoΔM may be formed using mixed weights (Block 709), for example, as in Equation 7.

In accordance with the invention, a representation of the electromagnetic response of each elemental area (such as a quarter plane) with a topographic edge is formed by combining the thin mask field with the EMF finite edge perturbations IsoΔM. The resulting perturbed field of the elemental area is referred to hereinafter as a topo-edged element field (Block 704). The topo-edged element according to the invention is described further below. Next, the aerial image of each topo-edged element may be calculated by convolving the SOCS kernels, for unpolarized illumination in this example, with the topo-edged element field and stored (Block 706).

An optical model in accordance with the invention, may be used to compute the aerial image of the mask layout (Block 718), for example to optimize the mask layout 20 during OPC processing (730), or in other design processes, such as mask verification. In MBOPC 730, each polygonal shape of the layout 20 is decomposed into a superposition of topo-edged elements (Block 715). Then the aerial image of the polygonal shape is calculated (Block 717) by summing the squares of the SOCs convolutions of the topo-edged elements which were calculated in Block 706. Then the image on the wafer (e.g. resist image 57) may be computed by using a process model (e.g. resist model 50) which uses image parameters obtained from the optical image 717 computed for the topographic mask layout 20. The resulting wafer image 57 is compared to the desired target, and the mask layout 20 may be modified and corrected (Block 725) and the process repeated (726) as is typical in OPC methodologies.

In terms of its impact on the image, it is not necessary to regard the isofield perturbation as functionally separate from the TMA term. Taking the first 2 terms of equation (4) and substituting equation (8) for the second term:

$$I^{UnPol} \cong \frac{1}{4} \sum_{m,n} \{[B_{m,n}^{X-Pol} M_m^{TMA*} + B_{m,n}^{Y-Pol} M_m^{TMA*}]$$

$$M_n^{TMA} + [B_{m,n}^{X-Pol} M_n^{TMA} + B_{m,n}^{Y-Pol} M_n^{TMA}] M_m^{TMA*}\} +$$

$$\frac{1}{4} \sum_{m,n} \{[B_{m,n}^{X-Pol} M_m^{TMA*} + B_{m,n}^{Y-Pol} M_m^{TMA*}] Iso\Delta M_n + [$$

$$B_{m,n}^{X-Pol} M_n^{TMA} + B_{m,n}^{Y-Pol} M_n^{TMA}] Iso\Delta M_m^*\}$$

which can also be expressed in a single term as follows:

$$I^{UnPol} \cong \frac{1}{4} \sum_{m,n} \{[B_{m,n}^{X-Pol} M_m^{TMA} + B_{m,n}^{Y-Pol} M_m^{TMA}]^* \qquad \text{(eq. 9)}$$

$$(M_n^{TMA} + Iso\Delta M_n) + [B_{m,n}^{X-Pol} M_n^{TMA} + B_{m,n}^{Y-Pol} M_n^{TMA}]$$

$$(M_m^{TMA} + Iso\Delta M_m)^*\}$$

In equation (9) we see that the TMA mask layout representation $M^{TMA}$ can be combined with the isofield edge field perturbations IsoΔM into one single term that provides a formulation for the aerial image with unpolarized illumination in one single simulation. This is also a necessary but not sufficient requirement for a mask representation that combines the TMA and the edge perturbation due to electromagnetic effects on the reticle topography perimeter.

To fully realize such a representation, in accordance with the invention, a new polygon decomposition method is provided that overcomes the limitations of the prior art polygon decomposition method using SOCS calculations with finite-thickness topography using edge field corrections as previously described in Section 4.6 above. The topo-edged polygon elements constructed in Block 704 according to the invention are a new type of polygon element for mask decomposition; specifically a polygon element that incorporates the effects of the reticle finite thickness topography interacting with the electromagnetic illumination. The convolution of these new topo-edged polygon elements with the SOCS kernels is then pre-stored (Block 706) and used during image calculations (Block 718) with electromagnetic modeling at a fraction of the runtime required for prior art EMF modeling of topographic mask effects during OPC.

5.2. Basic IsoField Embodiment

To lowest order we can treat vector imaging effects of the image intensity as an approximate perturbation over the thin mask representation provided by the first order non-thin mask component $\Delta I^{X-Pol\ \&\ Y-Pol}$ of the form of equation (5). In a preferred embodiment, a less severe approximation may be made that, in the perturbation term $\Delta I^{X-Pol\ \&\ Y-Pol}$, vector imaging effects need only be considered as being approximately the same for each separate polarization.

Using the approximation that $B_{m,n}^{X-Pol} \cong B_{m,n}^{Y-Pol} \cong B_{m,n}^{Un-Pol}$, we then see that the parallel and perpendicular perturbations $\Delta M^\parallel$ (or more generally, ΔEMF(PAR)) and $\Delta M^\perp$ (or more generally, ΔEMF(PER)), which are induced in the order amplitudes by the edge fields, will only affect the intensity as a 50:50 weighted average, validating the isotropic edge field approximation in this embodiment. Under this approximation, equation (5) can be expressed as:

$$\Delta I^{X-Pol\ \&\ Y-Pol} \equiv \Delta I^{UnPol} \cong \qquad \text{(eq. 10a)}$$

$$\cong \frac{1}{2} \sum_{m,n} \left[ \begin{array}{l} M_n^{TMA} B_{m,n}^{UnPol} (\Delta M_m^{\perp *} + \Delta M_m^{\parallel *}) + \\ M_m^{TMA*} B_{m,n}^{UnPol} (\Delta M_n^\perp + \Delta M_n^\parallel) \end{array} \right]$$

where $$Iso\Delta M = \Delta M^\perp + \Delta M^\parallel \qquad \text{(eq. 10b)}$$

The expression in the inner parentheses $\Delta M^\perp + \Delta M^\parallel$ (also shown complex conjugated) is the isofield perturbation IsoΔM, according to the invention, in the case of 50:50 mixing weights.

Since the electromagnetic edge field perturbation term is small even in prior art methods, we are justified in handling the edge field perturbation term in a more approximate way. Nonetheless, the accuracy loss due to use of the Isofield IsoΔM in even the basic 50:50 weighted embodiment is negligible up to an NA of at least 1.2.

In a similar manner to the derivation of equation (9) for the image intensity, we can express the equation for the aerial image $I^{Unpol}$ under unpolarized illumination for the case of $B_{m,n}^{X-Pol} \cong B_{m,n}^{Y-Pol} \cong B_{m,n}^{UnPol}$, as follows:

$$I^{UnPol} \cong \frac{1}{2} \sum_{m,n} \{B_{m,n}^{UnPol} M_m^{TMA*}(M_n^{TMA} + Iso\Delta M_n) + \qquad \text{(eq. 11)}$$

$$B_{m,n}^{UnPol} M_m^{TMA}(M_m^{TMA} + Iso\Delta M_m)^*\}$$

The isofield model thus accounts for vector imaging effects with full accuracy in the TMA terms, and in an approximate way in the electromagnetic edge field term. Specifically, the approximation for the basic embodiment comes in exploiting $B_{m,n}^{X-Pol} \approx B_{m,n}^{Y-Pol}$, yielding what we refer to as the 50:50 mixing weight embodiment. This approximation achieves quite good accuracy, even at high NAs such as NA=1.2. Note that ray propagation angles are reduced inside the resist film, making polarization effects less strong than in the aerial image. Fortunately, it is the image in resist that actually governs the exposure process, and as a result the basic 50:50 embodiment is reasonably accurate even in many hyper-NA situations.

Figure 3:
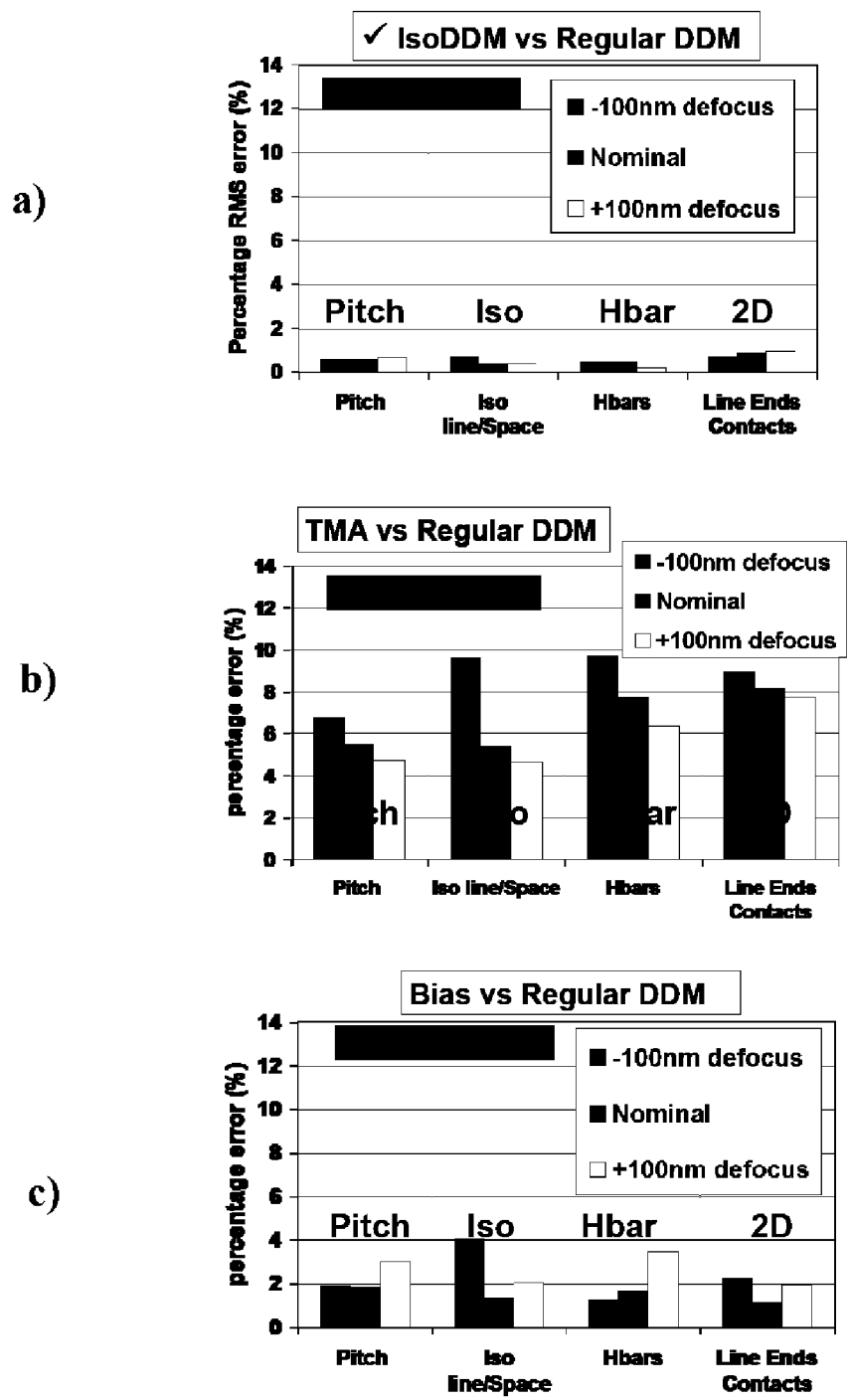
FIG. 3 illustrates a comparison of relative accuracy of lithographic process models, including an embodiment in accordance with the invention.

FIG. 3 shows the results of an implementation and test of the 50:50 weighted isofield embodiment of the invention, using as a reference, a more rigorous regular DDM approach, in which the different topography correction terms are required for the edges parallel or edges perpendicular to the illumination polarization, as described by Adam and Neureuther (see Section 4.3 above). For comparison, a set of calibration structures for a 65 nm gate layer was used to evaluate the accuracy of three electromagnetic modeling approaches relative to the more rigorous, but slower, regular DDM approach: the Thin Mask Approximation (TMA), the Simple Biased TMA, and the Isotropic field approach of the present invention. All three of these methods allow OPC simulations to be at least 2× faster than using the regular DDM under unpolarized illumination. In carrying out each of the modeling approaches, an optical model with NA of 1.2 was constructed, as well as a resist model using a simple Constant Threshold Reference (CTR) resist model form; this was built with beam focus of 0 nm and +/−100 nm, respectively, at an NA of 1.2. The error in the calculated empirical threshold across the simulation set for each of the electromagnetic modeling approaches (relative to the regular DDM approach) is measured and plotted in FIG. 3, on a percentage scale from 0-14%. The empirical threshold is the threshold for some particular feature that would need to be applied to the simulated aerial image of the feature in order to yield a CD value matching the experimentally obtained resist CD.

This embodiment of the present isofield inventive method using a 50:50 weighting of the amplitudes of orthogonal parallel and perpendicular perturbations provides through-process accuracy that is comparable (i.e. within about 1%) to the more rigorous regular DDM methodology, as shown in FIG. 3(a), as compared to a TMA approach which yielded errors in the range of about 5-10% relative to the more rigorous regular DDM method (see FIG. 3(b). The isofield method of this invention is also an improvement over a simple biased model, which may provide errors in the range from greater than 1% to about 4% relative to the regular DDM method (see FIG. 3(c)). The advantage of the inventive isofield method over the TMA or Simple Biased TMA methods is that it provides accuracy that comparable to a rigorous regular DDM up to at least an NA of 1.2, but provides improved speed of calculation comparable to TMA and Simple Biased TMA (at least about 2× faster than regular DDM).

5.3. Description of SOCS Implementation of IsoField

When the isofield perturbation of the present invention is used in place of the standard edge field, an approximately 2× runtime improvement can be obtained in the usual case of unpolarized illumination, since with the isofield perturbation one can use the SOCS kernels corresponding to an unpolarized imaging system, and then one can carry out a single simulation in place of the usual pair of simulations that is required in the prior art separately for the X-Pol and Y-Pol components of the illumination. Recall that the unpolarized SOCS kernels require that the same mask inputs be useable with either polarization component of the illumination. This is not possible with the prior art edge field contributions, since these edge fields depend on the illuminating polarization (i.e. on the edge orientation relative to the illuminating polarization). However, in accordance with the present invention, a single isofield contribution can be used with either illumination polarization, and with either edge orientation, allowing approximately a 2× efficiency improvement. The isofield perturbation of the present invention may be applied to both dense imaging and sparse imaging methodologies to enable improvement in execution time due to the reduction in number of required simulations.

In the case of sparse imaging methods, the prior art methods for handling the edge fields of the polygon is to treat them essentially as separate features, of different kinds for each edge (e.g. Boundary Layer features or DDM features). Typically, these features are stored in separate lookup tables for use during computation, and the additional lookup time can increase the execution time as much as ~2-3× above and beyond the time required to simulate both the X-Pol and Y-Pol components of unpolarized illumination. By contrast, the isofield perturbation according to the invention allows the edge fields of the polygon to be represented as superpositions of edge fields along the two edges of the quarter-plane (i.e. the two edges that meet in the quarter-plane's corner), so that the number of lookups can be reduced.

In accordance with the invention, the isofield perturbation may be used to construct topo-edged elements that are elemental plane fields that include orientation-independent delta-function edge fields, and by using positive and negative combinations of the isofield perturbations along the boundaries of the elemental planes (e.g. a quarter plane), the EMF of a topographic mask polygon may be synthesized. In other words, the new polygon elements allow simultaneous synthesis of both the edge structure of mask polygons, and the interior area of the polygons. Rather than calculating DDM or BL contributions from the edges of the polygons (or polygon elements) in a separate step, as is done in the prior art, the orientation-independent topo-edged elements according to the invention allows the contributions from the interior and perimeter of a mask polygon to be obtained at the same time. Thus, the method of the present invention can reduce the number of memory access calls or lookups needed to model the effect of finite-thickness mask topography compared to prior art methods.

Figure 4:
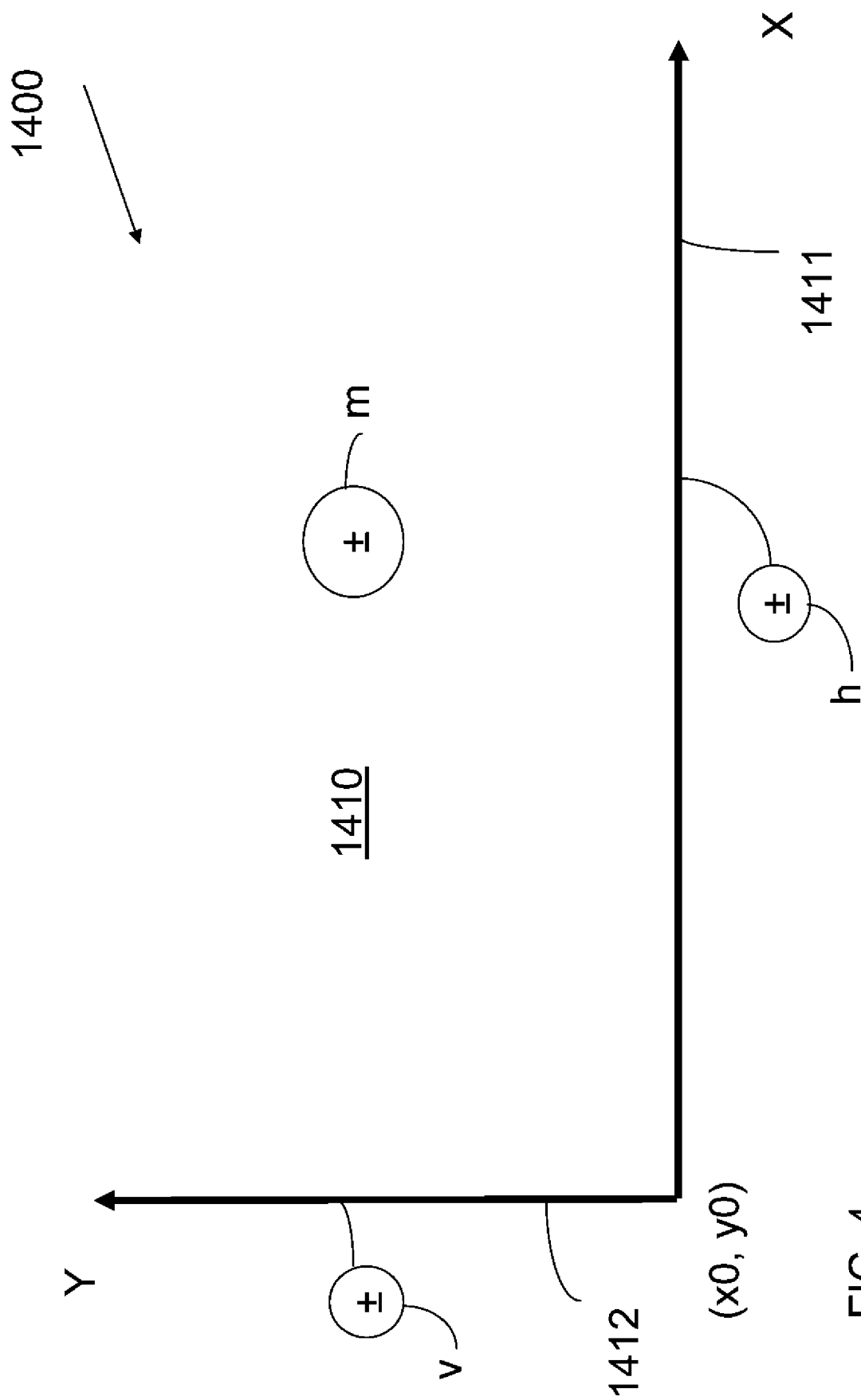
FIG. 4 is a schematic of an elementary pattern unit representing topo-edged elements in accordance with the invention.

The topo-edged elements have an TMA interior bounded by two edges extending from a corner point that extend infinitely along the edges from the corner point. For example, referring to FIG. 4, a quarter plane topo-edged element 1400 may be defined by a vertex at (x0, y0) having a horizontal edge 1411 extending infinitely along the x-direction from the vertex, and a vertical edge 1412 extending infinitely along the y-direction from the vertex. The interior 1410 of the topo-edged element 1400 has a feature transmission value T which is fixed for a given mask polygon. The TMA interior 1410 may be assigned a value in a range from a value (e.g. 0) representing a transmission T that is 100% opaque to a value (e.g. 1) representing a transmission T that is 100% transmissive. Each edge 1411, 1412 has an edge value that is equal to the scalar magnitude of the isofield perturbation Iso$\Delta$M. In addition, the TMA interior 1410 has a sign m, the horizontal edge has a sign h, and the vertical edge has a sign v. The signs m, h and v are determined by the sequence of assembly of topo-edged elements that are combined to construct a particular polygon on the mask.

Figure 5:
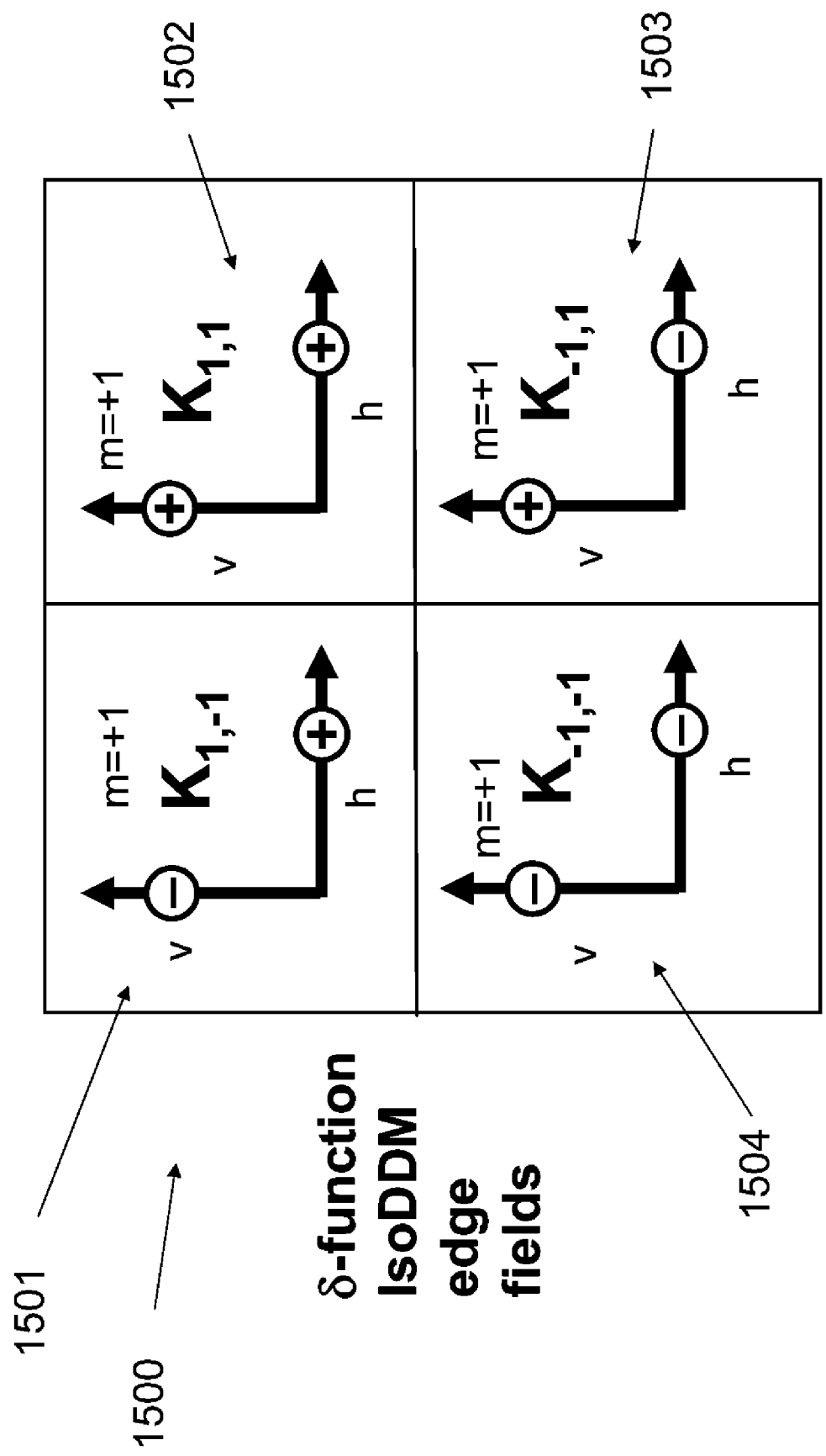
FIG. 5 illustrates an embodiment of four topo-edge polygon elements in accordance with the invention.

The construction of the aerial image $I^{Unpol}$ from equation (9), and the special case of equation (11), using orientation-independent topo-edged elements according to the invention, is now illustrated in the context of SOCS calculations with the isofield edge perturbation approach. Referring to FIG. 5, in a preferred embodiment, one of four varieties of pre-calculated topo-edged elements 1501, 1502, 1503, 1504 can be applied to the mask polygon corners in order to synthesize the convolution of a SOCS kernel with the given polygon together with the edge fields due to the finite thickness of the mask topography. Each topo-edged element may be represented by the term K(mT, h Iso$\Delta$M, vIso$\Delta$M), where v and h are the signs of the vertical and horizontal edges, respectively, Iso$\Delta$M is the isofield perturbation, T is the transmission value, and m is the sign of the field transmission T of the topo-edged element. In this example, T=1 and m=+1 for all four elements, and since the same isofield perturbation is assigned to each edge, the notation for each element is hereinafter designated by the simplified symbol $K_{h,v}$, although the invention is not so limited. A first topo-edged element $K_{1,-1}$ 1501 has a horizontal edge sign h=+1 and a vertical edge sign of v=−1. A second topo-edged element $K_{1,1}$ 1502 has a horizontal edge sign h=+1 and a vertical edge sign of v=+1. A third topo-edged element $K_{1,1}$ 1503 has a horizontal edge sign h=−1 and a vertical edge sign of v=+1. A fourth topo-edged element $K_{1,-1}$ 1504 has a horizontal edge sign h=−1 and a vertical edge sign of v=−1. The topo-edged elements are combined to form a mask or layout polygon so that they will reproduce the original layout polygon with topography edge corrections only along the polygon actual perimeter. Extended edges of the elementary topo-edge element that project into polygon areas that do not present actual topography edges are compensated for with the corresponding inverse topo-edge element that will cancel the edge contribution in exactly the same amount but opposite sign.

In a preferred embodiment, as illustrated in FIG. 5, topo-edged elements consisting of a total of four (4) combination options of signed edge corrections and a positive (m=+1) TMA quarter plane 1410 (see FIG. 4), are enough to cover all possible combinations that can occur in a manhattan layout, with the possibility of multiplying the entire topo-edged element type by (−1). Alternatively, the sign m of the interior and h, v of the edges may be determined based on the sequence of assembly of topo-edged elements. Four table entries of a table 1500 per kernel accomplish this, as shown in FIG. 5, where each table entry $K_{h,v}$ contains a TMA quarter-plane 1410 having a transmissive value T of sign m, and in either an additive or a subtractive way, the topography-induced edge fields 1411, 1412 having magnitudes equal to the isofield perturbation Iso$\Delta$M. The table assignment for each polygon corner need only be made once for all SOC kernels, as opposed to three table assignment per corner necessary in prior art methods, that is, one for the TMA inner quarter plane, and one per vertical and horizontal edges, respectively.

Figure 6:
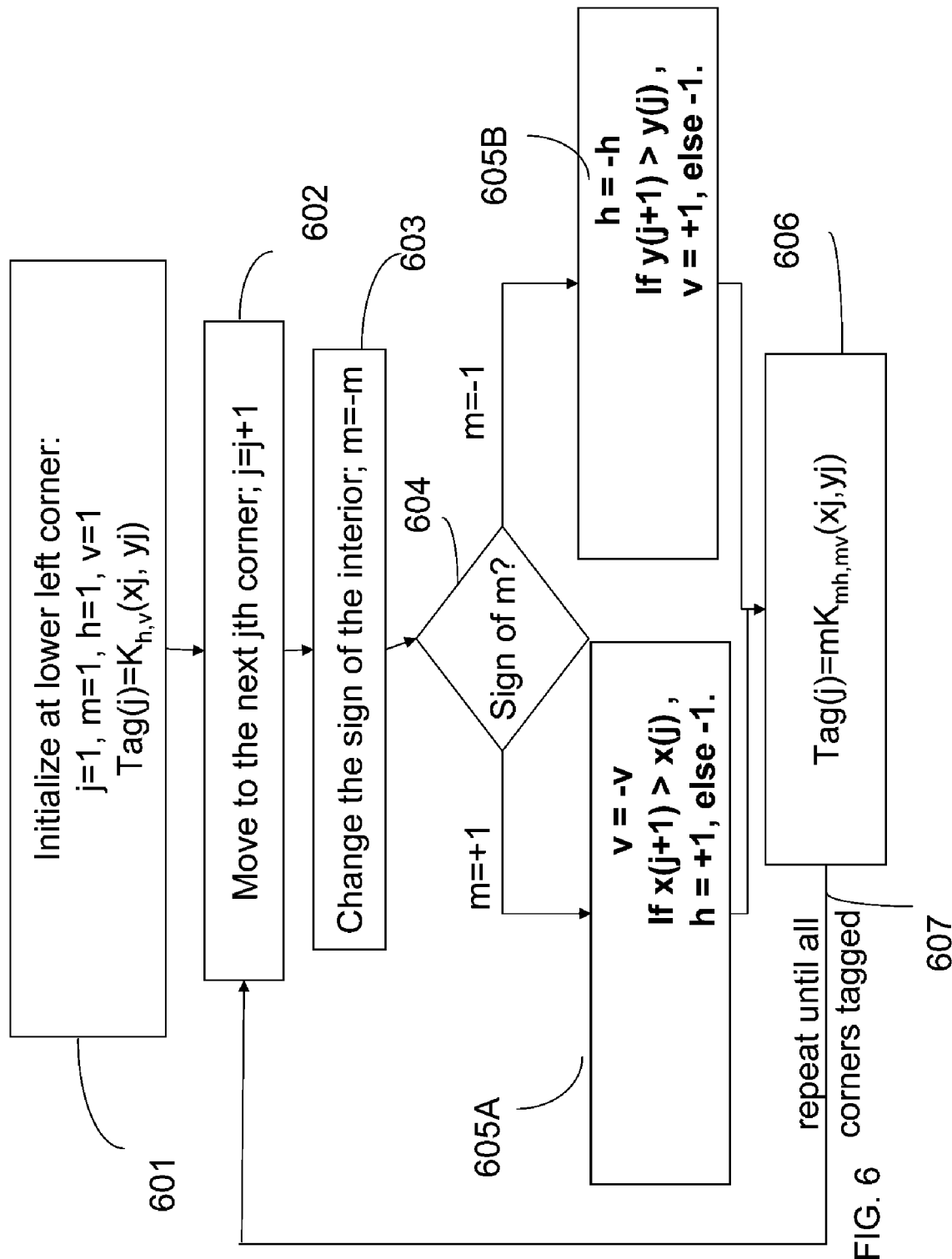
FIG. 6 is a flow chart of a method of representing a mask feature in terms of topo-edge polygon elements, in accordance with an embodiment of the invention.

Moreover, this assignment only involves the simple integer calculation shown in FIG. 6, with reference to FIGS. 7A through 7G, which provide an example representation of a polygon 1700 in terms of topo-edged elements in an embodiment of the invention. In FIGS. 7A-7G, the edges of the topo-edged elements each have a magnitude equal to the isofield perturbation Iso$\Delta$M, which are not shown for clarity of explanation. In order to construct a polygon, the assembly of topo-edged elements stored in the table 1500 of FIG. 5 may be performed as follows.

Figure 7A:
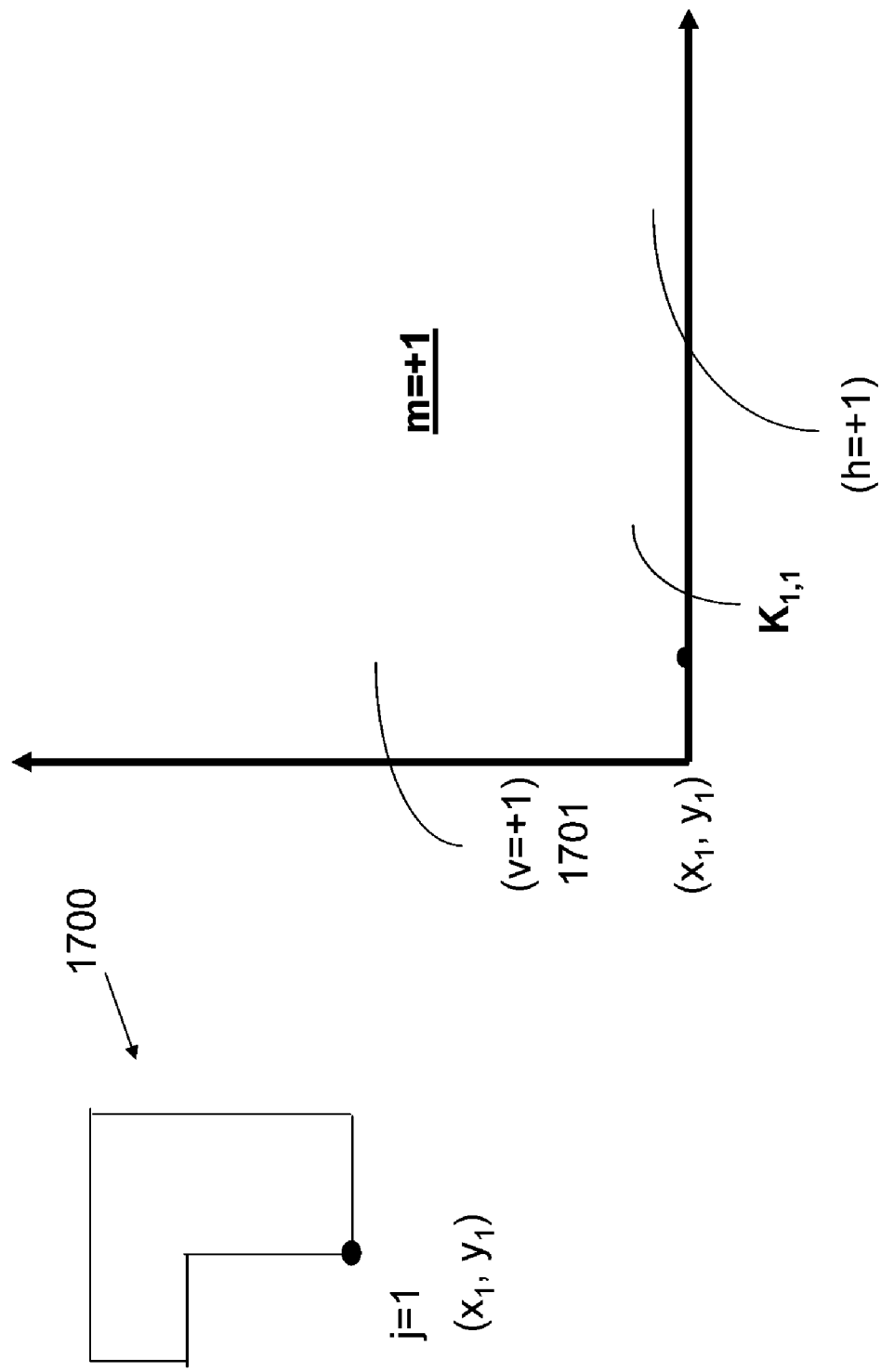
FIGS. 7A through 7G illustrate steps of a method of representing a mask feature in terms of topo-edge polygon elements, in accordance with an embodiment of the invention.

In Block 601 of an embodiment of the method of FIG. 6 for representing a polygon, the indices m, h, v and j are initialized, where m, h and v are the signs related to the topo-edged elements described above, and j refers to the jth corner of the polygon to be represented by topo-edged elements. Referring to FIG. 7A, starting from the first j=1 lowest left corner $(x_1,y_1)$ of polygon 1700, we determine the topo-edge polygon element required for that corner based on reticle layout properties (e.g., clear/dark field, pattern polarity). In this example, we begin with inner plane sign m=+1, horizontal edge sign h=+1 and vertical edge 1701 has sign v=+1, and thus corner $(x_1,y_1)$ gets tagged a value Tag(j)=$mK_{mh,mv}(x_j, y_j)$=$K_{1,1}(x_1, y_1)$.

Figure 7B:
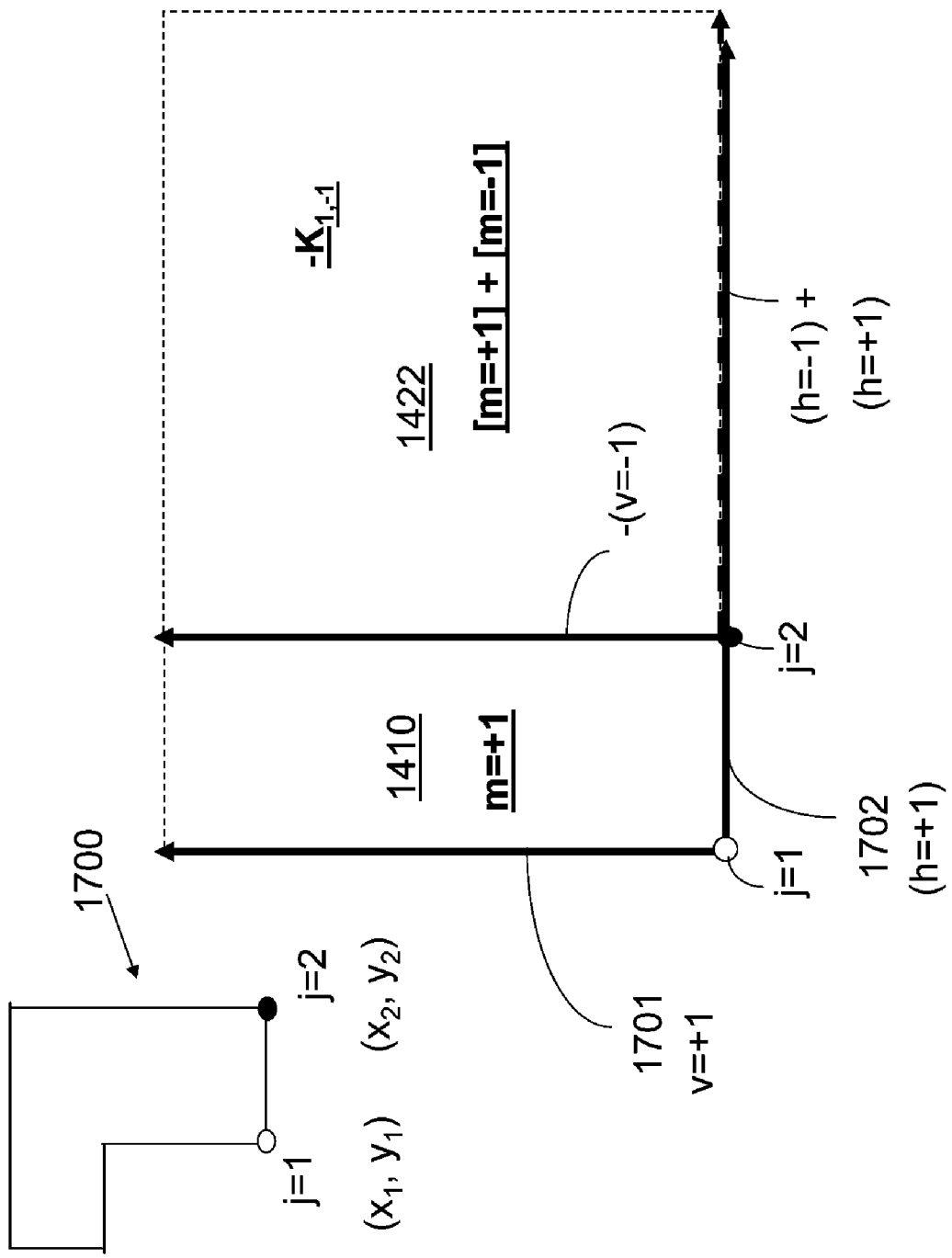

Next (Block 602), move to the next corner j=j+1 in a counter clockwise manner, hence j=2, as illustrated in FIG. 7B. The sign of the interior of the next topo-edged element is changed, so that m=−m (Block 603). If the interior 1410 of the quarter plane of the topo-edge element from last corner was m positive, then the next one will be m negative. Thus, in the example of corner j=2, m=−1.

Next (Block 604), check the sign m of the interior 1410. If the sign m of the interior 1410 is positive (m=+1), the sign v of the vertical isotropic edge 1412 is reversed from the sign v of the vertical isotropic edge on the previous corner. The sign h of the horizontal isotropic edge 1411 is positive or negative depending on whether the next corner's x-coordinate is larger or smaller than the x-coordinate of the current corner, respectively. Similarly, for a negative inner quarter plane (m=−1), the sign h of the horizontal isotropic edge 1411 is reversed from the sign h of the horizontal isotropic edge on the previous corner. The sign v of the vertical isotropic edge 1412 is positive (v=+1) if the next corner's y-coordinate is larger than the y-coordinate of the current corner. Otherwise, if the next corner's y-coordinate is the same or less than the current corner's y-coordinate, then v=−1. For the corner j=2 in the example of FIG. 7B, m=−1, so h=−h=−1. However, y3>y2 (note that y2=y1), so v=+1. Therefore, corner j=2 $(x_2,y_2)$ gets tagged a value Tag(j+1)=$mK_{mh,mv}(x_{j+1}, y_{j+1})$=$-K_{1,-1}(x_2, y_2)$. Note that to the right of the second corner j=2, the background region 1422 is canceled, and the horizontal edge field from the j=1 topo-edged element is canceled by the horizontal edge field from the j=2 topo-edged element, while leaving horizontal segment 1702. The vertical edge of the j=2 topo-edged element has a positive sign, since v=−1 and m=−1 (Block 605B).

Then the loop is iterated (607) through all corners of the polygon. The same tags can continue to be used in later iterations of OPC.

Figure 7C:
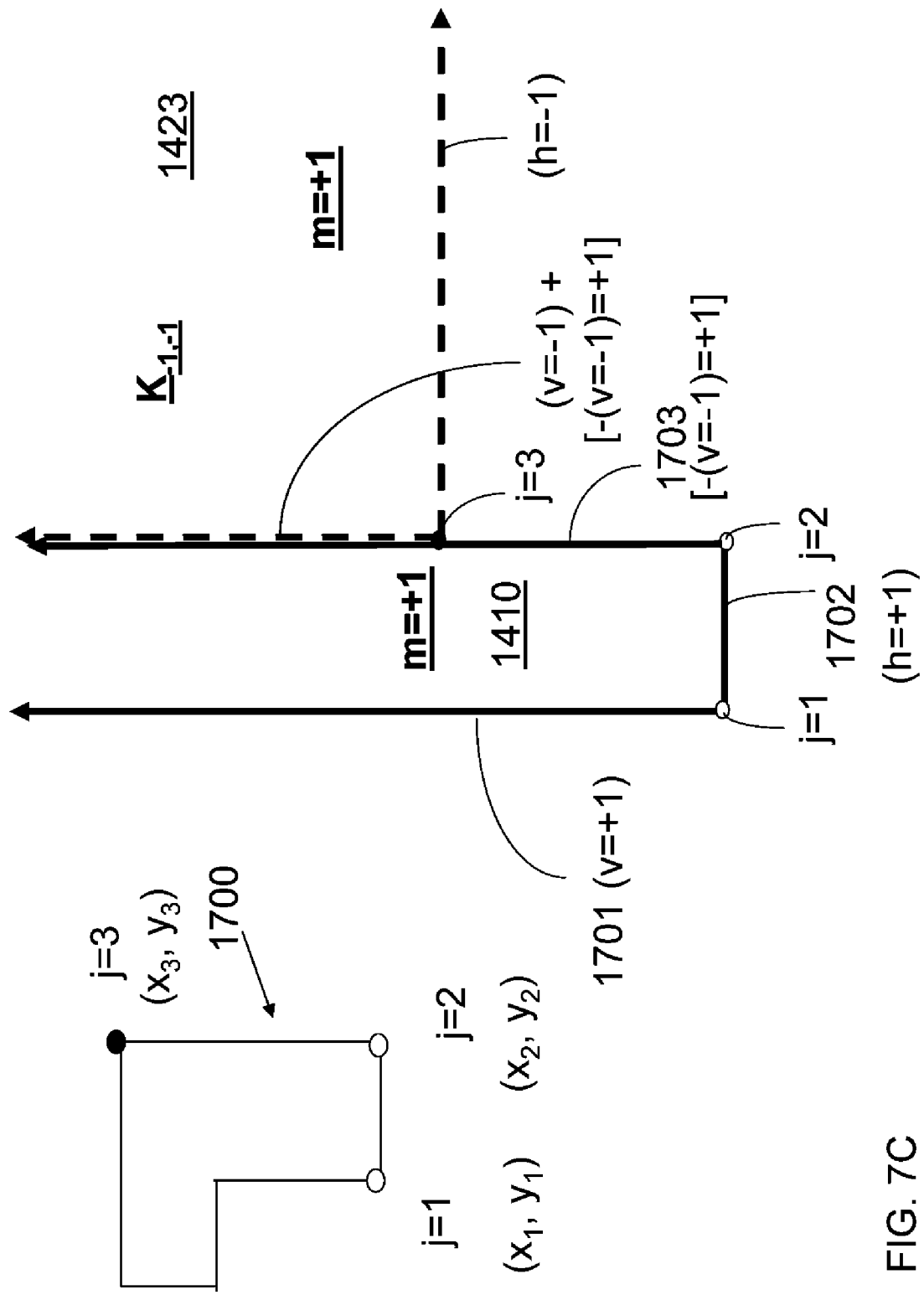
Figure 7D:
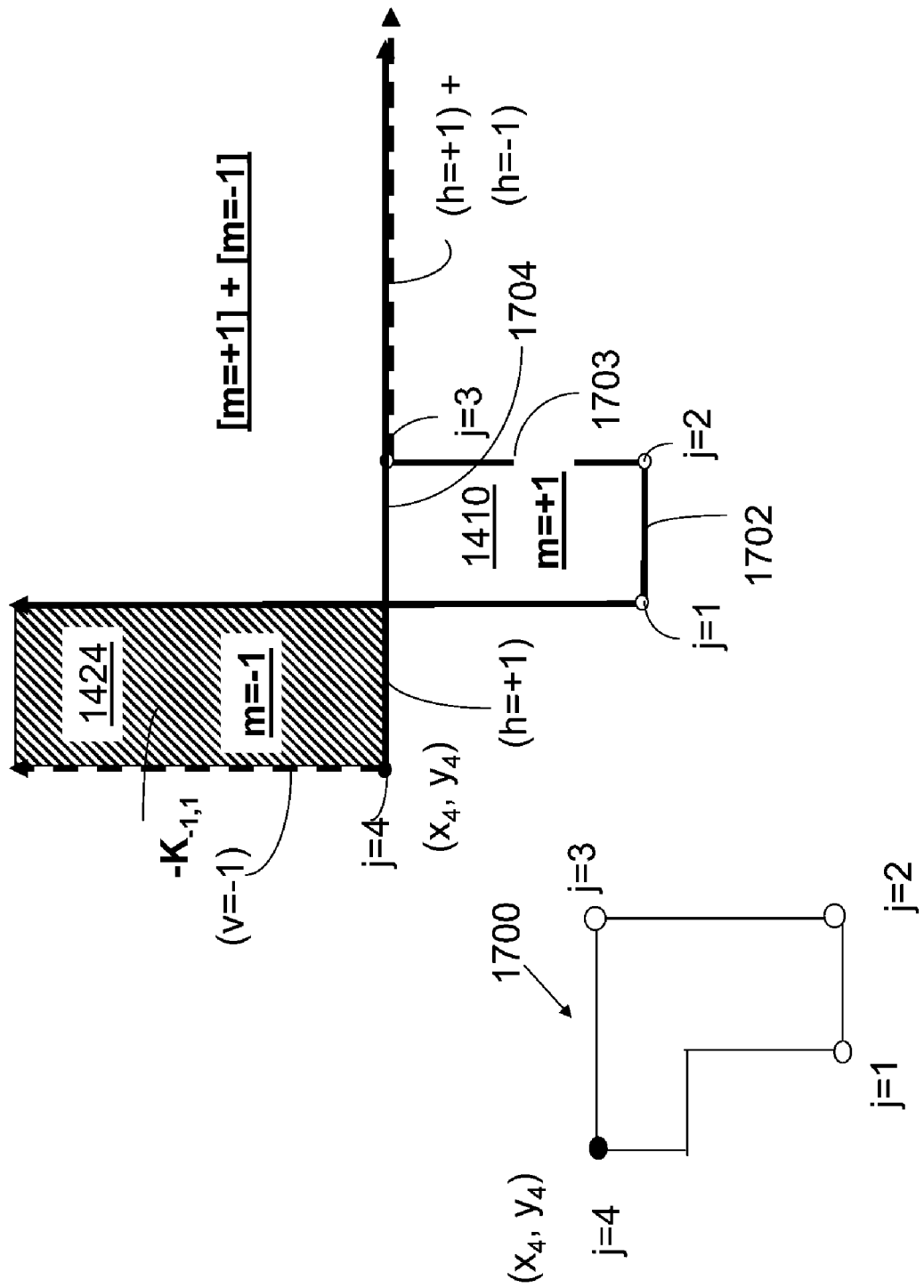
Figure 7E:
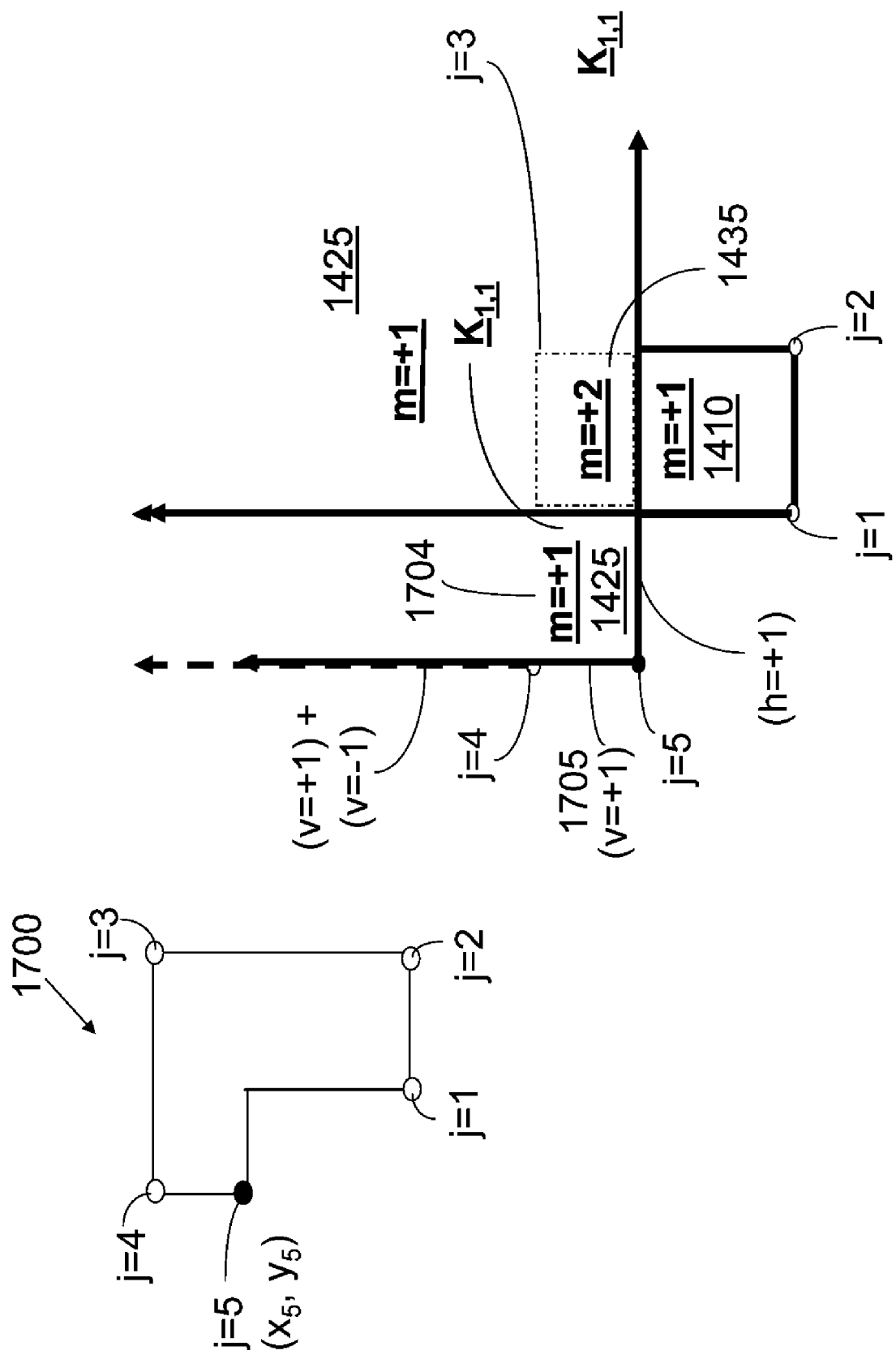
Figure 7F:
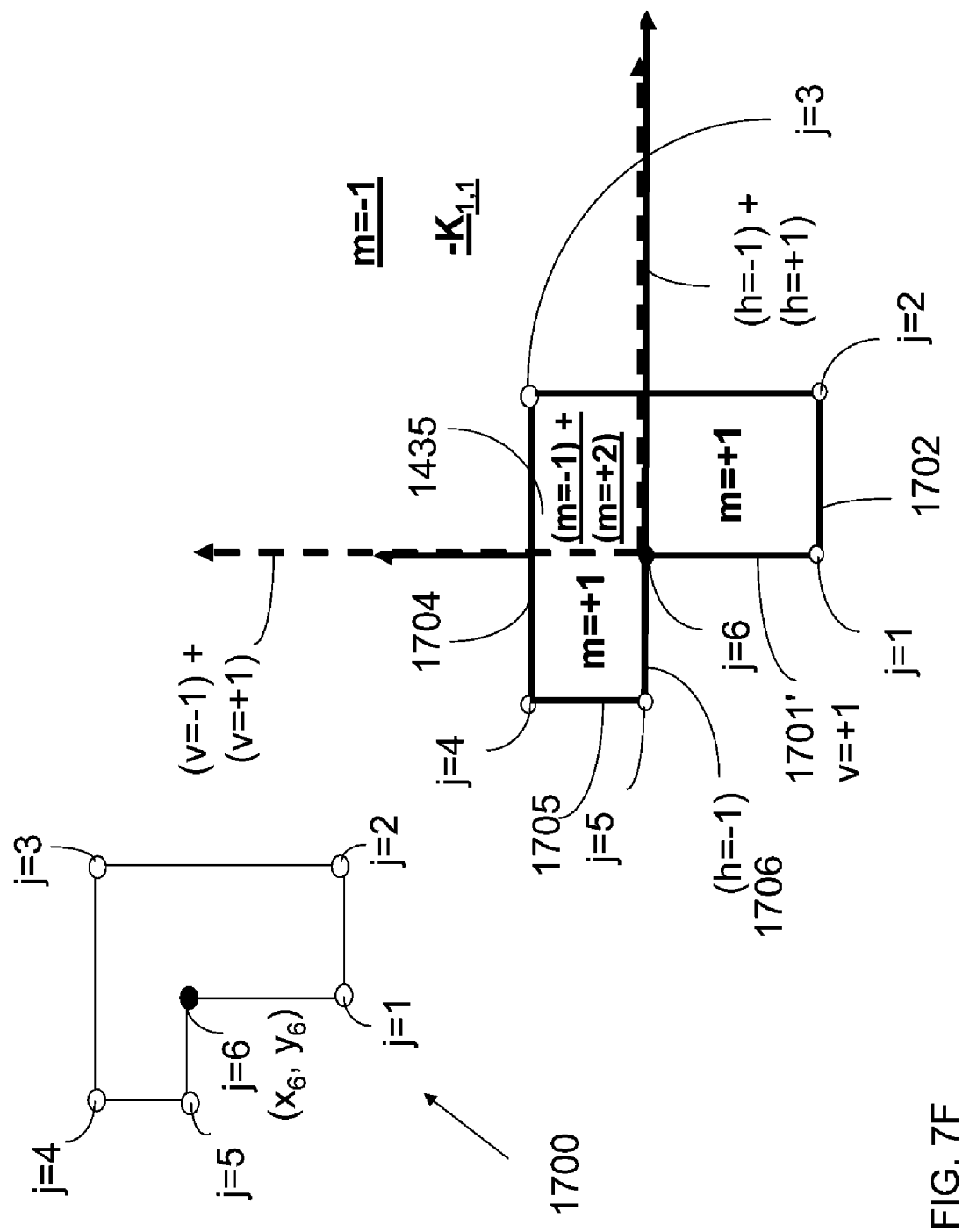

Continuing the example, with reference to FIG. 7C, for the next corner (Block 602) j=3 $(x_3,y_3)$, the inner plane sign m is reversed from the previous sign (which was m=−1), so m=+1 (Block 603). If m=+1, then the sign of the tag v is reversed from the sign of the previous edge (Block 605A), so v=−1. If the x-coordinate x(j+1) of the next corner (j+1), i.e., j=4, is larger than the x-coordinate x(j), i.e. j=3, of the current corner, then h=+1, otherwise, h'–1 (Block 605A). Therefore, h=–1 in this example (Block 605A). The portion of the vertical edge of the j=3 topo-edged element $K_{-1,-1}$ that is above the third corner j=3 exactly cancels out the edge of the second corner j=2 topo-edged element, leaving edge segment 1703. The field region 1423 from the j=3 topo-edged element $K_{-1,-1}$, has a sign m=+1.

Continuing the example to the fourth corner j=4 (Block 602), m=–1 (Block 603). Referring to Block 605B, if m=–1, then h is given the reverse of the sign of the horizontal edge of the previous topo-edged element $K_{-1,-1}$. If the y-coordinate of the next corner (j+1) is greater than the y-coordinate of the current corner j, then v=+1, otherwise, v=–1 (Block 650B). In this example, the previous element is j=3, which had a horizontal sign h=–1, so h=+1 (Block 605B). Since y(j+1)=y4 is not greater than y3, then v=–1 (Block 605B). Thus the j=4 topo-edged element is $-K_{-1,1}$. Note that the horizontal edge of the j=4 topo-edged element cancels the portion of the horizontal edge of the j=3 topo-edged element to the right of the j=3 corner, leaving the line segment 1704 between the third corner j=3 and the fourth corner j=4. The m=+1 field regions above corner j=4 and to the right of corner j=1 are canceled by the field m=–1 of the j=4 topo-edged element $-K_{-1,1}$, leaving a field region 1424 having m=–1.

Continuing to the fifth corner j=5 (Block 602), m=+1 (Block 603), so the vertical edge of the j=5 topo-element is v=+1 (Block 605A), and the horizontal edge has sign h=+1, since the x(j=6) corner is greater than the x-coordinate of the current corner j=5 (Block 605A). The prior m=–1 field region 1424 is canceled, leaving m=+1 field regions 1425, and a field region 1435 having a field value of a positive m=+1 background added to a positive background of m=+1, so the resulting transmission value will be 2T in the field region 1435. The vertical edge above the fourth corner j=4 is canceled, leaving edge segment 1705.

Figure 7G:
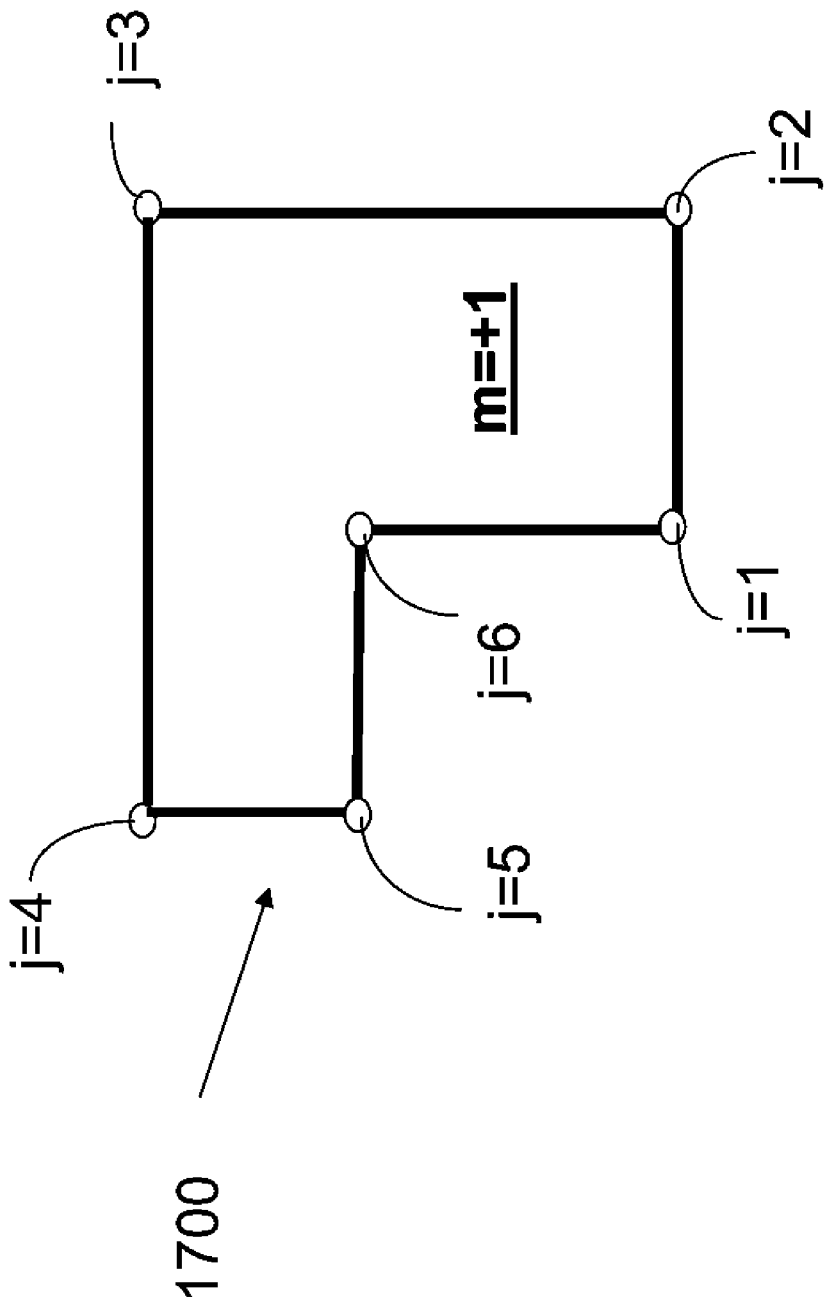

Next, at the sixth corner j=6 (Block 602), m=–1 (Block 603), and h=–1 (Block 605B). Since the y-coordinate of the next corner (j=1) is not greater than the y-coordinate of the current j=6 corner, the vertical edge of the sixth j=6 topo-edged element has a sign of v=–1 (Block 605B). The background field is canceled in the region 1425 (FIG. 7E), however, only a portion of the background is canceled in the region 1435, leaving the region 1435 having a transmission value of +T. The horizontal edge to the right of the corner j=6 is canceled, leaving the edge segment 1706. The vertical edge above the corner j=6 is canceled, leaving the edge segment 1701'. The resulting polygon 1700 is illustrated in FIG. 7G.

This new approach for incorporating EMF effects into the layout polygon decomposition through the use of the new topo-edge polygon elements requires only one table assignment per polygon corner.

In addition, the SOCS contribution of both the edge fields and the polygon interior are obtained after only a single random access lookup for each corner, instead of separate lookups for each corner and edge. It is thus much faster than the random access lookup from multiple large tables that is required when the edge field contributions are stored as separate tables for boundary features or edges. Moreover, based on the method described in FIG. 6, the isofield case overhead from assigning the appropriate tables is negligible.

Summarizing a preferred embodiment of the SOCS procedure according to the invention, the convolution of each of the four cases of topo-edge polygon elements identified in FIG. 5 with each of the kernels of the truncated SOCS decomposition is pre-stored onto lookup tables. These pre-stored convolutions merge the quarter-planes of TMA mask transmission and the electromagnetic edge perturbation due to the finite topography in additive and subtractive combinations. For each of the SOCS kernels, the contribution to the aerial image due to the entire polygon is calculated by summing the appropriate convolution table entries for the topo-edged polygon element assigned to each polygon corner. For each of the SOCS kernels, the contributions from all topo-edge polygon elements are added and the sum is squared. The squared sums for all kernels are added together to form the final aerial image intensity of the original polygon. The new topo-edge polygon element approach enables speeding up the aerial image calculations, as compared to a conventional methods for handling edge fields, by requiring only one table lookup table per each polygon corners per each of the SOCS kernels. Using this key step of merging topographic edge content into corner tables, the inventive method using isofield perturbations can be made just as fast as a bias model, because the isofields are merged into the SOCS tables for quarter-planes, for example as δ-functions. Thus there is no computational penalty from using separate edge fields, or from unpolarized illumination.

The approach of combining the TMA transmission with edge effects in one single SOCS entry, according to an embodiment of the invention, allows a reduction in the number of memory calls required to calculate the aerial image of a collection of polygons and hence speed up the calculation. In addition, the coherent combination of the fields perturbations due to two orthogonally polarized illuminations using customized weights is a novel approach that provides an isoField perturbation representation of the effects of the mask topography and further reduces the number of memory calls and calculations required to form the aerial image under unpolarized illumination.

The embodiment of the invention described above is not restricted to quarter planes of TMA mask transmission or to SOCS decomposition of the imaging system. Any elementary pattern unit shape used to decompose the interior area of a randomly-shaped polygon can be merged with the topographic isofield perturbation according to the invention to form new set of imaging kernels or tables that already include the electromagnetic effects of the mask topography edges. Examples of elementary pattern units can be found in the literature (e.g. "Fast Sparse Aerial Image Calculation for OPC". Nick Cobb and Avideh Zakhor, Proc. SPIE 2621, pp: 534, (1995)). An example of an elementary pattern unit used to decompose a non-manhattan polygon with edges that are not necessarily at 90 degrees of each other is described with reference to FIGS. 8A-8C.

Figure 8A:
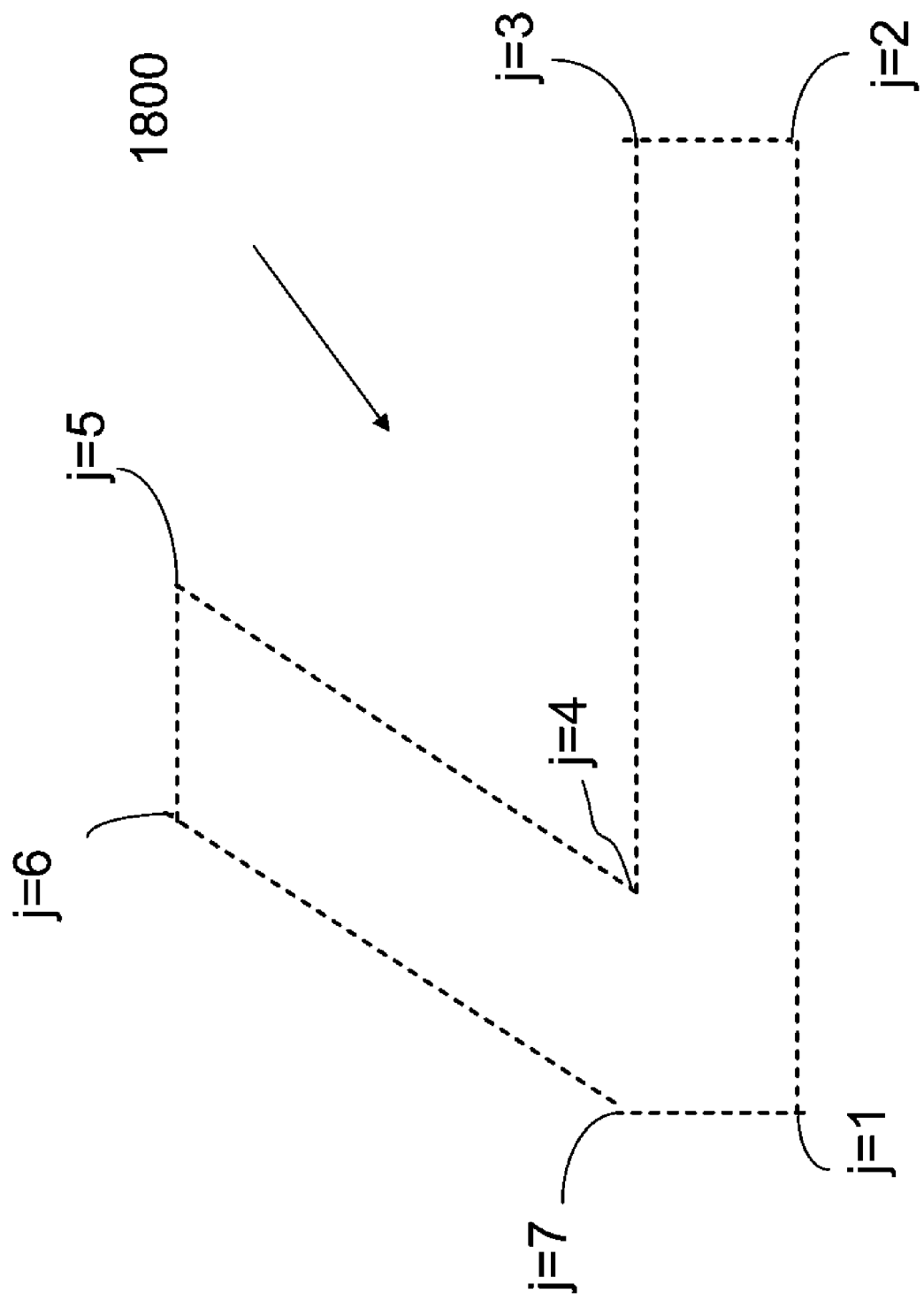
FIGS. 8A through 8D illustrate steps of a method of representing a mask feature in terms of topo-edge polygon elements, in accordance with another embodiment of the invention.
Figure 8B:
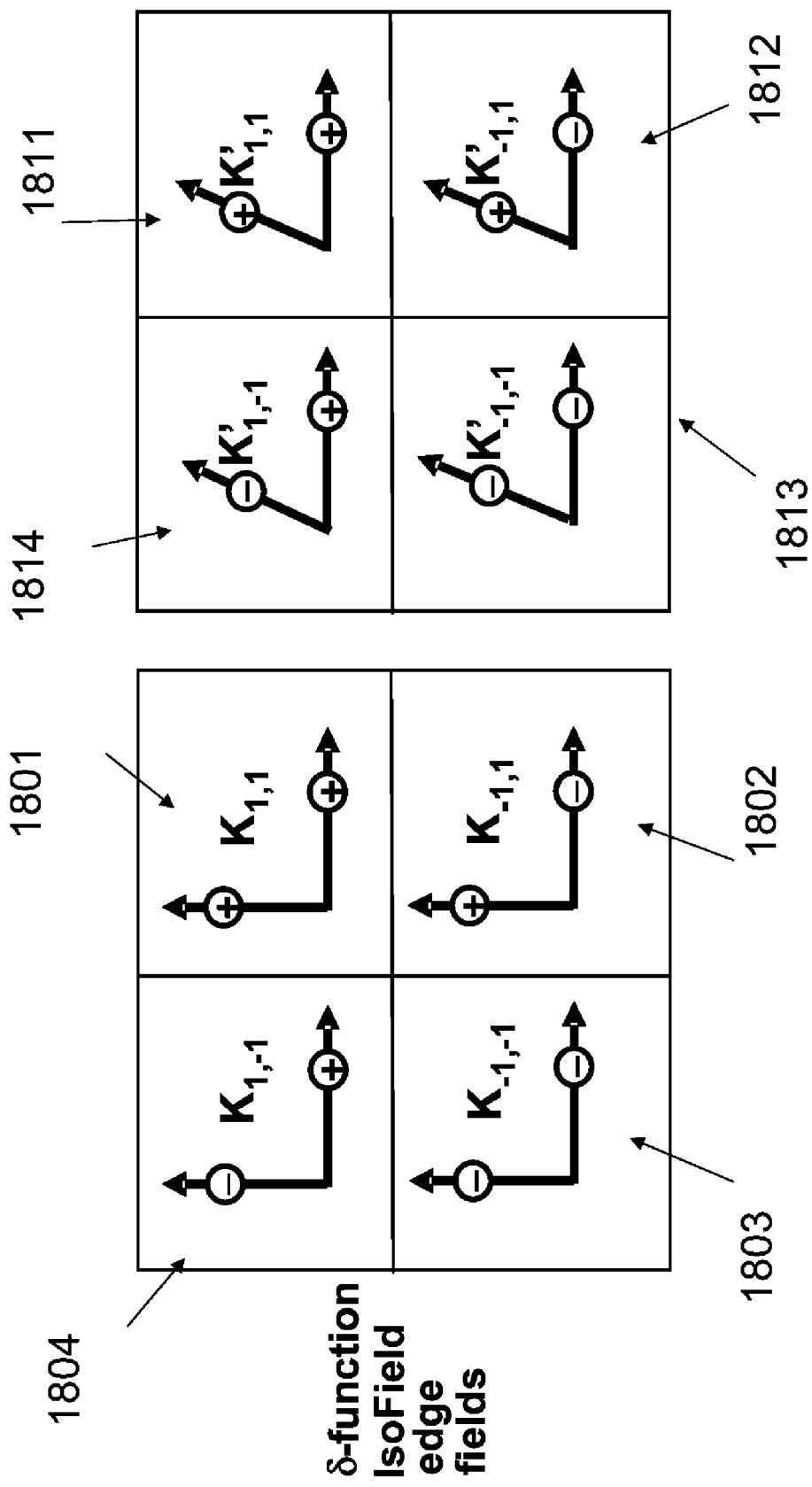

FIG. 8A illustrates a non-manhattan polygon 1800, having corners j=1-7, that may be decomposed using elementary pattern units having edges that form a non-90 degree angle, as illustrated in FIG. 8B. FIG. 8B displays the type of resulting topo-edge elements necessary in order to decompose any arbitrarily shaped polygon with interior and edges (perimeter) that can be at 90 degrees of each other (1801, 1802, 1803, 1804) as well as other non-normal angle (1811, 1812, 1813, 1814) such as shown. These topo-edge elements result from the combination of elementary pattern units used to decompose this type of non-manhattan polygons and the isofield perturbation according to the invention, due to the mask topography. Moreover, a finite list of elementary units may be provided that can handle all possible mask areas with a perimeter having e.g. 45-degree angles.

Figure 8C:
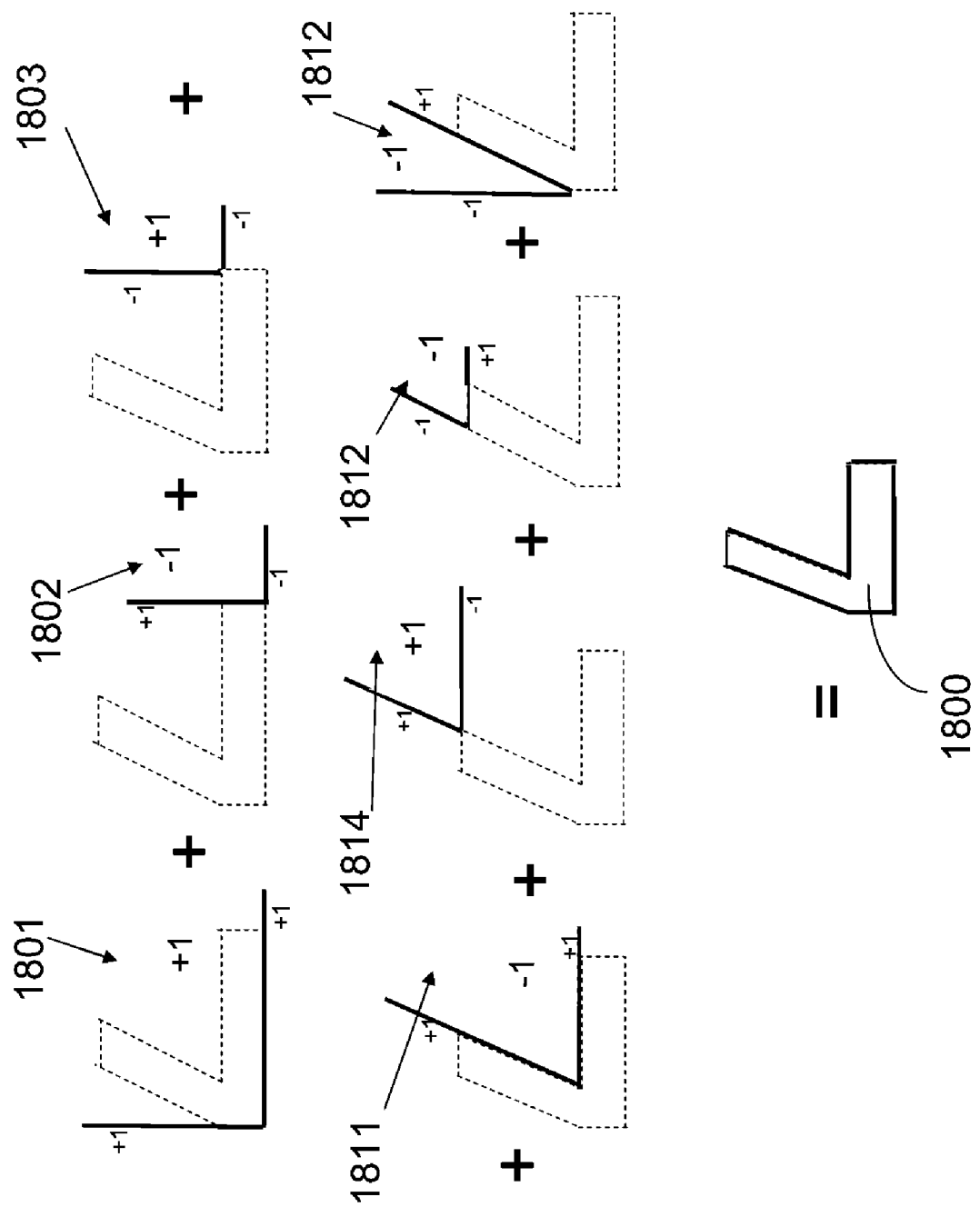

FIG. 8C illustrates an embodiment according to the invention in which such non-manhattan polygon 1800 may be decomposed in elementary topo-edged elements as illustrated in FIG. 8B that incorporate edge topography information. A combination of the 90-degree topo-edged elements 1801, 1802 and 1803 and non-normal angled topo-edged elements 1811, 1814, 1812 and 1812 are applied in sequence as illustrated in FIG. 8C to result in the non-manhattan polygon 1800.

Figure 8D:
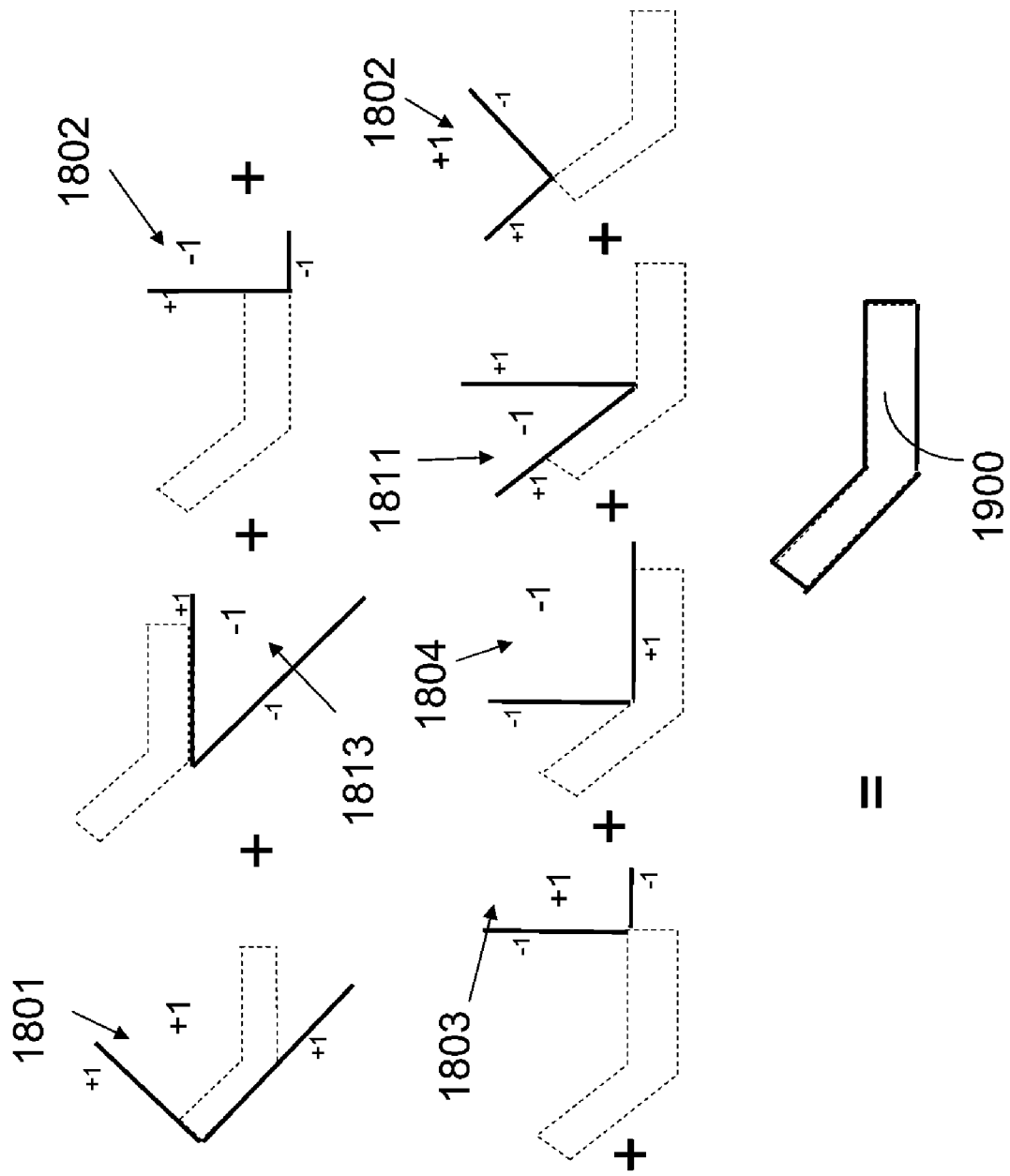

An alternative example for a second non-manhattan polygon 1900 is illustrated in FIG. 8D, in which the topo-edged elements 1801, 1813, 1802, 1803, 1804, 1811 and 1802 are applied in sequence to form the polygon 1900.

Extensions 6.0 Alternative Embodiments and Enhancements

Since the non-TMA fields at the mask feature edges are polarization-dependent, the isofield model according to the present invention makes an approximation when it incorporates the parallel and perpendicular boundary fields perturbations $\Delta M^{\parallel}$ (or more generally, $\Delta EMF(PAR)$) and $\Delta M^{\perp}$ (or more generally, $\Delta EMF(PER)$), relative to the orientation of the illumination polarization, as a weighted average (see Equation 7). To lowest order we can often approximate vector imaging effects on the wafer plane when calculating EMF effects (since these latter only represent non-TMA perturbation terms) and simply give equal weights to each polarization component as indicated in equations (eq. 10a) and (eq. 10b). This constitutes our preferred embodiment of the invention where the an isoField perturbation composed of an equal weights average of each polarization component is applied on all patterns across the layout and for all incident sources or angles. Simulation results have shown good accuracy achievable at NAs of 1.2 or more.

Ray propagation angles are reduced inside the resist film, making polarization effects less strong than in the aerial image. Nonetheless, the assumption that $B_{m,n}^{X-Pol} \approx B_{m,n}^{Y-Pol}$ (or equivalently, $W^{X-Pol} \approx W^{Y-Pol}$, i.e. 50:50 mixed weights) can be inaccurate if large hyper-NA effects are present, due for example to coupling of EMF effects at tight pitches to hyper-NA vector effects in the image, or in cases where the Jones Matrix is severely aberrated. In such cases, large contrast differences between $B_{m,n}^{X-Pol}$ and $B_{m,n}^{Y-Pol}$ may be present, even at the reduced propagation angles inside resist. The basic embodiment of the method with isofield perturbation according to the invention does include these $B_{m,n}^{X-Pol}$, $B_{m,n}^{Y-Pol}$ contrast differences, but only in the TMA terms.

An accuracy verification procedure can be used prior to the construction of the isoField perturbation model with the additional purpose of measuring the accuracy of the preferred equal-weights embodiment against pre-defined tolerances. For instance, a set of layout structures representative of integrated circuit patterns can be employed for the verification of the accuracy requirements of our preferred embodiment. The equal-weights isoField perturbation can be applied to the set of representative patterns to simulate the aerial image produced at the wafer plane. A measure of a representative aerial image parameter such as the maximum intensity or the image width at a pre-defined intensity threshold on the aerial image produced by the equal-weights isoField perturbation can be compared to that produced by an exact or relatively more rigorous electromagnetic solver such as the regular DDM or regular BL models. If the difference on the aerial image parameter remains below a pre-defined threshold for each representative pattern, then the preferred equal-weights isoField embodiment can be applied to the entire layout. If the difference on the aerial image parameter crosses the pre-defined threshold for some of the representative pattern, then more advanced weighted-average algorithms may be used to estimate the isofield perturbation according to the invention and obtain more accurate pattern-dependent or illumination-dependent $W^{Y-Pol}/W^{X-Pol}$ ratios as described below. This enhances overall accuracy with much less than 2× runtime penalty. To calibrate the Y-Pol/X-Pol ratio appropriately, the weights can, for example, be calculated as the ratio of the X-Pol and Y-Pol transmissions of the film stack. Other options include assigning the $W^{Y-Pol}/W^{X-Pol}$ ratio based on a regression model that uses image parameters (such as Imin, Imax) as inputs, or choosing weights based on pattern type (pattern rec.), or both. All of these methods provide a tuned weighting with enhanced accuracy.

In one embodiment of the isoField calibration procedure according to the invention, different weighting algorithms may be used on individual mask feature groups, grouped according to feature type and characteristics (such as, for example, ranges of edge to edge separation), to compute the isofield perturbation for the majority of features in the mask. In another embodiment, for some extreme-case features identified by a verification step, as known in the art, as patterns where the isofield approximation may not be sufficiently accurate, the edge fields may be determined using a more rigorous method, such as the regular DDM or BL, and as long as this is only resorted to infrequently, the runtime penalty will be small.

Figure 9A:
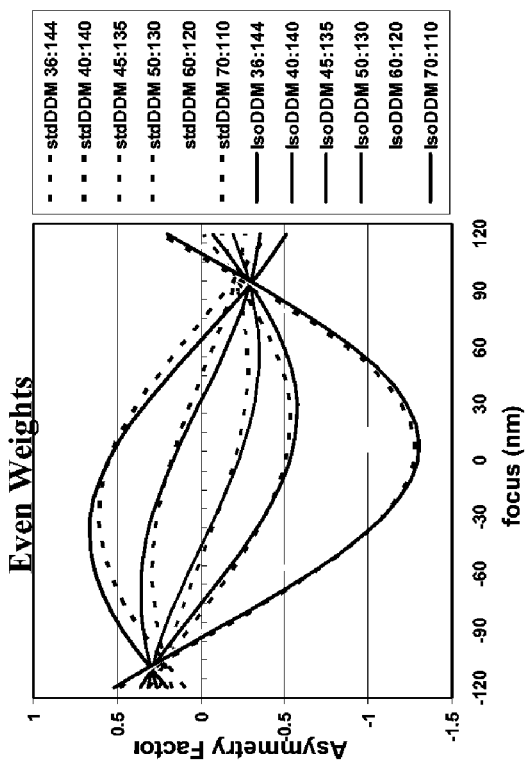
FIGS. 9A and 9B illustrate plots illustrating a comparison of asymmetry factors or parameters for different embodiments according to the invention.
Figure 9B:
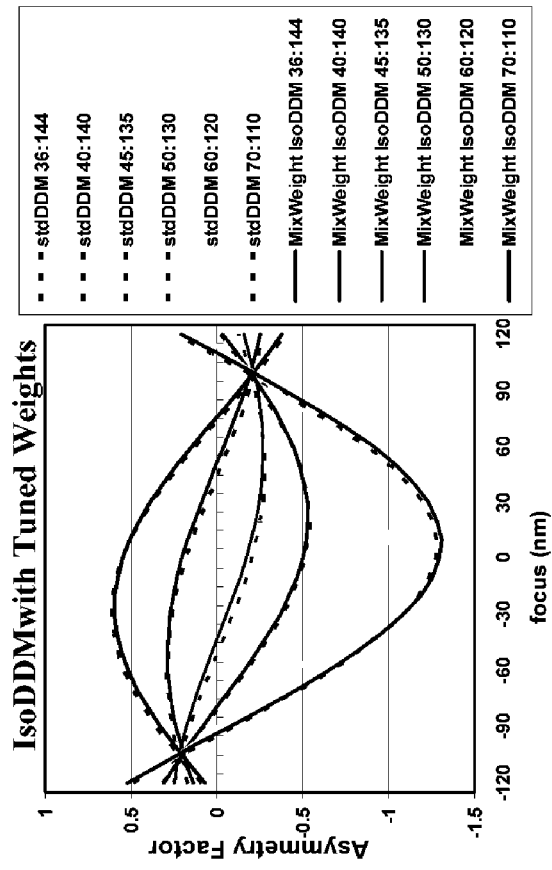

In one embodiment in accordance with the invention, an aerial image figure of merit, referred to as an "asymmetry parameter," or "asymmetry factor," may be used to evaluate the sensitivity of the aerial image on the wafer plane to mask topography effects. FIGS. 9a and 9b plot an asymmetry parameter (along the vertical axis) as a function of focal plane (along the horizontal axis) for gratings having different line width:space ratios. The "asymmetry parameter" refers to a focus-dependent asymmetry that perturbations like EMF will produce in a nominally two-beam interference image. Specifically, the asymmetry parameter is the intensity difference that arises between adjacent peaks in the nominally sinusoidal fringe pattern (a pure harmonic when the asymmetry parameter is zero), normalized by the DC intensity level (i.e. the average intensity in the image). For more details on this metric, refer to "Critical impact of EMF effects on RET and OPC performance for 45 nm and beyond." J. Tirapu-Azpiroz et. al. Journal Science Vacuum Technology B, Vol. 25, pp:164 (2007).

In this example, the asymmetry parameter is a measure of the asymmetry between adjacent peaks in the nominally two-beam interference image that is formed by line and space gratings on an attenuated PSM mask. FIG. 9a illustrates the asymmetry parameters when using the isofield perturbation with 50:50 or even mixing weights (solid lines) compared to the asymmetry parameters when using a rigorous DDM model (dashed lines). An average root mean squared error of about 17% relative to the standard DDM was observed on the smallest space sizes of 50 nm (wafer dimensions) and below. FIG. 9b provides a comparable plots of asymmetry parameters where the isofield perturbation is computed using tuned weights of the ratio $W^{Y-Pol}/W^{X-Pol}$, which produces a root mean squared error of about 5%. The pattern dependent weighting scheme in this example is as follows:

36 space:144 line→>66.7:33.3 (Y-Pol:X-Pol)
40 space:140 line→61.5:38.5 (Y-Pol:X-Pol)
45 space:135 line→66.7:33.3 (Y-Pol:X-Pol)
50 space:130 line→63:37 (Y-Pol:X-Pol)

This illustrates that it is possible to obtain a closer match to the more rigorous DDM model using mixed weights according to the invention, when the accuracy of the using even weights is insufficient, based on a predetermined accuracy criterion. The accuracy tolerances can be defined as the maximum error between the standard DDM or BL models and the Isofield model across focus and set as a metric to define when the isofield model weights calibration has converged to a solution. Such weighting assignments can be made using, when known, the explicit form of equation (6), or alternatively using fitted polynomials, and/or feature-based selection, where the weighting coefficients become a function of various parameters (e.g. film-stack transmission, illumination incident angle, feature type and characteristics . . . etc) and where the Isofield perturbation is no longer a uniformly balanced (50:50) mixing of the corresponding $\Delta$EMF(PER) and $\Delta$EMF(PAR) edge fields. The mixing weight ratio, $W^{Y-Pol}/W^{X-Pol}$, is instead calibrated relative to a more rigorous model such as DDM or BL in order to produce an accurate averaging in the basic equation (5), adding for instance the dependency on the illuminating angle (i) as well as a dependency on the feature type (f), resulting in equation (12). Equation (12) is expressed for simplicity in terms of one-dimensional lines and spaces are assumed parallel to the y-axis:

$$\Delta I^{UnPol} = \frac{1}{2} \sum_i \sum_f \sum_m \sum_n \{ [B_{m,n}^{X-Pol}(i,f) \cdot \Delta M_n^{\perp} + B_{m,n}^{Y-Pol}(i,f) \cdot \Delta M_n^{\|}] \cdot M_m^{TMA^*} + \ldots \ldots + [B_{m,n}^{X-Pol^*}(i,f) \cdot \Delta M_m^{\perp^*} + B_{m,n}^{Y-Pol^*}(i,f) \cdot \Delta M_m^{\|^*}] \cdot M_n^{TMA} \} \quad \text{(eq. 12)}$$

where the index i represents the i-th incident wave with different incident angle and f represents a feature with index f. Dependencies on other parameters could be added in a similar manner.

Equation (12) can be expressed in a similar way to Equation (8) as follows:

$$\Delta I^{UnPol} = \frac{1}{4} \sum_{i,f} \sum_{m,n} \begin{Bmatrix} [B_{m,n}^{X-Pol}(i,f) M_m^{TMA^*} + \\ B_{m,n}^{Y-Pol}(i,f) M_m^{TMA^*}] Iso\Delta M_n(i,f) + \ldots \ldots + \\ [B_{m,n}^{X-Pol}(i,f) M_n^{TMA} + \\ B_{m,n}^{Y-Pol}(i,f) M_n^{TMA}] Iso\Delta M_m^*(i,f) \end{Bmatrix} \quad \text{(eq. 12.a)}$$

where the isofield of equation (7) can be now expressed as a function of the additional parameters:

$$Iso\Delta M(i,f) = W^{X-Pol}(i,f) \Delta M^{\perp} + W^{Y-Pol}(i,f) \Delta M^{\|} \quad \text{(eq.12.b)}$$

and the mixing weights are now expressed as follows

Mixing $Weights^\mu(i,f) =$ (eq. 12.c)

$$W^\mu(i,f) = = \frac{2\langle |B_{m,n}^\mu(i,f) \cdot M_m^{TMA^*}| \rangle_{s,m,n}}{\langle |B_{m,n}^{\|}(i,f) \cdot M_m^{TMA^*}| \rangle_{i,f,m,n} + \langle |B_{m,n}^{\perp}(i,f) \cdot M_m^{TMA^*}| \rangle_{i,f,m,n}}$$

where $\mu=\|$ or $\perp$, where for a Y-direction edge, $\mu=\|$ is X-Pol, and $\mu=\perp$ is Y-Pol.

For faster calculation of the optimum weights $W^{Y-Pol}/W^{X-Pol}$ ratio, a polynomial fit to Equation (eq. 12.c) can be carried out where the polynomial representing mixing weights contains several terms, each of them multiplied by a coefficient, common for all patterns on the chip, that needs to be determined through a calibration step. In one embodiment, the terms of this mixing weights polynomial can be based on aerial image parameters, such as the aerial image maximum intensity (Imax), the aerial image minimum intensity (Imin), the slope of the image at a certain intensity threshold height (slope) or combinations of the above or other image parameters. In a second embodiment, the terms of this mixing weights polynomial can be based on geometrical pattern parameters, such as the pattern pitch (Pitch), the pattern linewidth (Linewidth), the pattern aspect ratio (aspect ratio) or combinations of the above or other geometric parameters.

The mixing weights polynomial can be calibrated using a set of representative images that are characteristic of the integrated circuit patterns being OPC'd. Alternatively or additionally, the images used in the fitting of the mixing weights polynomial may be those of a generic suite of lithographic targets, of the kind routinely used in process modeling. Similarly, the fitted mixing weights polynomial may be of the same form as the resist model polynomials which are routinely used in process models to provide adjustments to the intensity threshold at which features print. This fitted mixing weights polynomial can then be evaluated at every feature edge during a single pre-OPC iteration in which the mixing weights per pattern are determined. Since EMF effects are only a perturbation on the full image it is reasonable to use the initially assigned $W^{Y-Pol}/W^{X-Pol}$ ratio in every subsequent image iteration. Only a small number of different ratios might be allowed, such as four different ratios. The output of the mixing weights polynomial is then rounded to the nearest one of these allowed ratios. Separate SOCS tables may be stored, involving all possible combinations of these allowed edge fields.

Alternatively, a rules-based approach to determine the most optimum weights $W^{Y-Pol}/W^{X-Pol}$ ratio can be used, where a few bins of pattern types are formed (based for instance on geometrical characteristics such as the pitch range), with each group or bin $\beta$ uses the same ratio of weights $\lfloor W^{Y-Pol}/W^{X-Pol} \rfloor_\beta$.

We now summarize in outline form three embodiments of calibration approaches for assigning the ratio between $W^{Y-Pol}$ and $W^{X-Pol}$ weights of the Isofield model when accuracy beyond that attainable with a simple 50:50 weighting is desired. In a preferred embodiment, the calibration is performed by comparison to a set of reference images computed using full DDM, full BL or a more rigorous EMF solver.

A: Use an aerial image parameters polynomial-based algorithm. In the aerial image parameter polynomial-based procedure, a set of calibration optimum weights ratios are determined for a set of representative calibration patterns by, for example, using prior art EMF models or more rigorous EMF solvers. The calibration optimum weights ratios are then used to calibrate the coefficients of a mixing weights polynomial that uses optical characteristics of the pattern image as variables. The calibrated mixing weights polynomial can then be used to calculate an optimum weights ratio for any feature on the layout.

B: Use a rules-based approach. In the rules-based approach, the calibration pattern is classified into groups having similar geometric characteristics, for example, by using a pattern recognition procedure. A set of calibration optimum weights ratios are determined for each geometrically classified group of features in the calibration pattern, based on a predetermined figure of merit relative to the image of the calibration pattern obtained, for example, by using a rigorous EMF solver. A pattern recognition algorithm may be used to classify the calibration patterns according to sets of geometrical characteristics and associated with a calibration optimum weights ratio computed for the calibration patterns. A pattern recognition algorithm may then be used to classify all features in the actual layout in accordance with the predetermined sets of geometrical characteristics and then assigning an optimum weights ratio to the layout patterns based on the classified optimum weights ratio determined from the calibration patterns.

C: Use geometrical pattern characteristics for polynomial-based calibration algorithm. In the geometrical pattern characteristics polynomial-based procedure, a set of calibration optimum weights ratios are determined for a set of representative calibration patterns by, for example, using prior art EMF models or more rigorous EMF solvers. The set of calibration optimum weights ratios are then used to calibrate the coefficients of a mixing weights polynomial that uses geometrical characteristics of the pattern, extracted through pattern recognition algorithms, as variables. The calibrated mixing weights polynomial can then be used to calculate an optimum weights ratio for any feature on the layout.

For all three calibration embodiments, there are several common calibration steps as described below.

1) A set of representative polygons that are characteristic of the integrated circuit patterns is selected. These are known as calibration patterns.

2) For each of these calibration patterns, the best optimum weights $W^{Y\text{-}Pol}/W^{X\text{-}Pol}$ ratio needs to be determined. Three different methods to estimating each of these optimum ratios is described here. First, a reference aerial image $AI_{ref}$ of each calibration pattern can be calculated using a rigorous electromagnetic solver or using the regular DDM or regular BL models. Then an isoField aerial image $AI_{iso}$ for the same pattern is calculated using the isoField perturbation model with a 50:50 weighting scheme.

3.a) An accuracy verification procedure as described above can be employed based on an image figure of merit such as a measured difference or delta of a representative aerial image parameter (such as, for example, the maximum intensity or the image width at a pre-defined intensity threshold) on the aerial image produced by the equal-weights isoField perturbation as compared to that produced by the rigorous electromagnetic solver or by the regular DDM or regular BL models. If the measured difference or delta of the representative aerial image parameter is larger than a pre-defined tolerance, then the weights ratio scheme of the isoField perturbation model used to produce the isoField aerial image $AI_{iso}$ can be varied until this delta of the aerial image parameter is reduced to below the pre-defined threshold. The resulting mixing weights ratio that produces the minimum delta on the aerial image parameter is then stored as the best estimate for the calibration pattern in evaluation.

3.b) Alternatively, a calculation of the asymmetry factor or parameter across focus as described above, with reference to FIGS. 9A and 9B, can be used as an alternative aerial image figure of merit to determine the optimum weights ratio $W^{Y\text{-}Pol}/W^{X\text{-}Pol}$. For example, an alternative figure of merit using the asymmetry parameter may include a measure of the root mean squared (RMS) error between the asymmetry parameter curve calculated with the rigorous electromagnetic solver or the regular DDM or regular BL models, and the asymmetry parameter curve calculated with the isoField perturbation model. The weights ratio scheme of the isoField perturbation model can then be varied until the above RMS asymmetry parameter error is reduced below a pre-defined threshold. The resulting weights ratio that produces the minimum RMS asymmetry parameter error between the asymmetry factor curves is then stored as the best estimate for the calibration pattern in evaluation.

4) When the optimum weights ratio of all calibration patterns have been calculated and stored, they will be used to calibrate the coefficients of the mixing weights polynomial fit to Equation (eq. 12.c) according to the procedure described below:

4.a) An initial set of values is assigned to each term of the coefficients multiplying the mixing weights polynomial terms, which can use image parameters (such as Imin, Imax) as inputs, or geometrical pattern parameters (such as Pitch, linewidth).

4.b) The resulting mixing weight ratios is calculated for all calibration patterns as produced by the mixing weights polynomial after using the image parameters or pattern geometrical parameters as inputs, and substituting the pre-determined set of coefficients.

4.c) This calculated set of weight ratios is then compared to the set of weight ratios estimated for each calibration pattern according to the procedure described in either 3.a or 3.b above. In one embodiment, the figure of merit (such as, an RMS asymmetry error of this difference averaged for all calibration patterns), is compared against a pre-defined threshold and if the figure of merit exceeds the pre-defined threshold, a regression algorithm could be used to estimate a better set of values for the mixing weights polynomial coefficients.

4.d) Steps 4.b and 4.c are repeated with the new set of coefficients until the minimum figure of merit (e.g. averaged root mean squared error) for all calibration patterns is achieved.

5) The set of coefficients producing the minimum figure of merit for all calibration patterns is stored and will be used in the mixing weights polynomial model to estimate the optimum weight $W^{Y\text{-}Pol}/W^{X\text{-}Pol}$ ratio for all patterns in the integrated circuit, even if not within the set of calibration patterns, using the pattern image parameters or geometrical pattern parameters as inputs to the mixing weights polynomial.

6.1 A: Aerial Image Parameters Polynomial-Based Procedure

Simulate a set of reference images for a set of calibration patterns that are representative of the integrated circuit patterns using full DDM, full BL or optionally a more exact simulation method (using an EMF solver).

For each reference image, estimate the best ratio of $W^{Y\text{-}Pol}/W^{X\text{-}Pol}$ weights to be used to compose the isofield model for that image by minimizing an image figure of merit, such as an asymmetry factor root mean squared error produced by the model image relative to the reference image through focus. Alternatively, any appropriate image figure of merit may be used to estimate the optimal ratio, including, but not limited to, the error in linewidth or CD produced by the model image at a constant threshold value relative to the linewidth produced by the reference image at the same threshold value. Alternatively, the optimal ratio may be estimated by rigorously calculating Iso$\Delta$M of Equation 7 for each of the reference images.

The set of optimal $W^{Y\text{-}Pol}/W^{X\text{-}Pol}$ weight ratios estimated for the list of all calibration patterns can now be used to calibrate a mixing weights polynomial (of the form used in Variable Threshold (VT) process models) that uses optical characteristics of the pattern's aerial image (such as the maximum image intensity Imax, or the minimum image intensity Imin, or the slope of the image intensity just as in standard VT fashion). The calibration is performed by estimating the coefficients multiplying the mixing weights polynomial parameters (Imin, Imax, slope and second order products of the above, etc.) such that the root mean squared error, or other image figure of merit, between the entire set of calibration $W^{Y\text{-}Pol}/W^{X\text{-}Pol}$ ratio values estimated in the previous step and those produced by the polynomial is minimized. The optimal $W^{Y\text{-}Pol}/W^{X\text{-}Pol}$ weights ratio for each polygonal feature in the layout are then calculated by extracting the characteristic image parameters of the feature (Imin, Imax., etc) and substituting them into the polynomial with calibrated coefficients. One may choose to employ a single set of VT parameters per polygon averaged over all (or major) edges. One can optionally use non-OPC'd or OPC'd calibration patterns. Alternatively, separate mixing weights polynomials can be calibrated for each iteration stage of OPC, for improved accuracy during intermediate OPC steps and potentially faster convergence. The resist model can likewise be so calibrated.

These embodiments will typically be employed when extremely high accuracy specs are required. If the fit to the step 1 calibration images does not universally achieve the predefined accuracy specs by means of the weighted isofield model, then a separate classification polynomial of value +/−1 can be assigned to those extreme patterns and used during OPC simulations to indicate the need for full DDM or a more rigorous method (e.g. when the polynomial output is closer to +1 than −1) on difficult patterns.

Initial pre-OPC iteration of the entire layout with TMA will provide the Imin, Imax and other aerial-image-derived input parameters of the polynomial for every pattern on the mask. Since ~10 OPC iterations are typically required, this pre-iteration is acceptable in light of the ~4× speedup that the invention provides in each iteration.

A VT-like model applied to each pattern will provide the optimum $W^{Y\text{-}Pol}/W^{X\text{-}Pol}$ ratio for that pattern.

Different options are available for choosing the OPC adjustments that are made to the reference images. In a simple embodiment the chosen $W^{Y\text{-}Pol}/W^{X\text{-}Pol}$ ratio will be that corresponding to the optical parameters of the fully OPC'd pattern, as obtained in the final OPC iteration. Optionally, one can instead calibrate separate polynomials for each OPC iteration.

6.2 B: Use a (Rules Based) Pattern Recognition Algorithm

Evaluate a set of calibration patterns using a rigorous electromagnetic solver and use it to estimate the optimum $W^{Y\text{-}Pol}/W^{X\text{-}Pol}$ weights ratio values for each pattern. Using a pattern recognition algorithm to extract feature geometrical characteristics of all patterns, from the calibration set and from the layout, one can assign optimum $W^{Y\text{-}Pol}/W^{X\text{-}Pol}$ ratio values to groups of mask layout features based on logical rules involving these geometrical characteristics and the optimum $W^{Y\text{-}Pol}/W^{X\text{-}Pol}$ weights estimated, through the EMF solver, for calibration patterns of similar geometrical characteristics.

6.3 C: Use Geometrical Pattern Characteristics for Polynomial-Based Calibration Algorithm Simulate a set of reference images for a set of calibration patterns that are representative of the integrated circuit patterns using full DDM, full BL or optionally a more exact simulation method (using an EMF solver), to estimate the best ratio of $W^{Y\text{-}Pol}/W^{X\text{-}Pol}$ components for the isofield model per pattern.

The set of optimal $W^{Y\text{-}Pol}/W^{X\text{-}Pol}$ weights estimated for the set of all calibration patterns can now be used to calibrate a polynomial (of the form used in Variable Threshold (VT) process models) that uses pattern geometrical characteristics (i.e. 1D, 2D, pitch, aspect ratio, horizontal vs. vertical, which can be assigned numerical values). The calibration is performed by estimating the coefficients multiplying the polynomial parameters (1D, 2D, pitch, aspect ratio . . . etc) such that the root mean squared error between the entire set of calibration $W^{Y\text{-}Pol}/W^{X\text{-}Pol}$ ratio values estimated in the previous step and those produced by the polynomial is minimized. The optimal $W^{Y\text{-}Pol}/W^{X\text{-}Pol}$ weights ratio for each polygonal feature in the layout are then calculated by extracting the characteristic pattern parameters of the feature (1D, 2D, pitch, aspect ratio, etc.) and substituting them into the polynomial with calibrated coefficients.

If adequate fit to full DDM or to rigorous solver is not universally achieved within predefined specs by means of a weighted isofield perturbation, then a separate set of classification characteristics can be assigned to those extreme patterns and used during OPC simulations to indicate the need for Full DDM on that pattern type.

A pattern recognition algorithm can be used on all mask layouts to extract feature geometrical characteristics.

7.0 Isofield Model with HyperNA Unpolarized Illumination

Both the electromagnetic modeling prior art described above and the isofield model of the present invention have been developed in the context of the so-called Hopkins approximation, namely the approximation that a tilt in illumination merely tilts the output diffracted orders. This approximation simplifies the requirements for electromagnetic simulation and modeling essentially to that of simulating normal incidence illumination. However, recent advances in immersion lithography systems enable numerical apertures of 1.35 and higher, which translate to oblique angles of incidence of 20 to 25 degrees, where the Hopkins approximation starts introducing non-negligible inaccuracies. The prior art modeling approaches can be extended to include correction for these more obliquely incident angles through a hybrid Hopkins-Abbe formulation that requires dividing the source pupil into several subregions or subsections and customizing the electromagnetic correction for one instance of incident angle per region, then performing separate aerial image simulations for each of the source pupil subregions to form the composite aerial image through their superposition. Such Hopkins-Abbe hybrid approaches are necessary to enhance accuracy of Hyper-NA simulations where the effect of having incident illumination at very oblique angles is non-negligible, hence increasing the runtime by a factor equal to the number of regions in which the source is divided. If the illumination is unpolarized, then an additional 2× runtime penalty needs to be applied to each source region, hence significantly increasing the overall runtime.

However, the isofield model according to the present invention can be extended to the case of HyperNA illumination under relatively oblique angles, by deriving a sub-isofield $\Delta\text{Iso}\Delta M_S$ for use in calculating the image projected from each separate source subregion S, thus maintaining the speed advantage of the isofield perturbation over each source subregion according to the invention over the prior art approaches. In one embodiment, where the imaging system comprises a numerical aperture up to 1.35 or greater, the isofield model according to the present invention can be extended to the Hybrid Hopkins-Abbe model (which divides the source pupil into separate subregions of simulation with one instance of incident angle per region), by deriving a sub-isofield $\Delta\text{Iso}\Delta M_S$ for each instance of incident angle, as described in eq. 14 below. Moreover, one single isofield edge perturbation IsoΔM can be derived from the combination of all edge perturbations for all instances of incident angles ΔIsoΔM$_S$.

In accordance with the invention, an extension of the isofield model to approximate the Hopkins-Abbe hybrid approach is proposed where one single isofield edge perturbation can be derived from the combination of all edge perturbations for all instances of incident angles, thus further reducing the runtime impact due to the prior art Hopkins-Abbe hybrid approaches by reducing the number of separate simulations required to just one. This variant of the isofield model described above can be applied in cases where the accuracy of this resulting isofield perturbation is deemed adequate according to previously determined criteria.

8.0 Isofield Model with Non-Manhattan Layouts or Non-XY Polarization

Prior art models at normal incidence decompose unpolarized illumination into two orthogonal components, commonly chosen to be aligned with the orientations that are present in manhattan layouts (referred to as X- and Y-orientations, or horizontal and vertical). This conveniently leads to the decomposition of the edge field perturbation fields into the prior-art parallel, ΔEMF(PAR), and perpendicular ΔEMF (PER) corrections, which for manhattan layouts happen to be oriented along the X- and Y-axis, respectively for horizontal edges, or vice versa for vertical edges.

When simulating unpolarized illumination over non-manhattan layouts, where there could exist a portion of the edges that are oriented at other than along the X-axis or the Y-axis, the prior art EMF modeling (such as in regular DDM or BL models) requires that the incident illumination is decomposed into two orthogonal polarizations, and that the edge field electromagnetic correction must be found for each instance of the incident polarization relative to the edge orientation. Under circumstances when the illumination polarization and the orientation of the layout edges are not necessarily along the same orthogonal axes, such as the X- and Y-axes, then the edge correction may need to be estimated for cases other than when the field is parallel or perpendicular to the edge.

With unpolarized incident illumination, however, the isotropic field formulation of the present invention is still mathematically valid and retains its runtime advantage regardless of the orientation of the two orthogonal components in which the illumination is decomposed. In one embodiment of the present invention, the isotropic field could be composed as the weighted average of the prior-art parallel, ΔEMF(PAR), and perpendicular ΔEMF(PER) corrections as in equation (7), and applied to all edges of the layout regardless of their orientation. In an alternative embodiment, the isofield correction could be similarly composed of the weighted average of the perturbation corrections deduced for each instance of the incident polarization relative to the edge orientation (not necessarily parallel and perpendicular, or X- and Y-oriented).

Even when simulating polarized illumination over non-manhattan layouts, a runtime increase is expected by comparison to the prior-art EMF modeling approaches. Referring to FIG. 10A, source 2000 provides polarized illumination 2001 to a mask or reticle 2002 having a mask feature 2010 having edges that are not aligned with the polarization of the illumination 2001. FIG. 10B illustrates a top down view of mask feature 2010 and a projection 2001' of the polarized electric field, where, or example, the edges of the mask feature 2010 are oriented, for example, at 45 degrees or even at arbitrary orientation angle alpha (α), which is defined as the angle between the direction of propagation of the incident electric field 2001, as projected on the plane of the mask (assumed for simplicity along the X-axis in FIGS. 10A and 10B) and the orientation of the edge of the mask feature 2010. The electromagnetic edge perturbation due to the polarized illumination on this non-manhattan edge 2010 can be expressed as a function of the parallel and perpendicular fields perturbations ΔM$^{\parallel}$ (or more generally, ΔEMF(PAR)) and ΔM$^{\perp}$ (or more generally, ΔEMF(PER)), as measured relative to the edge orientation, using the isofield formulation of equation (7) but where the weights W$^{Y-Pol}$ and W$^{X-Pol}$ are a function of its angular orientation alpha (α) as expressed by eq. 13, that is:

$$\Delta M^{Non-Manhattan\ Edge} = \frac{\cos\alpha}{\cos\alpha + \sin\alpha}\Delta M^{\parallel} + \frac{\sin\alpha}{\cos\alpha + \sin\alpha}\Delta M^{\perp}. \quad (eq.\ 13)$$

Hence, even with polarized illumination (where the 2× runtime penalty due to the need for 2 separate simulations with unpolarized illumination is eliminated), the prior art methods for EMF modeling require additional random access calls to memory (one per sum term of eq. 13) with non-Manhattan edges to properly pull into the CPU the multiple required table entries for arbitrary edge orientations. In other words, when the layout edge orientation is not aligned with the manhattan layouts X- and Y-orientations, then the pre-calculated parallel and perpendicular edge perturbation fields for that edge are not aligned with the X- and Y-axis and, in general not aligned with the incident polarization orientation. In order to produce the proper correction fields for the specific disposition of edge and field orientation, which is generally specified by the angle α, the prior art EMF models will require two or more table calls in order to form the necessary correction fields according to eq. 13, hence reducing the runtime advantage of polarized illumination.

A weighted isofield perturbation term can instead be formed by combining the prior-art parallel and perpendicular correction components according to equation (13) for each case of layout edge having relative orientation α. This weighted isofield correction term can reduce the number of memory access calls required by the prior-art even with polarized illumination, and so provide a speed advantage, i.e. with accuracy substantially equivalent to classical DDM or BL, but with faster execution.

Figure 11:
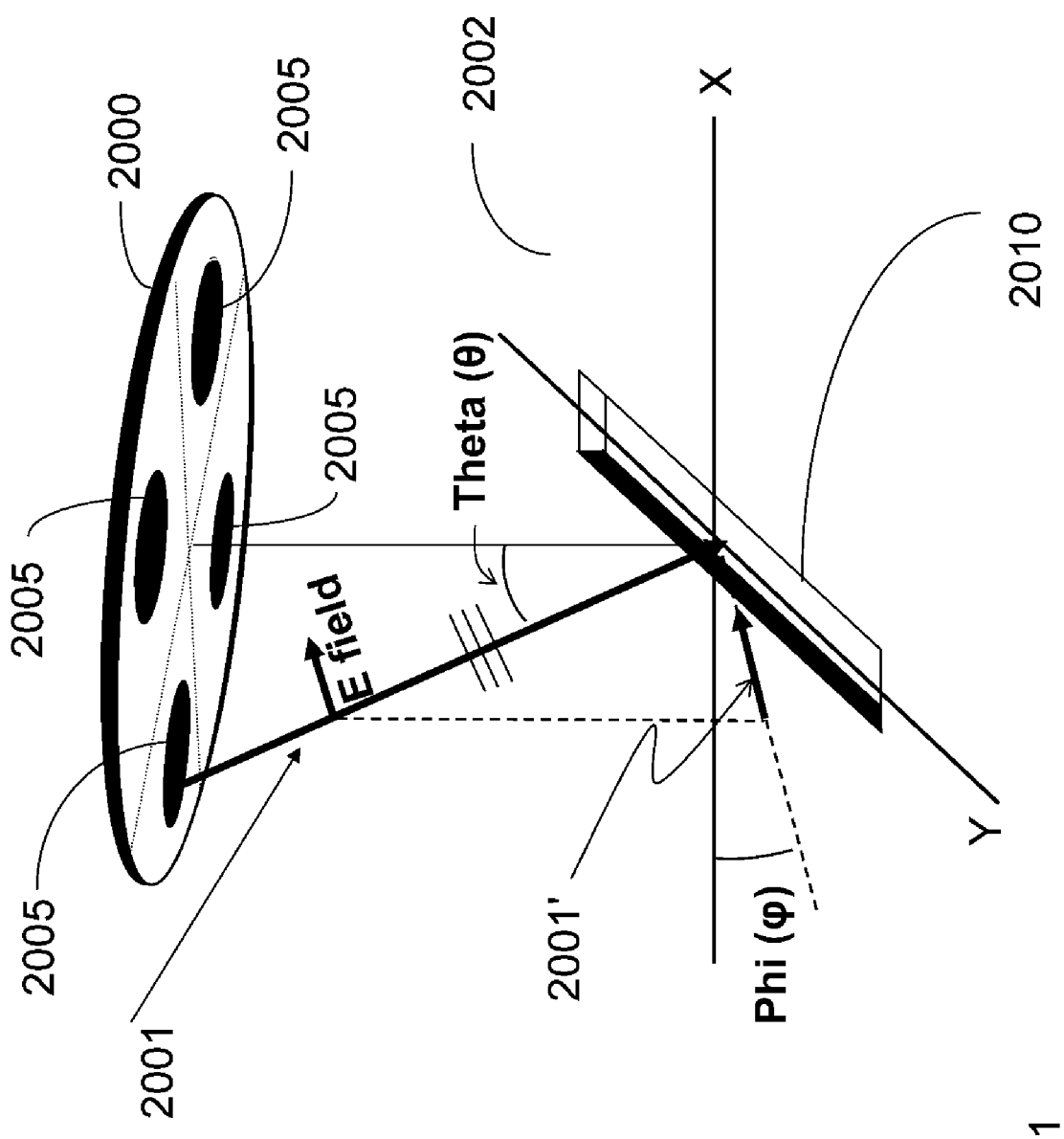
FIG. 11 illustrates a mask feature under off-axis illumination.

A similar situation occurs when modeling incident illumination polarization that does not align with a manhattan layout even when all mask edges are perfectly oriented along X- and Y-axes. FIG. 11 illustrates an example of certain illumination configuration 2000 that produces an incident illumination 2001 with a direction of propagation described by the angle Theta (θ), relative to the normal to the mask plane 2002, and an angle Phi (φ) relative to the X-axis of the illumination projection 2001' on the mask plane 2002. This illumination in consequence produces an electric field polarization on the mask plane that is not aligned with the manhattan mask layout edges. As in the previous case, the prior-art EMF models require that the edge field electromagnetic correction must be found for each instance of the incident polarization relative to the edge orientation. In a similar fashion, the electromagnetic edge perturbation IsoΔM due to illumination polarization that is not oriented parallel or perpendicular to the manhattan edges can also be expressed as a function of the prior-art parallel and perpendicular fields perturbations ΔEMF(PAR) and ΔEMF(PER), as measured relative to the edge orientation, using the isofield formulation of equation (7) but where the weights W$^{Y-Pol}$ and W$^{X-Pol}$ are now a more complicated function of the incident field angular orientation theta (θ) and phi (φ), and the IsoField Perturbation IsoΔM can be expressed as (eq.14):

$$Iso\Delta M^{Non\text{-}XY\ Illumination} = \left(\frac{\cos\varphi}{\cos\varphi + \sin\varphi}\Delta M^{\perp} + \frac{\sin\varphi}{\cos\varphi + \sin\varphi}\Delta M^{\parallel}\right)\cdot\cos\theta \quad (eq.\ 14)$$

where $\Delta M^{\parallel}$ and $\Delta M^{\perp}$ are the edge field perturbation components that are parallel and perpendicular to the incident illumination polarization, respectively.

Equation 14 may be applied to the case of a Hybrid Hopkins-Abbe model in which the source pupil is represented as separate subregions 2005 for the purposes of simulation. Each subregion 2005 may be associated with a single instance of incident angle θ. In one embodiment in accordance with the invention, a sub-isofield $\Delta Iso\Delta M_S$ is derived for each subregion having an incident angle theta, as described in eq. 14. Moreover, one single isofield edge perturbation IsoΔM can be derived from the combination of all edge perturbations for all instances of incident angles $\Delta Iso\Delta M_S$.

Hence a weighted isofield perturbation term formed by combining the prior-art parallel and perpendicular correction components according to equation (14) for each case of incident illumination angle pair (θ,φ) can similarly reduce the number of memory access calls required by the prior-art even with polarized illumination, and so provide a speed advantage, i.e. equivalent accuracy to classical DDM or BL, but with faster execution.

The runtime advantage is achieved in the above approaches, however, at the expense of requirements for separate SOCS tables for each angular configuration.

Figure 12:
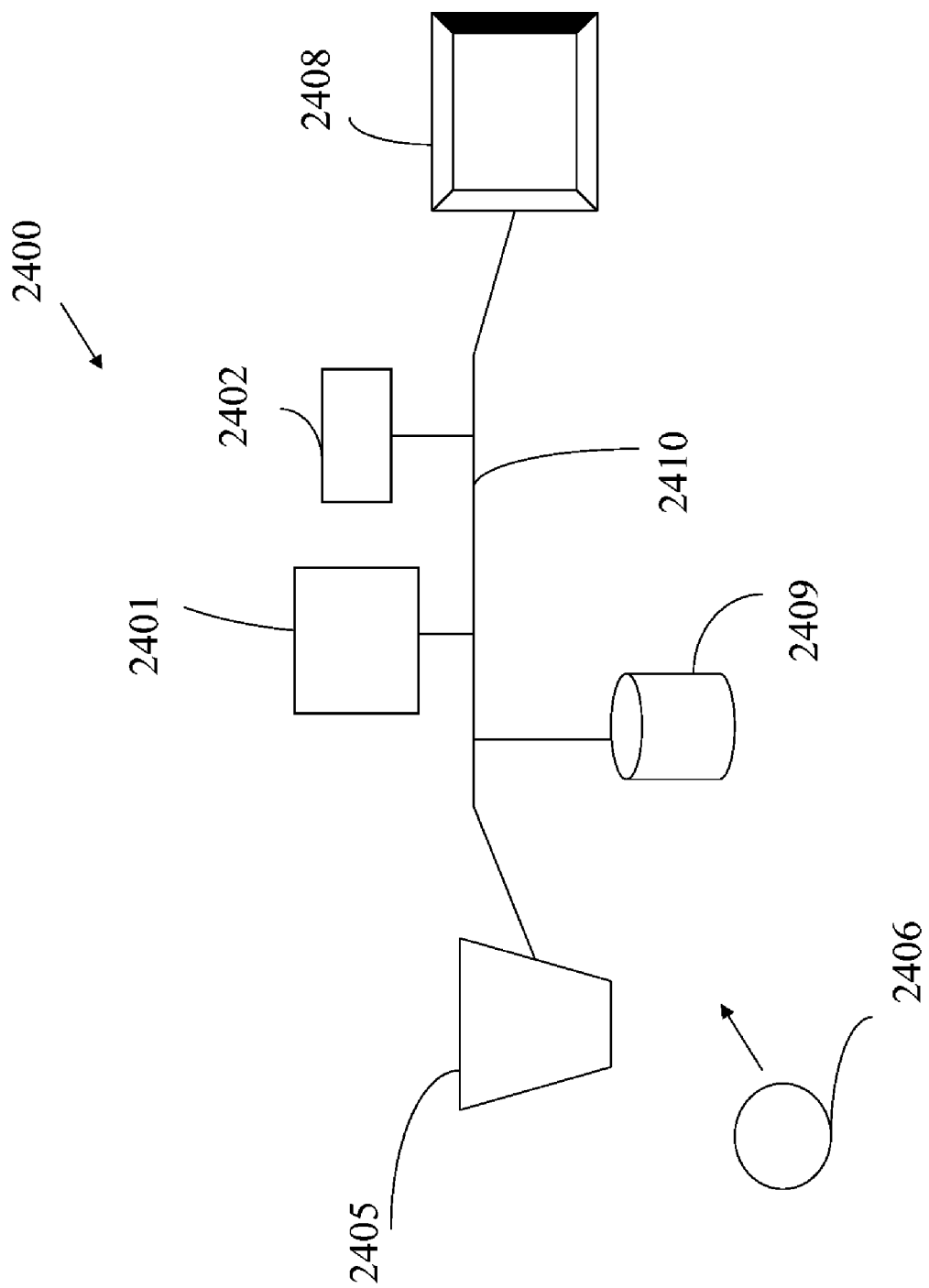
FIG. 12 illustrates a computer system and program product for performing the method according to another embodiment of the invention.

In one embodiment of the present invention, referring to FIG. 12, the isofield method according to the invention may be incorporated into a design tool implemented in a digital computer 2400, having components including, but not limited to: a central processing unit (CPU) 2401, at least one input/output (I/O) device 2405 (such as a keyboard, a mouse, a compact disk (CD) drive, and the like), a display device 2408, a storage device 2409 capable of reading and/or writing computer readable code, and a memory 2402, all of which are connected, e.g., by a bus or a communications network 2410. The present invention may be implemented as a computer program product stored on a computer readable medium, such as a tape or CD 2406, which may be, for example, read by the I/O device 2405, and stored in the storage device 2409 and/or the memory 2402. The computer program product contains instructions to implement the method according to the present invention on a digital computer. The invention can take the form of an entirely hardware embodiment, and entirely software embodiment an embodiment containing both hardware and software elements. In a preferred embodiment, the invention is implemented in software, which includes, but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus, device or element that can contain, store, communicate, propagate, or transport the program for use by or in connection with the computer or instruction execution system. The medium can be an electronic, magnetic, optical, electromagnetic, infrared, or semiconductor storage medium, network or propagation medium. Examples of a storage medium include a semiconductor memory, fixed storage disk, moveable floppy disk, magnetic tape, and an optical disk. Current examples of optical disks include compact disk-read only memory (CD-ROM), compact disk-read/write (CD-R/W) and digital video disk (DVD). The present invention may also be implemented in a plurality of such a computer or instruction execution system where the present items may reside in close physical proximity or distributed over a large geographic region and connected by a communications network, communicating through a propagation medium via communication devices, such as network adapters. Examples of a network include the Internet, intranet, and local area networks. Examples of a propagation medium include wires, optical fibers, and wireless transmissions. Examples of network adapters include modems, cable modems, ethernet cards and wireless routers.

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for designing a lithographic process employing a computer system by simulating an image of a topographic mask under an illumination having an associated electric field, said method comprising:

providing a design of the topographic mask, the mask design including a mask feature having two-dimensional polygon feature edges in a horizontal plane of the mask, wherein the feature edges have a finite thickness along a non-horizontal direction of the mask;

determining, employing a computer system including a central processing unit, a thin mask representation of the electric field on the mask plane corresponding to said mask feature;

determining, employing said computer system, a first field difference between the electric field on the mask plane along a first edge of said mask feature and the electric field on the mask plane along the corresponding edge of a thin mask representation of said mask feature under illumination of a first component of the electric field and a second field difference between the electric field on the mask plane along said first edge of said mask feature and the electric field on the mask plane along said corresponding first edge of said thin mask representation of said mask feature under illumination of a second component of the electric field orthogonal to said first component of the electric field;

forming, employing said computer system, an isotropic field perturbation (IsoField Perturbation Iso$\Delta$M) to the thin mask electric field on the mask plane corresponding to said first edge of said mask feature comprising a weighted coherent combination of said first and second field differences;

providing, employing said computer system, an imaging model for simulating an image on a wafer plane, the imaging model comprising a representation of the electric fields on the mask plane responsive to illumination from an imaging system, wherein said representation of the electric fields on the mask plane comprises said thin mask representation combined with said Isofield Perturbation;

simulating, employing said computer system, an image on the wafer plane corresponding to said mask feature under the illumination using said imaging model.

2. The method according to claim 1, further comprising providing said image for use in an optical proximity correction methodology or for use in a mask verification methodology.

3. The method of claim 1, wherein said weighted coherent combination of said first and second field differences comprises using, for all features of said mask design, a fixed weighting of said first and second field differences.

4. The method of claim 3, wherein said fixed weighting is a ratio of 50:50.

5. The method of claim 1, further comprising determining a mixed weighting for said weighted coherent combination of said first and second field differences comprising a calibration of said imaging model relative to a rigorous EMF imaging model.

6. The method of claim 5, wherein said mixed weighting may vary according to feature characteristic.

7. The method of claim 5, wherein said mixed weighting $W^\mu$ for an orientation $\mu$ of a component of the electric field relative to said first edge is represented by $$W^\mu = \frac{2\langle |B_{m,n}^\mu \cdot M_m^{TMA*}|\rangle_{m,n}}{\langle |B_{m,n}^\perp \cdot M_m^{TMA*}|\rangle_{m,n} + \langle |B_{m,n}^\parallel \cdot M_m^{TMA*}|\rangle_{m,n}}$$

where the coefficients $B_{m,n}^\mu$ designate the constant of proportionality between the electric field transmitted from the mask to the amplitude for the illumination component orientation $\mu$ at the wafer plane, where $\mu$ indicates the orientation of the component of the electric field that is parallel $\parallel$ or perpendicular $\perp$ to said first edge, where m,n are indices representing the $m^{th}$ or $n^{th}$ diffracted order, respectively, where $M_m^{TMA}$ represents the amplitude of the m-th diffraction order from the mask in a TMA case.

8. The method of claim 5, wherein said rigorous EMF image model is selected from the group consisting of a boundary layer model and an edge domain decomposition model.

9. The method of claim 5, wherein said calibration comprises:
representing said mixed weighting as a mixed weighting polynomial comprising variables that are optical characteristics of an aerial image of a calibration pattern; and
determining said mixed weighting in accordance with a best fit of said mixed weighting polynomial to measurements of said optical characteristics of said aerial image of said calibration pattern.

10. The method of claim 5, wherein said calibration comprises:
classifying a calibration pattern into groups of calibration features based on geometric characteristics of the aerial image of said calibration pattern;
determining a calibration optimum weights ratio for an IsoField Perturbation associated with each of said groups of calibration features in accordance with a figure of merit relative to an image of said calibration pattern using a rigorous EMF imaging model;
assigning a group classification to said image of said mask feature in accordance with said groups of calibration features; and
determining said mixed weighting by assigning said mixed weighting the value of said calibration optimum weights ratio associated with said group classification.

11. The method of claim 5, wherein said calibration comprises:
representing said mixed weighting as a mixed weighting polynomial comprising variables that are geometrical characteristics of the aerial image of the calibration pattern; and
determining said mixed weighting in accordance with a best fit of said mixed weighting polynomial to measurements of said geometrical characteristics of said aerial image of said calibration pattern.

12. The method of claim 1, wherein said method further comprises representing said source pupil as a plurality of source regions so that illumination from each of said plurality of source regions has a corresponding angle of propagation relative to a normal to the wafer plane, and determining an incident isotropic field perturbation corresponding to the illumination from each of said plurality of source regions, wherein said isofield edge perturbation is derived from a combination of said incident isotropic field perturbations corresponding to the illumination from each of said plurality of source regions.

13. The method of claim 12, wherein said illumination is provided using a source pupil comprising a numerical aperture of 1.35 or greater.

14. The method of claim 1, wherein said mask feature further comprises a second edge that is not oriented either parallel or perpendicular to the orientation of said first edge, and wherein said IsoField Perturbation Iso$\Delta$M is determined by $$Iso\Delta M = \frac{\cos\alpha}{\cos\alpha + \sin\alpha}\Delta M^{\|} + \frac{\sin\alpha}{\cos\alpha + \sin\alpha}\Delta M^{\perp}$$

where alpha $\alpha$ is the angle between said second edge and the direction of said first component of the electric field, and $\Delta M^{\|}$ and $\Delta M^{\perp}$ are the edge field perturbations for said second edge that correspond to the parallel and perpendicular component of said first component of the electric field that is parallel and perpendicular to said edge, respectively.

15. The method of claim 1, wherein said illumination is provided by a source pupil represented as a plurality of source regions so that subregion illumination from each of said plurality of source subregions has a corresponding angle of propagation theta $\theta$ with respect to the normal to the plane of the mask and an angle phi $\phi$ relative to said edge of said mask feature, wherein a Sub-IsoField Perturbation $\Delta Iso\Delta M_S$ for said first edge corresponding to a source subregion S is given by $$\Delta Iso\Delta M_S = \left(\frac{\cos\varphi}{\cos\varphi + \sin\varphi}\Delta M^{\perp} + \frac{\sin\varphi}{\cos\varphi + \sin\varphi}\Delta M^{\|}\right)\cdot\cos\theta,$$

where $\Delta M^{\|}$ and $\Delta M^{\perp}$ are the edge field perturbations produced on said first edge that is parallel and perpendicular to the incident polarization of said subregion illumination, respectively; and said step of forming said IsoField Perturbation Iso$\Delta$M further comprises forming a combination of said Sub-IsoField Perturbations for said source subregions.

16. The method of claim 15, wherein said source pupil comprises a numerical aperture of 1.35 or greater.

17. A method for designing a lithographic process employing a computer system by simulating an image of a topographic mask under an illumination having an associated electric field, said method comprising:

providing a design of the topographic mask, the mask design including a mask feature having two-dimensional polygon feature edges in a horizontal plane of the mask, wherein the feature edges have a finite thickness along a non-horizontal direction of the mask;

determining, employing a computer system including a central processing unit, a thin mask representation of the electric field on the mask plane corresponding to said mask feature;

determining, employing said computer system, a first field difference between the electric field on the mask plane along an extended edge of an elementary pattern unit having said finite thickness and the electric field on the mask plane along the corresponding extended edge of a thin mask elementary pattern unit under illumination of a first component of the electric field and a second field difference between the electric field on the mask plane along said extended edge of said elementary pattern unit having said finite thickness and the electric field on the mask plane along said corresponding extended edge of said thin mask elementary pattern unit under illumination of a second component of the electric field orthogonal to said first component of the electric field;

forming, employing said computer system, an isotropic field perturbation (IsoField Perturbation) to the thin mask electric field on the mask plane corresponding to said extended edge of said elementary pattern unit having said finite thickness comprising a weighted coherent combination of said first and second field differences;

providing, employing said computer system, an imaging model for simulating an image on a wafer plane, the imaging model comprising a representation of the electric fields on the mask plane responsive to illumination from an imaging system, wherein said representation of the electric fields on the mask plane comprises said thin mask representation combined with said Isofield Perturbation; and simulating an image on the wafer plane corresponding to said mask feature under the illumination using said imaging model.

18. The method according to claim 17, further comprising providing said image for use in an optical proximity correction methodology or for use in a mask verification methodology.

19. The method of claim 17, wherein the step of simulating the image further comprises:

forming a plurality of topo-edged elements each comprising a planar field region having boundaries defined by two edges joined at a vertex, each edge extending infinitely away from the vertex, wherein the field region is assigned a predetermined transmission value equal to the transmission value of said mask feature, and each edge is assigned a value having a scalar magnitude equal to the IsoField Perturbation; and representing said mask feature in terms of a linear combination of said plurality of topo-edged elements.

20. The method of claim 19, wherein the step of simulating the image further comprises:

calculating a plurality of unpolarized imaging kernels for unpolarized illumination;

for each topo-edged element, computing convolutions of said plurality of unpolarized imaging kernels with said topo-edged element; and summing the squares of said convolutions of each of said plurality of topo-edge elements in said linear combination.

21. The method of claim 19, wherein said step of representing said mask feature in terms of a linear combination of said plurality of topo-edged elements further comprises aligning the vertex of one of said plurality of topo-edged elements at each corner of said mask feature.

22. A non-transitory computer usable medium having a computer readable program embodied therein for designing a lithographic process by simulating an image of a topographic mask under an illumination having associated electric field, wherein said computer readable program is configured to run on a computer to operate on a design of the topographic mask, the mask design including a mask feature having two-dimensional polygon feature edges in a horizontal plane of the mask, wherein the feature edges have a finite thickness along a non-horizontal direction of the mask, wherein the computer readable program when executed on the computer causes the computer to perform the method steps of:

determining a thin mask representation of the electric field on the mask plane corresponding to said mask feature;

determining a first field difference between the electric field on the mask plane along a first edge of said mask feature and the electric field on the mask plane along the corresponding edge of a thin mask representation of said mask feature under illumination of a first component of the electric field and a second field difference between the electric field on the mask plane along said first edge of said mask feature and the electric field on the mask plane along said corresponding first edge of said thin mask representation of said mask feature under illumination of a second component of the electric field orthogonal to said first component of the electric field;

forming an isotropic field perturbation (IsoField Perturbation IsoΔM) to the thin mask electric field on the mask plane corresponding to said first edge of said mask feature comprising a weighted coherent combination of said first and second field differences;

providing an imaging model for simulating an image on a wafer plane, the imaging model comprising a representation of the electric fields on the mask plane responsive to illumination from an imaging system, wherein said representation of the electric fields on the mask plane comprises said thin mask representation combined with said Isofield Perturbation; and simulating an image on the wafer plane corresponding to said mask feature under the illumination using said imaging model.

23. The non-transitory computer usable medium according to claim 22, the method further comprising providing said image for use in an optical proximity correction methodology or for use in a mask verification methodology.

24. The non-transitory computer usable medium of claim 22, wherein said weighted coherent combination of said first and second field differences comprises using, for all features of said mask design, a fixed weighting of said first and second field differences.

25. The non-transitory computer usable medium of claim 24, wherein said fixed weighting is a ratio of 50:50.

26. The non-transitory computer usable medium of claim 22, further comprising determining a mixed weighting for said weighted coherent combination of said first and second field differences comprising a calibration of said imaging model relative to a rigorous EMF imaging model.

27. The non-transitory computer usable medium of claim 26, wherein said mixed weighting may vary according to feature characteristic.

28. The non-transitory computer usable medium of claim 26, wherein said mixed weighting $W^\mu$ for an orientation $\mu$ of a component of the electric field relative to said first edge is represented by $$W^\mu = \frac{2\langle |B_{m,n}^\mu \cdot M_m^{TMA*}|\rangle_{m,n}}{\langle |B_{m,n}^\perp \cdot M_m^{TMA*}|\rangle_{m,n} + \langle |B_{m,n}^\parallel \cdot M_m^{TMA*}|\rangle_{m,n}}$$

where the coefficients $B_{m,n}^\mu$ designate the constant of proportionality between the electric field transmitted from the mask to the amplitude for the illumination component orientation $\mu$ at the wafer plane, where $\mu$ indicates the orientation of the component of the electric field that is parallel $\parallel$ or perpendicular $\perp$ to said first edge, where m,n are indices representing the $m^{th}$ or $n^{th}$ diffracted order, respectively, where $M_m^{TMA}$ represents the amplitude of the m-th diffraction order from the mask in a TMA case.

29. The non-transitory computer usable medium of claim 26, wherein said rigorous EMF image model is selected from the group consisting of a boundary layer model and an edge domain decomposition model.

30. The non-transitory computer usable medium of claim 26, wherein said calibration comprises:

representing said mixed weighting as a mixed weighting polynomial comprising variables that are optical characteristics of an aerial image of a calibration pattern; and determining said mixed weighting in accordance with a best fit of said mixed weighting polynomial to measurements of said optical characteristics of said aerial image of said calibration pattern.

31. The non-transitory computer usable medium of claim 26, wherein said calibration comprises:

classifying a calibration pattern into groups of calibration features based on geometric characteristics of the aerial image of said calibration pattern;

determining a calibration optimum weights ratio for an IsoField Perturbation associated with each of said groups of calibration features in accordance with a figure of merit relative to an image of said calibration pattern using a rigorous EMF imaging model;

assigning a group classification to said image of said mask feature in accordance with said groups of calibration features; and determining said mixed weighting by assigning said mixed weighting the value of said calibration optimum weights ratio associated with said group classification.

32. The non-transitory computer usable medium of claim 26, wherein said calibration comprises:

representing said mixed weighting as a mixed weighting polynomial comprising variables that are geometrical characteristics of the aerial image of the calibration pattern; and determining said mixed weighting in accordance with a best fit of said mixed weighting polynomial to measurements of said geometrical characteristics of said aerial image of said calibration pattern.

33. The non-transitory computer usable medium of claim 22, wherein said method further comprises representing said source pupil as a plurality of source regions so that illumination from each of said plurality of source regions has a corresponding angle of propagation relative to a normal to the wafer plane, and determining an incident isotropic field perturbation corresponding to the illumination from each of said plurality of source regions, wherein said isofield edge perturbation is derived from a combination of said incident isotropic field perturbations corresponding to the illumination from each of said plurality of source regions.

34. The non-transitory computer usable medium of claim 33, wherein said illumination is provided using a source pupil comprising a numerical aperture of 1.35 or greater.

35. The non-transitory computer usable medium of claim 22, wherein said mask feature further comprises a second edge that is not oriented either parallel or perpendicular to the orientation of said first edge, and wherein said IsoField Perturbation IsoΔM is determined by $$Iso\Delta M = \frac{\cos\alpha}{\cos\alpha + \sin\alpha}\Delta M^\parallel + \frac{\sin\alpha}{\cos\alpha + \sin\alpha}\Delta M^\perp$$

where alpha $\alpha$ is the angle between said second edge and the direction of said first component of the electric field, and $\Delta M^\parallel$ and $\Delta M^\perp$ are the edge field perturbations for said second edge that correspond to the parallel and perpendicular component of said first component of the electric field that is parallel and perpendicular to said edge, respectively.

36. The non-transitory computer usable medium of claim 22, wherein said illumination is provided by a source pupil represented as a plurality of source regions so that subregion illumination from each of said plurality of source subregions has a corresponding angle of propagation theta $\theta$ with respect to the normal to the plane of the mask and an angle phi $\phi$ relative to said edge of said mask feature, wherein a Sub-IsoField Perturbation $\Delta Iso\Delta M_S$ for said first edge corresponding to a source subregion S is given by $$\Delta Iso\Delta M_S = \left( \frac{\cos\varphi}{\cos\varphi + \sin\varphi} \Delta M^\perp + \frac{\sin\varphi}{\cos\varphi + \sin\varphi} \Delta M^\parallel \right) \cdot \cos\theta,$$

where $\Delta M^\parallel$ and $\Delta M^\perp$ are the edge field perturbations produced on said first edge that is parallel and perpendicular to the incident polarization of said subregion illumination, respectively; and said step of forming said IsoField Perturbation Iso$\Delta M$ further comprises forming a combination of said Sub-IsoField Perturbations for said source subregions.

37. The non-transitory computer usable medium of claim 36, wherein said source pupil comprises a numerical aperture of 1.35 or greater.

38. A non-transitory computer usable medium having a computer readable program embodied therein for designing a lithographic process by simulating an image of a topographic mask under an illumination having associated electric field, wherein said computer readable program is configured to run on a computer to operate on a design of the topographic mask, the mask design including a mask feature having two-dimensional polygon feature edges in a horizontal plane of the mask, wherein the feature edges have a finite thickness along a non-horizontal direction of the mask, wherein the computer readable program when executed on the computer causes the computer to perform the method steps of:

determining a thin mask representation of the electric field on the mask plane corresponding to said mask feature;

determining a first field difference between the electric field on the mask plane along an extended edge of an elementary pattern unit having said finite thickness and the electric field on the mask plane along the corresponding extended edge of a thin mask elementary pattern unit under illumination of a first component of the electric field and a second field difference between the electric field on the mask plane along said extended edge of said elementary pattern unit having said finite thickness and the electric field on the mask plane along said corresponding extended edge of said thin mask elementary pattern unit under illumination of a second component of the electric field orthogonal to said first component of the electric field;

forming an isotropic field perturbation (IsoField Perturbation) to the thin mask electric field on the mask plane corresponding to said extended edge of said elementary pattern unit having said finite thickness comprising a weighted coherent combination of said first and second field differences;

providing an imaging model for simulating an image on a wafer plane, the imaging model comprising a representation of the electric fields on the mask plane responsive to illumination from an imaging system, wherein said representation of the electric fields on the mask plane comprises said thin mask representation combined with said Isofield Perturbation; and simulating an image on the wafer plane corresponding to said mask feature under the illumination using said imaging model.

39. The non-transitory computer usable medium according to claim 38, the method further comprising providing said image for use in an optical proximity correction methodology or for use in a mask verification methodology.

40. The non-transitory computer usable medium of claim 38, wherein the step of simulating the image further comprises:

forming a plurality of topo-edged elements each comprising a planar field region having boundaries defined by two edges joined at a vertex, each edge extending infinitely away from the vertex, wherein the field region is assigned a predetermined transmission value equal to the transmission value of said mask feature, and each edge is assigned a value having a scalar magnitude equal to the IsoField Perturbation; and representing said mask feature in terms of a linear combination of said plurality of topo-edged elements.

41. The non-transitory computer usable medium of claim 40, wherein the step of simulating the image further comprises:

calculating a plurality of unpolarized imaging kernels for unpolarized illumination;

for each topo-edged element, computing convolutions of said plurality of unpolarized imaging kernels with said topo-edged element; and summing the squares of said convolutions of each of said plurality of topo-edge elements in said linear combination.

42. The non-transitory computer usable medium of claim 40, wherein said step of representing said mask feature in terms of a linear combination of said plurality of topo-edged elements further comprises aligning the vertex of one of said plurality of topo-edged elements at each corner of said mask feature.

* * * * *